United States Patent
Kim et al.

(10) Patent No.: US 9,570,687 B2
(45) Date of Patent: Feb. 14, 2017

(54) ORGANIC LIGHT-EMITTING DIODE

(71) Applicants: SAMSUNG DISPLAY CO., LTD., Yongin, Gyeonggi-Do (KR); Industry-Academic Cooperation Foundation Gyeongsang National University, Gyeongnam (KR)

(72) Inventors: Se-Hun Kim, Yongin (KR); Dong-Hyun Kim, Yongin (KR); Hwan-Hee Cho, Yongin (KR); Mi-Kyung Kim, Yongin (KR); Chang-Woong Chu, Yongin (KR); Yun-Hi Kim, Yongin (KR); Soon-Ki Kwon, Yongin (KR)

(73) Assignees: SAMSUNG DISPLAY CO., LTD., Yongin, Gyeonggi-Do (KR); INDUSTRY-ACADEMIC COOPERATION FOUNDATION GYEONGSANG NATIONAL UNIVERSITY, Gyeongnam (KR)

( * ) Notice: Subject to any disclaimer, the term of this patent is extended or adjusted under 35 U.S.C. 154(b) by 372 days.

(21) Appl. No.: 14/077,265

(22) Filed: Nov. 12, 2013

(65) Prior Publication Data

US 2014/0346463 A1     Nov. 27, 2014

(30) Foreign Application Priority Data

May 23, 2013  (KR) .................. 10-2013-0058542

(51) Int. Cl.
*H01L 51/00* (2006.01)
*H01L 51/50* (2006.01)

(52) U.S. Cl.
CPC ......... *H01L 51/0058* (2013.01); *H01L 51/006* (2013.01); *H01L 51/0054* (2013.01);
(Continued)

(58) Field of Classification Search
None
See application file for complete search history.

(56) References Cited

U.S. PATENT DOCUMENTS

| 5,635,308 A | 6/1997 | Inoue et al. |
| 2006/0008674 A1* | 1/2006 | Yu .................. C07F 7/0809 428/690 |
| 2013/0069523 A1 | 3/2013 | Matsuura et al. |

FOREIGN PATENT DOCUMENTS

| JP | 03-200289 A | 9/1991 |
| JP | 07-138561 A | 5/1995 |

(Continued)

OTHER PUBLICATIONS

Machine English translation of Je et al. (KR 10-2012-0048125 A). Jan. 28, 2016.*

(Continued)

*Primary Examiner* — J. L. Yang
(74) *Attorney, Agent, or Firm* — Lee & Morse, P.C.

(57) ABSTRACT

An organic light-emitting diode including a substrate; a first electrode on the substrate; a second electrode disposed opposite to the first electrode; and an emission layer between the first electrode and the second electrode, the emission layer including an anthracene-based compound represented by Formula 1, below, and a condensed cyclic compound represented by Formula 20, below:

<Formula 1>

(Continued)

-continued

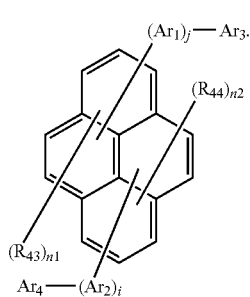

<Formula 20>

20 Claims, 1 Drawing Sheet

(52) U.S. Cl.
CPC ...... *H01L 51/0094* (2013.01); *H01L 51/0072* (2013.01); *H01L 51/506* (2013.01); *H01L 51/5012* (2013.01); *H01L 2251/308* (2013.01)

(56) References Cited

FOREIGN PATENT DOCUMENTS

| JP | 08-12600 A | | 1/1996 | |
|---|---|---|---|---|
| JP | 08-239655 A | | 9/1996 | |
| KR | 10-2011-0027033 | * | 2/2011 | ............ C09K 11/06 |
| KR | 10-1018547 B1 | | 2/2011 | |
| KR | 10-1031463 B1 | | 4/2011 | |
| KR | 10-2011-0115887 A | | 10/2011 | |
| KR | 10-2012-0047038 A | | 5/2012 | |
| KR | 10-2012-0048125 A | | 5/2012 | |

OTHER PUBLICATIONS

Machine English translation of Je et al. (KR 10-2011-0027033). Jul. 16, 2016.*

* cited by examiner

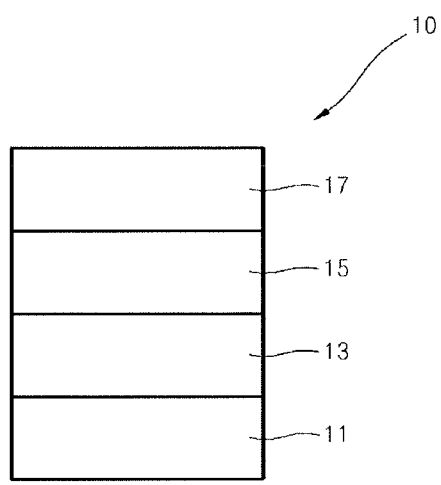

ORGANIC LIGHT-EMITTING DIODE

CROSS-REFERENCE TO RELATED APPLICATION

Korean Patent Application No. 10-2013-0058542, filed on May 23, 2013, in the Korean Intellectual Property Office, and entitled: "Organic Light-Emitting Diode," is incorporated by reference herein in its entirety.

BACKGROUND

1. Field

The embodiments relate to an organic light-emitting diode.

2. Description of the Related Art

Organic light-emitting diodes (OLEDs), which are self-emitting diodes, may have advantages such as wide viewing angles, excellent contrast, quick response, high brightness, excellent driving voltage characteristics, and can provide multicolored images.

An OLED may have a structure including, e.g., a substrate, and an anode, a hole transport layer (HTL), an emission layer (EML), an electron transport layer (ETL), and a cathode sequentially stacked on the substrate. In this regard, the HTL, the EML, and the ETL may be organic thin films formed of organic compounds.

An operating principle of an OLED having the above-described structure is as follows. When a voltage is applied between the anode and the cathode, holes injected from the anode may move to the EML, via the HTL, and electrons injected from the cathode may move to the EML, via the ETL. The holes and electrons may recombine in the EML to generate excitons. When the excitons drop from an excited state to a ground state, light may be emitted.

SUMMARY

Embodiments are directed to an organic light-emitting diode.

The embodiments may be realized by providing an organic light-emitting diode including a substrate; a first electrode on the substrate; a second electrode disposed opposite to the first electrode; and an emission layer between the first electrode and the second electrode, the emission layer including an anthracene-based compound represented by Formula 1, below, and a condensed cyclic compound represented by Formula 20, below:

<Formula 1>

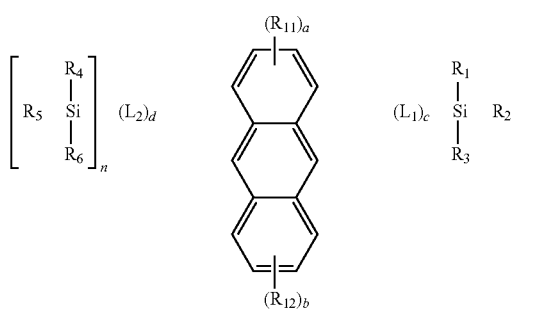

<Formula 20>

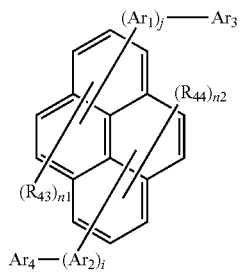

wherein, in Formulae 1 and 20 n is 0 or 1; $R_1$ to $R_6$ are each independently a substituted or unsubstituted $C_1$-$C_{60}$ alkyl group, a 3-membered to 10-membered substituted or unsubstituted non-condensed cyclic group, or a substituted or unsubstituted condensed cyclic group with at least two condensed rings, wherein, when n is 0, at least one of $R_1$ to $R_3$ is a substituted or unsubstituted condensed cyclic group with at least two condensed rings, and when n is 1, at least one of $R_1$ to $R_6$ is a substituted or unsubstituted condensed cyclic group with at least two condensed rings; $L_1$, $L_2$, $Ar_1$, and $Ar_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group; c and d are each independently an integer from 1 to 3; $R_{11}$, $R_{12}$, $R_{43}$, and $R_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), and —Si($Q_3$)($Q_4$)($Q_5$), where $Q_1$ to $Q_5$ are each independently selected from a hydrogen atom, $C_1$-$C_{10}$ alkyl group, a $C_6$-$C_{20}$ aryl group, and a $C_2$-$C_{20}$ heteroaryl group; a and b are each independently an integer from 1 to 4; $R_{41}$ and $R_{42}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted Or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group; i and j are each independently an integer from 0 to 3; n1 and n2 are each independently an integer from 1 to 4; and $Ar_3$ and $Ar_4$ are each independently represented by one of Formulae 7A to 7F, below:

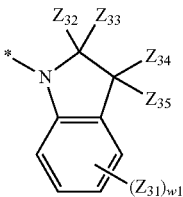
<Formula 7A>

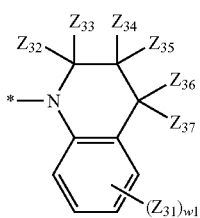
<Formula 7B>

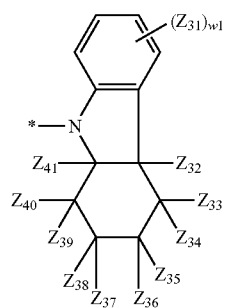
<Formula 7C>

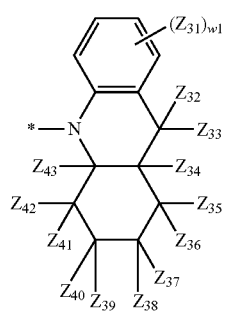
<Formula 7D>

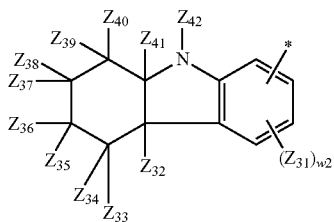
<Formula 7E>

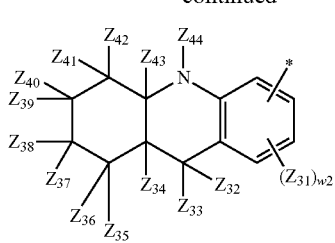
<Formula 7F> wherein, in Formulae 7A to 7F $Z_{31}$ to $Z_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_{51})(Q_{52})$, and —$Si(Q_{53})(Q_{54})(Q_{55})$, where $Q_{51}$ to $Q_{55}$ are each independently selected from a hydrogen atom, a $C_1$-$C_{10}$ alkyl group, a $C_6$-$C_{20}$ aryl group, and a $C_2$-$C_{20}$ heteroaryl group; w1 is an integer from 1 to 4; and w2 is an integer from 1 to 5.

A weight ratio of the anthracene-based compound to the condensed cyclic compound in the emission layer is from about 99.9:0.01 to about 80:20.

$R_1$ to $R_6$ in Formula 1 are each independently selected from a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexcenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group; and a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexcenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$) where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group, wherein at least one of $R_1$ to $R_3$ if n is 0, or at least one of $R_1$ to $R_6$, if n is 1, are each independently selected from a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group; and a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group.

$R_1$ to $R_6$ in Formula 1 are each independently selected from a methyl group, an ethyl group, a n-propyl group, an i-propyl group, a n-butyl group, an i-butyl group, a t-butyl group, a pentyl group, a hexyl group, a heptyl group, an octyl group, a nonyl group, and a decyl group;

a methyl group, an ethyl group, a n-propyl group, a i-propyl group, a n-butyl group, a i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group;

groups represented by Formulae 2A to 2T below; and group represented by Formulae 3A to 3R below, wherein at least one of $R_1$ to $R_3$, if n is 0, or at least one of $R_1$ to $R_6$, if n is 1, are each independently selected from the groups represented by Formulae 3A to 3R below

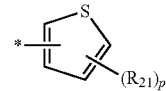

Formula 2A

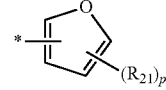

Formula 2B

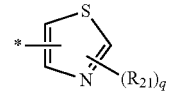

Formula 2C

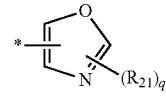

Formula 2D

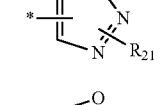

Formula 2E

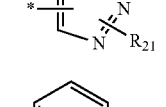

Formula 2F

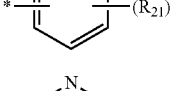

Formula 2G

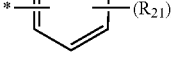

Formula 2H

-continued
Formula 2I
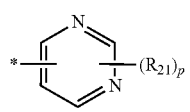
Formula 2J
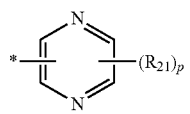
Formula 2K
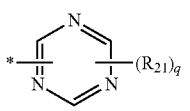
Formula 2L
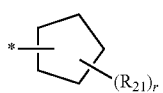
Formula 2M
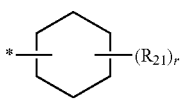
Formula 2N
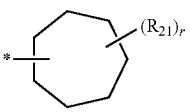
Formula 2O
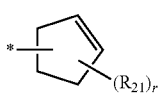
Formula 2P
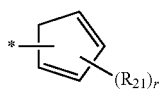
Formula 2Q
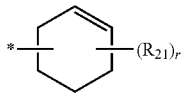
Formula 2R
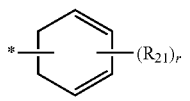
Formula 2S
Formula 2T
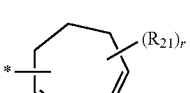
Formula 3A
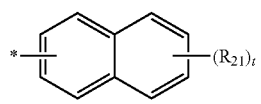
Formula 3B
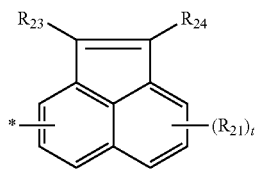
Formula 3C
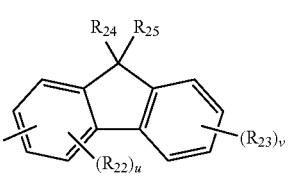
Formula 3D
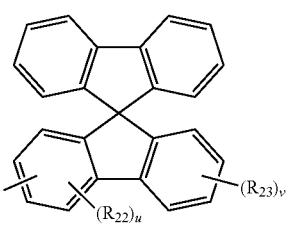
Formula 3E
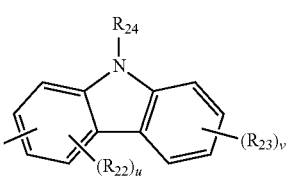
Formula 3F
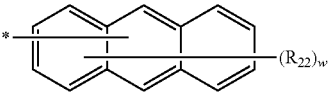
Formula 3G
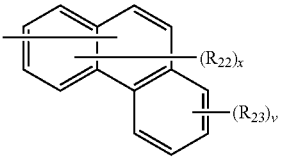
Formula 3H
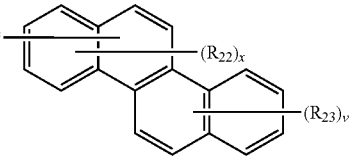
Formula 3I
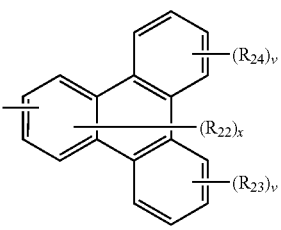

Formula 3J
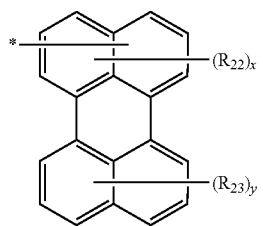

Formula 3K
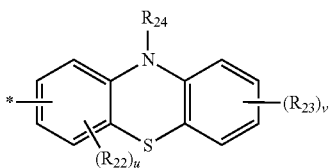

Formula 3L
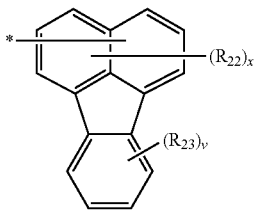

Formula 3M
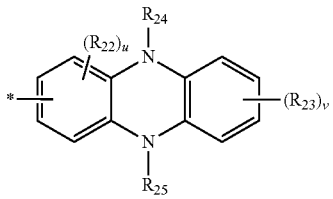

Formula 3N
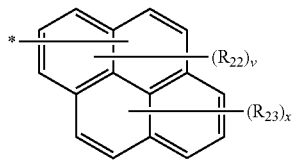

Formula 3O
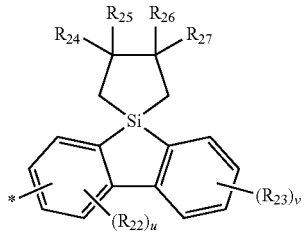

Formula 3P
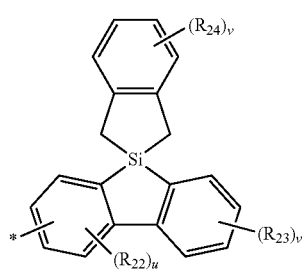

Formula 3Q
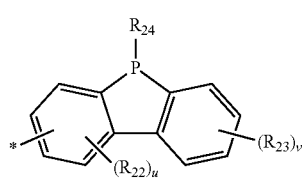

Formula 3R
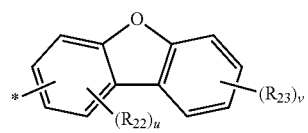

wherein, in Formulae 2A to 2T and Formulae 3A to 3R $R_{21}$ to $R_{27}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and where —N($Q_{11a}$)($Q_{12a}$), where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group; p and u are each independently an integer from 1 to 3; q is 1 or 2;

r and x are each independently an integer from 1 to 5; s and v are each independently an integer from 1 to 4; t is an integer from 1 to 7; w is an integer from 1 to 9; and y is an integer from 1 to 6.

$R_1$ to $R_6$ in Formula 1 are each independently one of a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group; a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group, each substituted with at least one of a deuterium atom, a halogen atom, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a phenyl group, a naphthyl group, or an anthracenyl group; a group represented by Formula 2G; or groups represented by Formulae 4A to 4J, wherein at least one of $R_1$ to $R_3$, if n is 0, or at least one of $R_1$ to $R_6$, if n is 1, are each independently selected from the groups represented by Formulae 4A to 4J, below:

Formula 2G
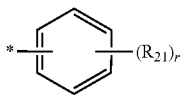

-continued

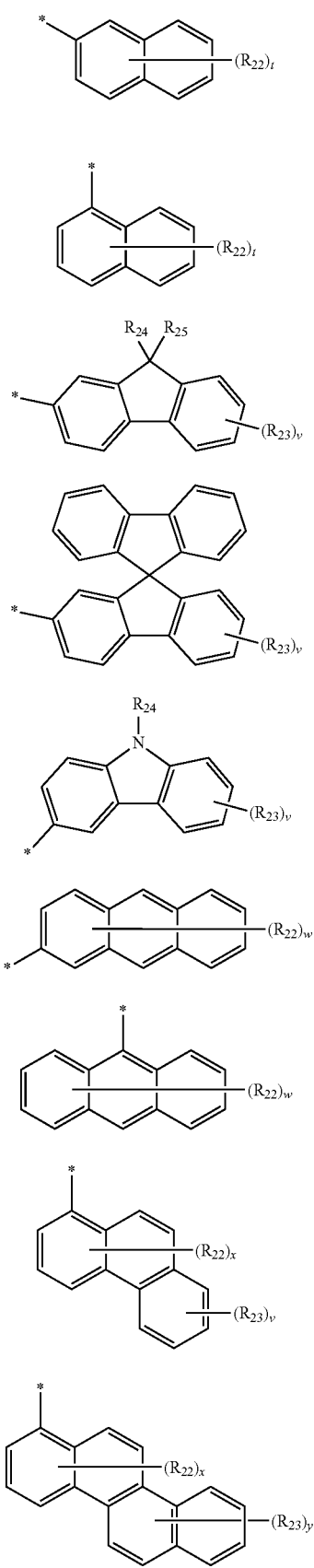

Formula 4A
Formula 4B
Formula 4C
Formula 4D
Formula 4E
Formula 4F
Formula 4G
Formula 4H
Formula 4I
Formula 4J

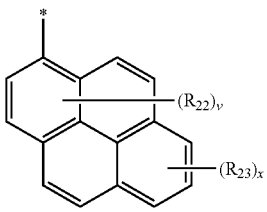

wherein, in Formula 2G, and Formulae 4A to 4J $R_{21}$ to $R_{25}$ are each independently selected from a hydrogen atom, a deuterium atom, a halogen atom, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a dimethyl-fluorenyl group, a phenyl-carbazolyl group, a pyrenyl group, a crysenyl group, a benzothiazolyl group, a benzoxazolyl group, a phenyl-benzoimidazolyl group, and —N($Q_{11a}$)($Q_{12a}$), wherein $Q_{11a}$ and $Q_{12a}$ are each independently a hydrogen atom, a $C_1$-$C_{10}$ alkyl group, a phenyl group, a naphthyl group, or an anthracenyl group; r and x are each independently an integer from 1 to 5; v is an integer from 1 to 4; t is an integer from 1 to 7; w is an integer from 1 to 9; and y is an integer from 1 to 6.

$L_1$, $L_2$, $Ar_1$, and $Ar_2$ in Formulae 1 and 20 are each independently selected from a cyclopropylene group, a cyclobutylene group, a cyclopentylene group, a cyclohexylene group, a cycloheptylene group, a cyclooctylene group, a cyclopentenylene group, a cyclopentadienylen group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxatinylene group, and a phenanthridinylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxatinylene group, and a phenanthridinylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —$N(Q_{11b})(Q_{12b})$, where $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group.

$L_1$, $L_2$, $Ar_1$, and $Ar_2$ in Formulae 1 and 20 are each independently selected from groups represented by Formulae 5A to 5J:

Formula 5A
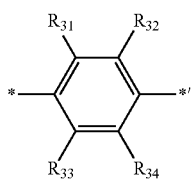

Formula 5B
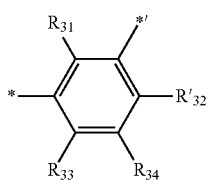

Formula 5C
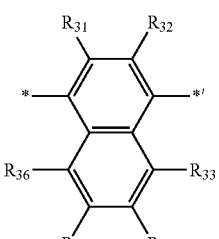

Formula 5D
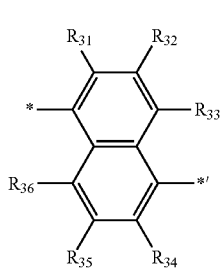

Formula 5E
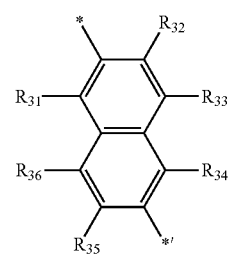

Formula 5F
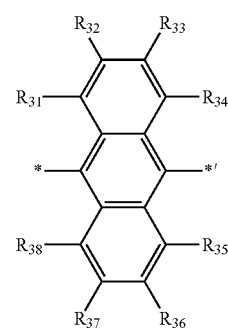

Formula 5G
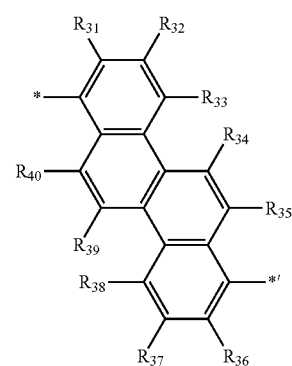

Formula 5H
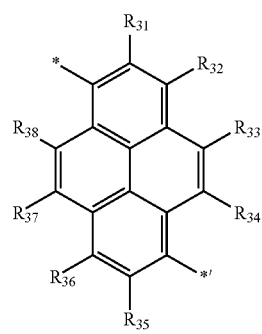

Formula 5I
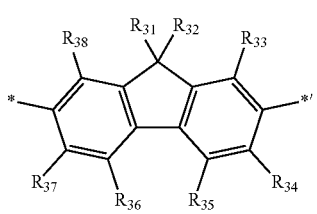

-continued

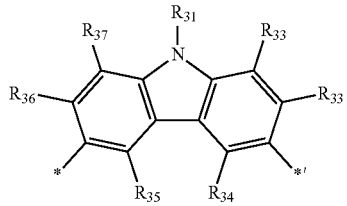

Formula 5J wherein R₃₁ to R₄₀ in Formulae 5A to 5J are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$), where $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group; and * indicates a binding site.

In Formula 1 n is 1; $R_1$, $R_3$, $R_4$, and $R_6$ are each independently a substituted or unsubstituted $C_1$-$C_{60}$ alkyl group; and $R_2$ and $R_5$ are each independently selected from a 3-membered to 10-membered substituted or unsubstituted non-condensed cyclic group, and a substituted or unsubstituted condensed cyclic group with at least two condensed rings, wherein at least one of $R_3$ and $R_5$ is a substituted or unsubstituted condensed cyclic group with at least two condensed rings.

In Formula 1 n is 0; $R_1$ and $R_3$ are each independently a substituted or unsubstituted $C_1$-$C_{60}$ alkyl group; and $R_2$ is a substituted or unsubstituted condensed cyclic group with at least two condensed rings.

The anthracene-based compound is one of Compounds 1 to 24 below:

1

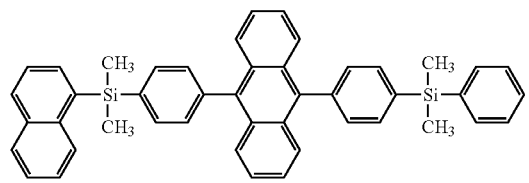

2

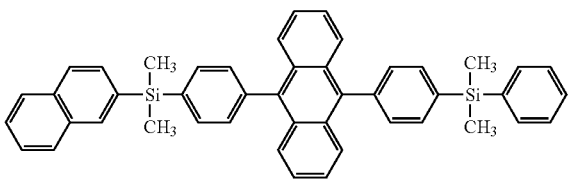

3

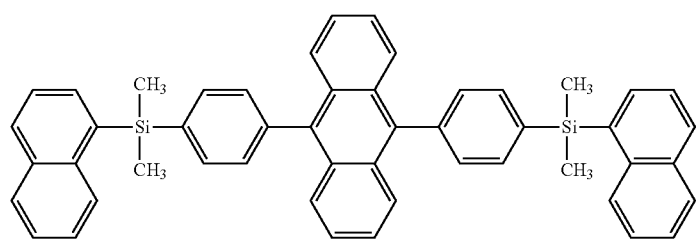

4

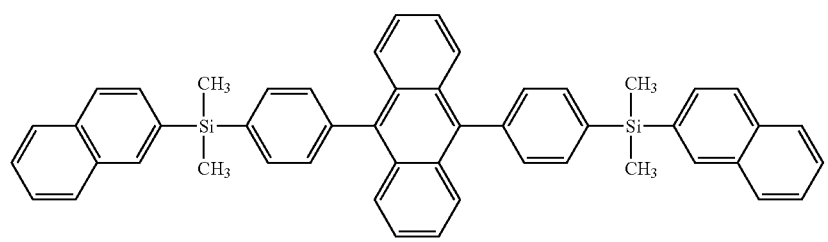

5

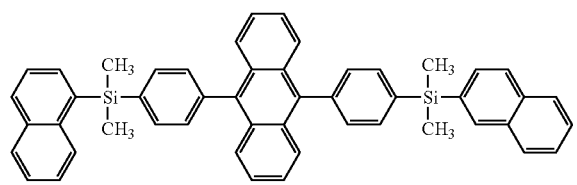

6

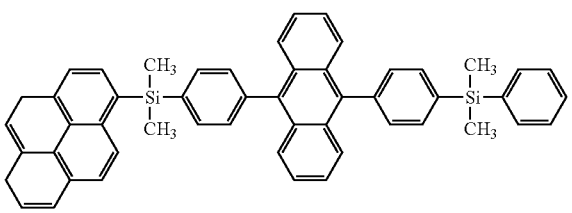

-continued
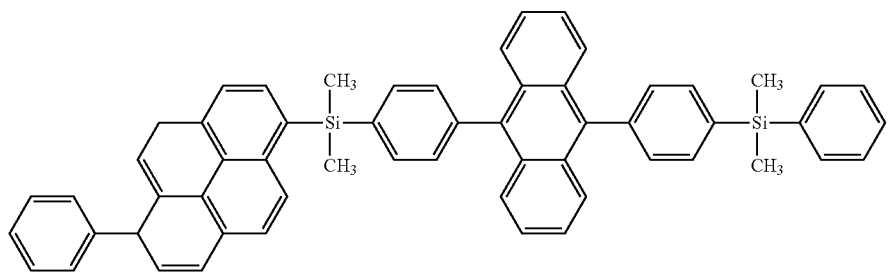
7
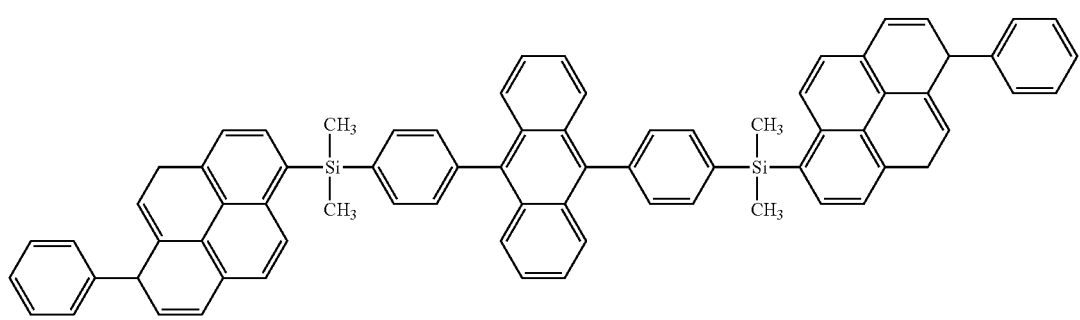
8
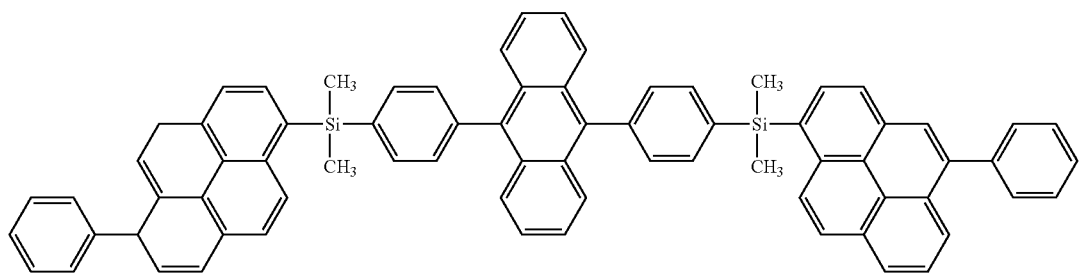
9
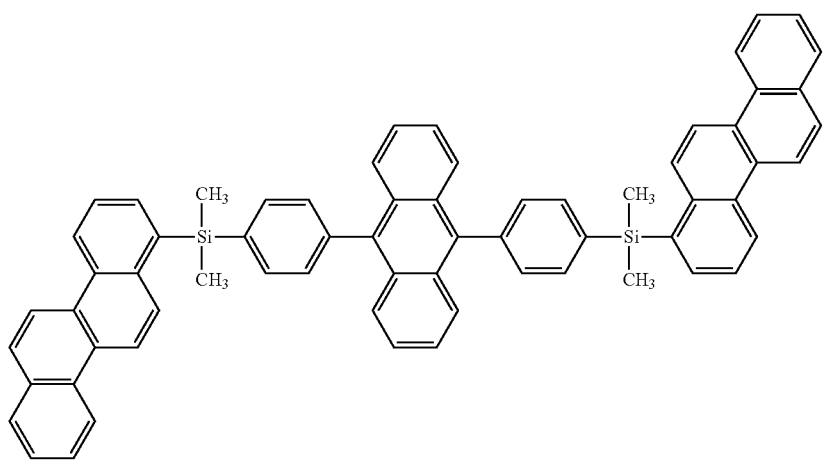
10

-continued
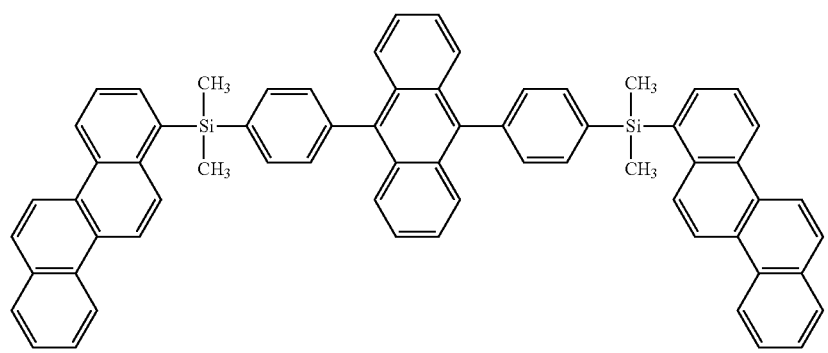
11
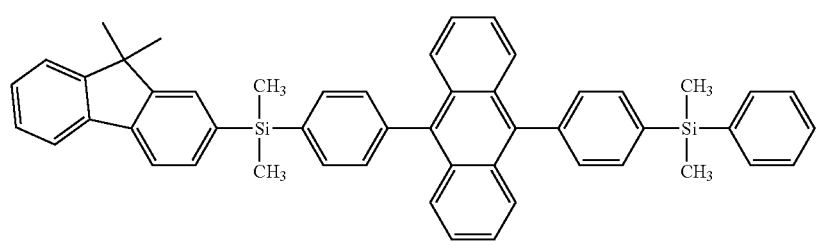
12
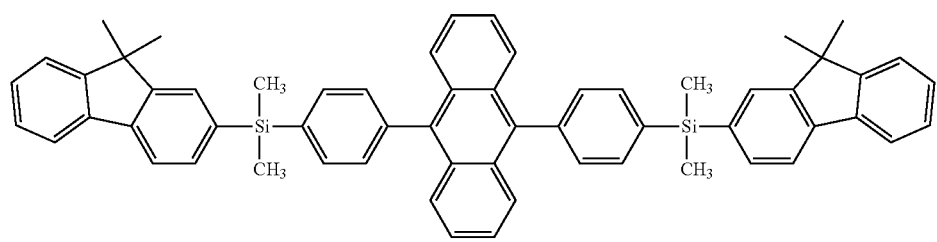
13
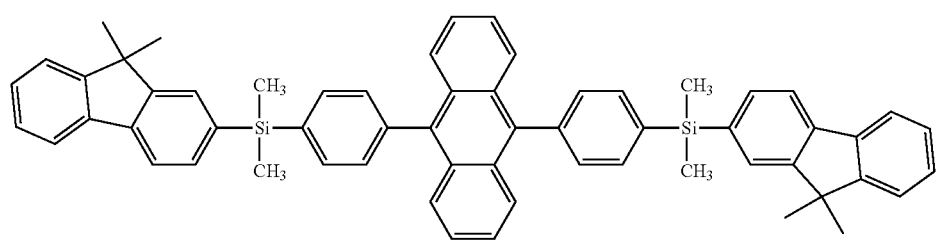
14
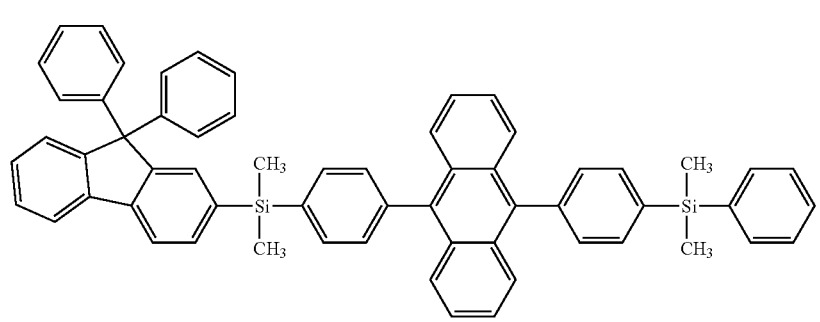
15

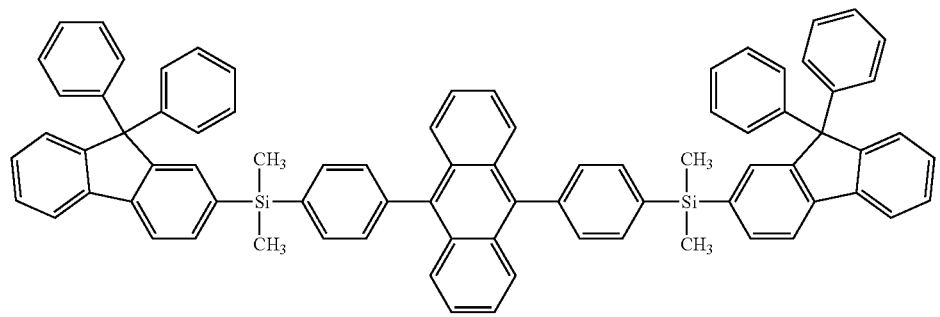
16
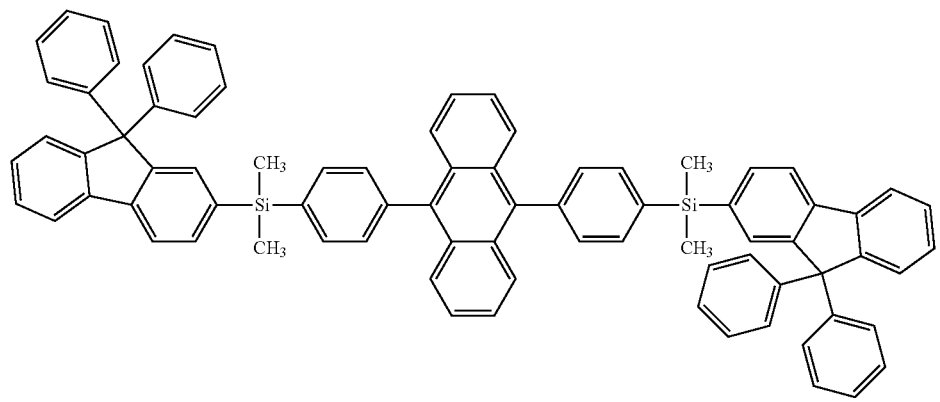
17
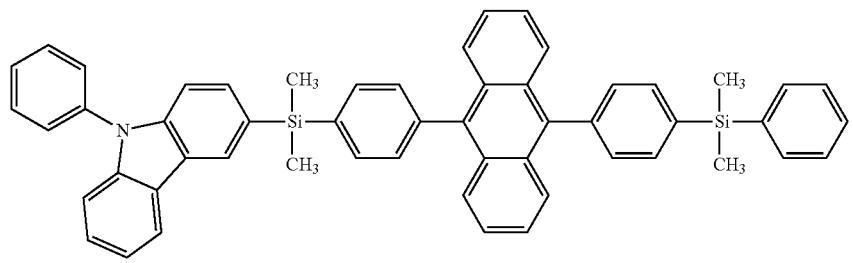
18
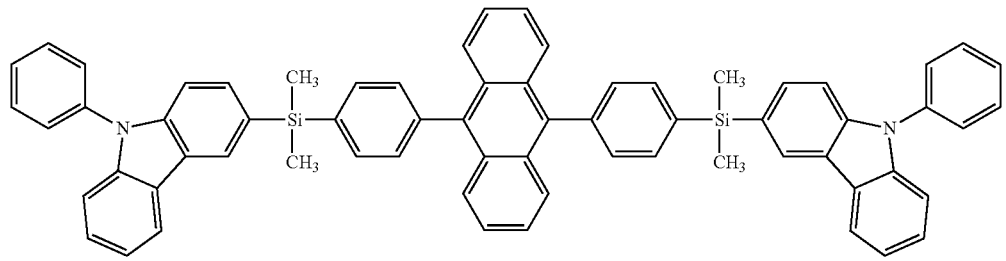
19
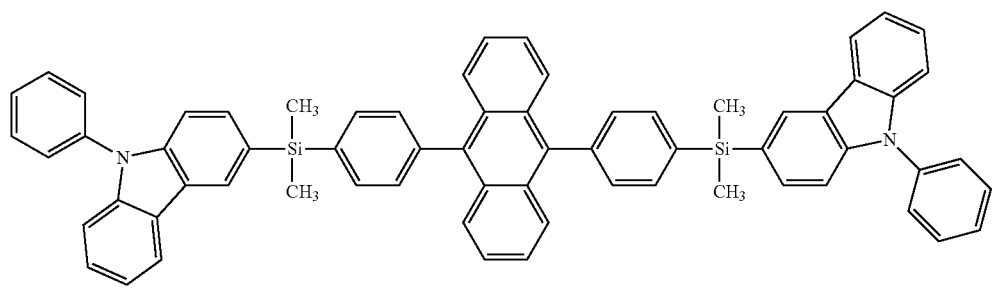
20

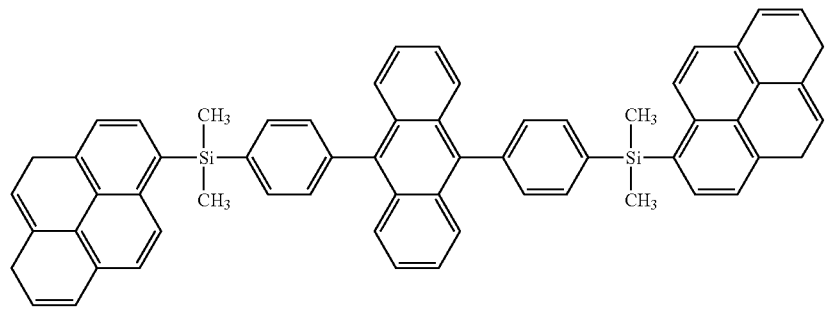

21

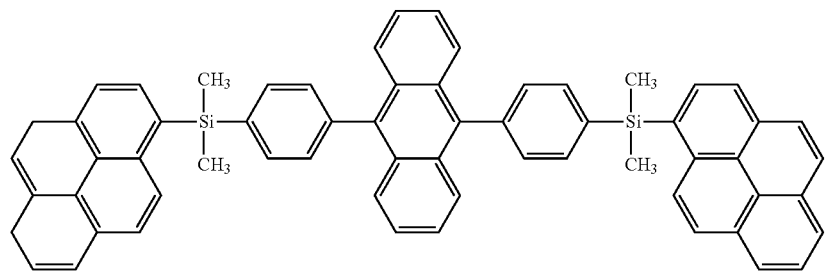

22

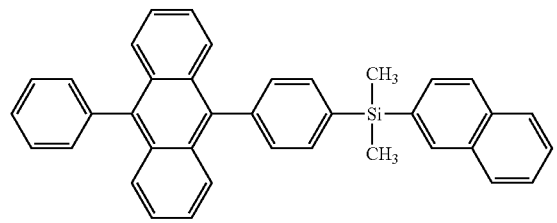

23

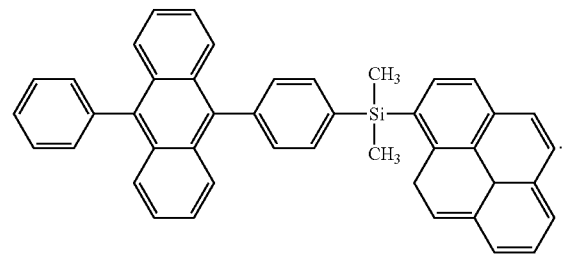

24

The condensed cyclic compound is a blue fluorescent dopant emitting blue light based on fluorescence mechanism.

$R_{41}$ and $R_{42}$ in Formula 20 are each independently selected from a $C_1$-$C_{20}$ alkyl group, a $C_1$-$C_{20}$ alkoxy group, a phenyl group, a naphthyl group, an anthracenyl group, a pyrenyl group, and a chrysenyl group; and a $C_1$-$C_{20}$ alkyl group, a $C_1$-$C_{20}$ alkoxy group, a phenyl group, a naphthyl group, an anthracenyl group, a pyrenyl group, or a chrysenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, and a chrysenyl group.

In Formula 20, i=0, and j=0.

$Z_{31}$ to $Z_{44}$ in Formulae 7A to 7F are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenylene group, a benzothiophenyl group, a thiazolyl group, an isothiazolyl group, a benzothiazolyl group an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, or a $C_2$-$C_{60}$ heteroaryl group; and —Si($Q_{53}$)($Q_{54}$)($Q_{55}$), where $Q_{53}$ to $Q_{55}$ are each independently selected from a hydrogen atom, a $C_1$-$C_{10}$ alkyl group, a $C_6$-$C_{20}$ aryl group, and a $C_2$-$C_{20}$ heteroaryl group.

$Z_{31}$ to $Z_{44}$ in Formulae 7A to 7F are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, and a triazinyl group; and —Si($Q_{53}$)($Q_{54}$)($Q_{55}$), where $Q_{53}$ to $Q_{55}$ are each independently selected from a hydrogen atom, a $C_1$-$C_{10}$ alkyl group, a phenyl group, a naphthyl group, an anthracenyl group, and a pyrenyl group.

$Ar_3$ and $Ar_4$ in Formula 20 are the same.

The condensed cyclic compound represented by Formula 20 is a compound represented by one of Formula 20A, 20B, or 20C, below:

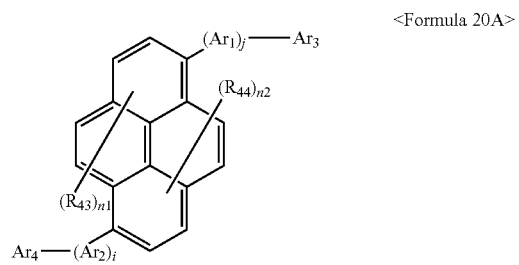

<Formula 20A>

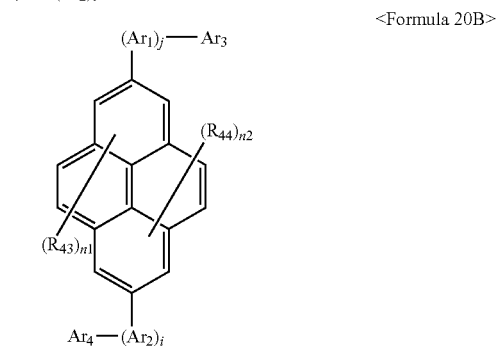

<Formula 20B>

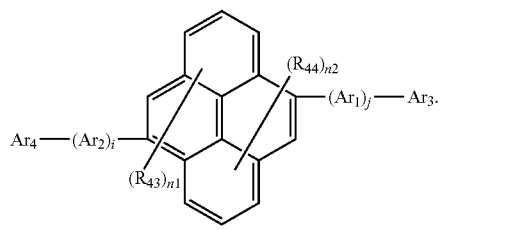

<Formula 20C>

The condensed cyclic compound represented by Formula 20 is a compound represented by Formula 20A(1), below:

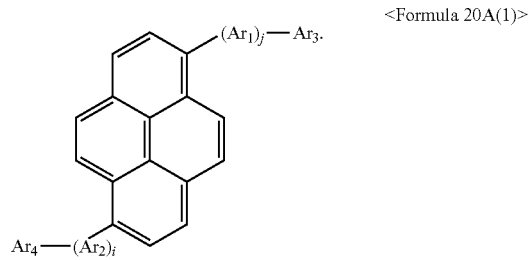

<Formula 20A(1)>

The condensed cyclic compound is one of Compounds 25 to 68, below:
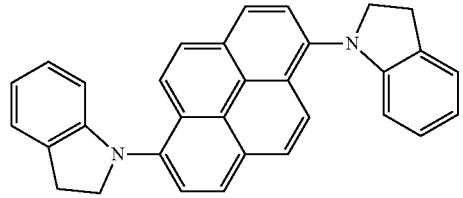
25
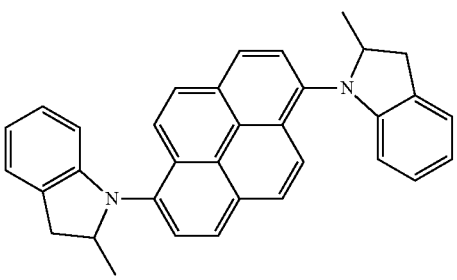
26
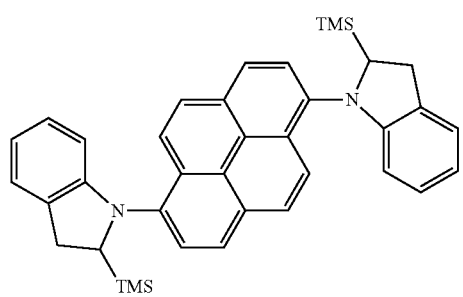
27
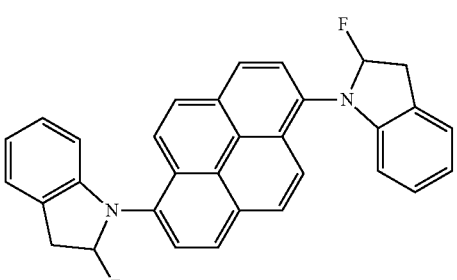
28
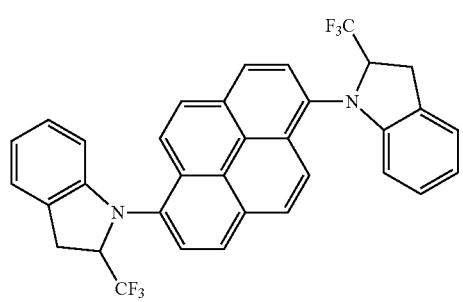
29
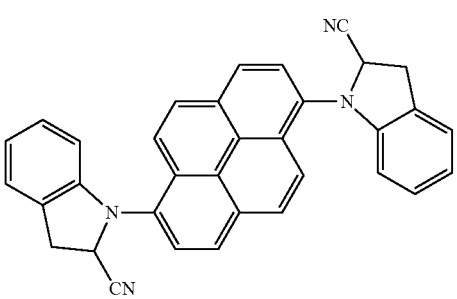
30
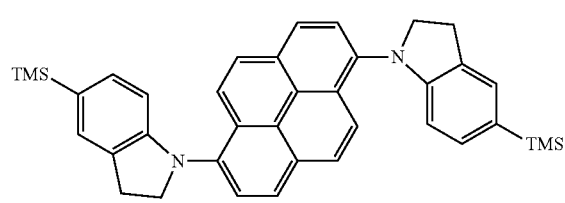
31
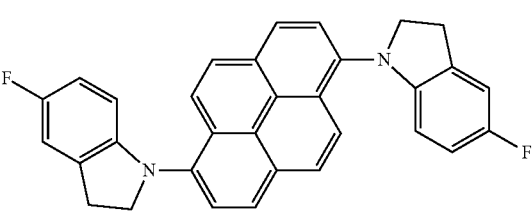
32
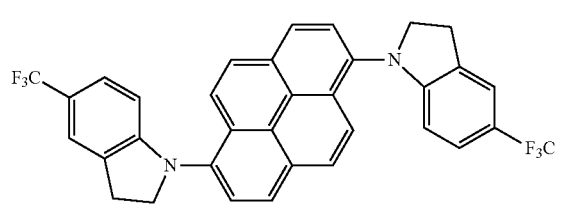
33
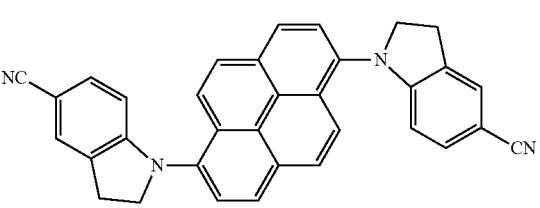
34
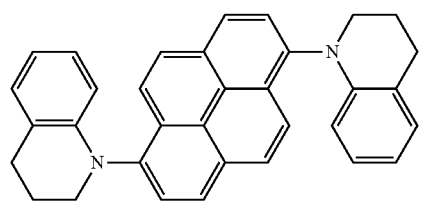
35
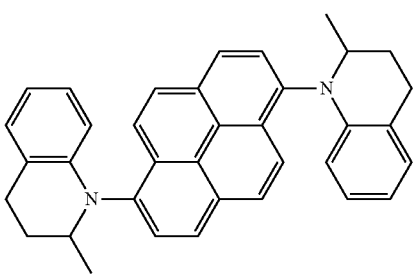
36

-continued
37
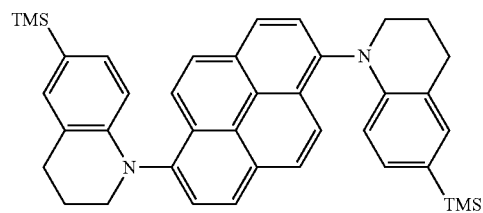
38
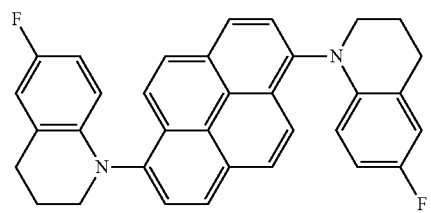
39
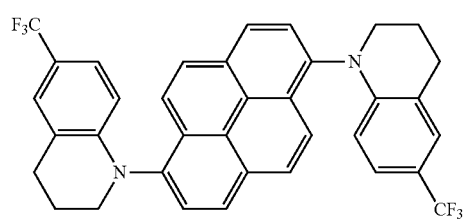
40
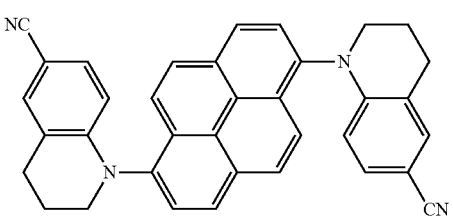
41
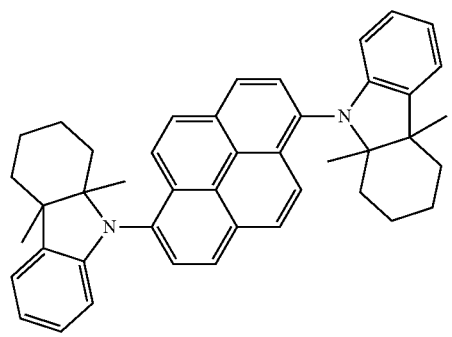
42
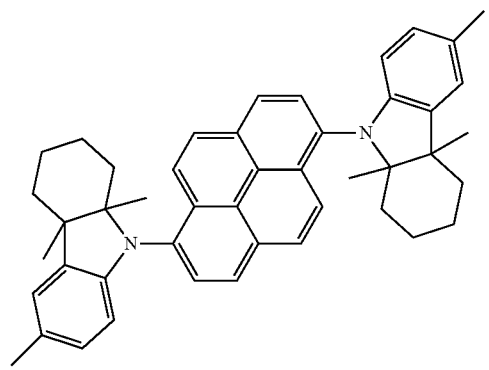
43
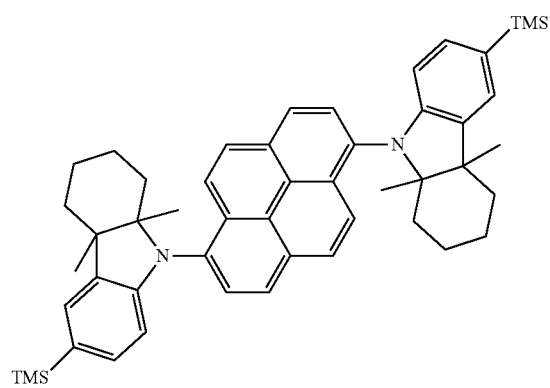
44
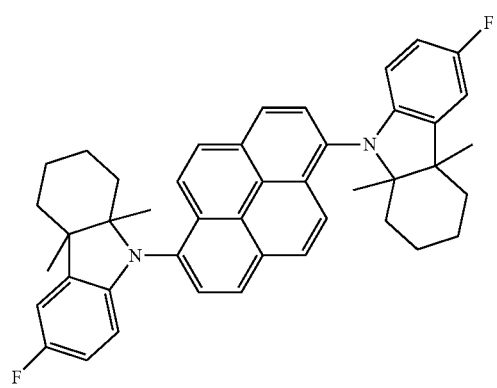
45
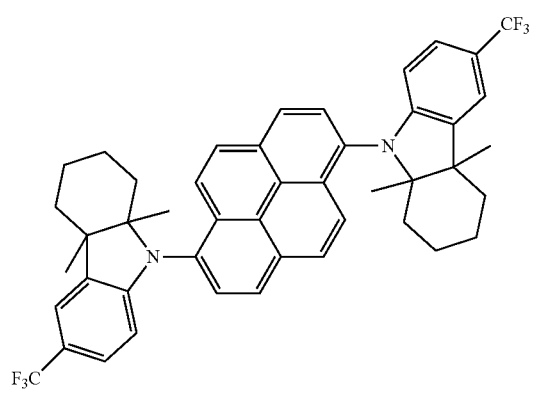
46
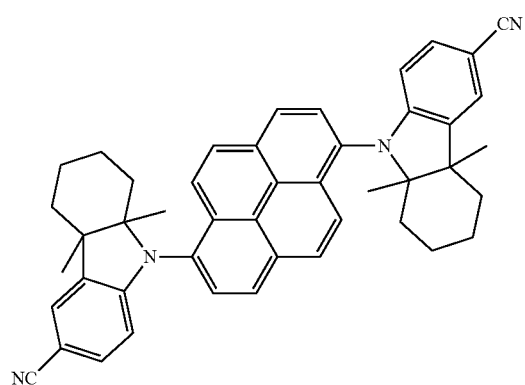

-continued
47
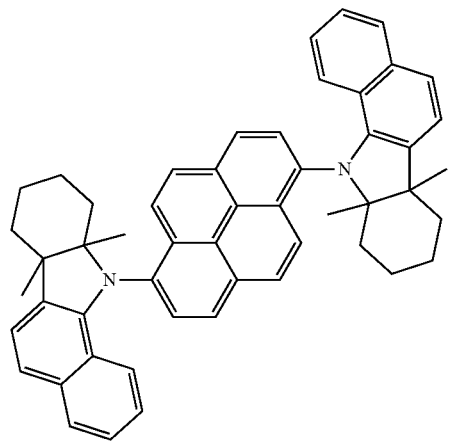
48
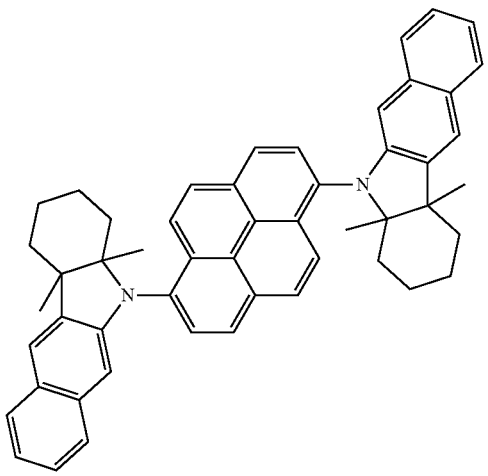
49
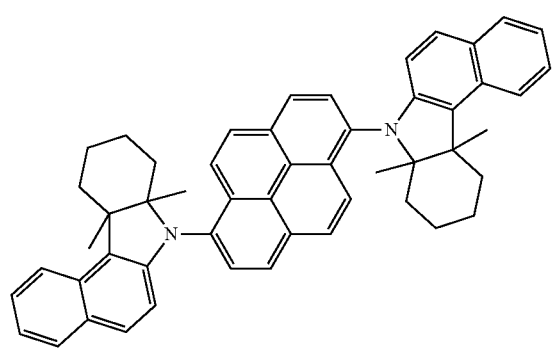
50
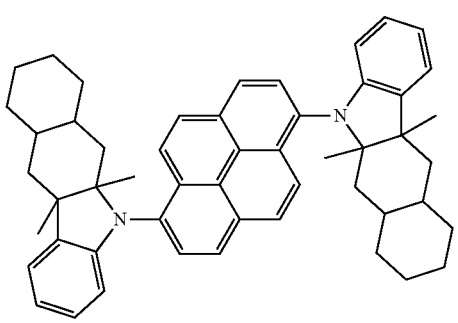
51
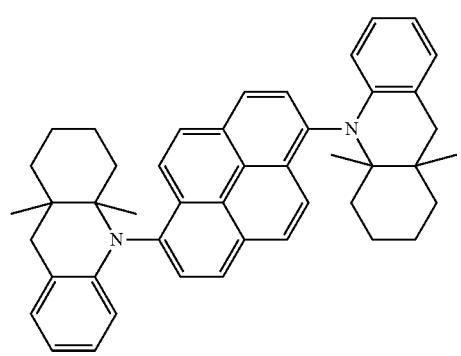
52
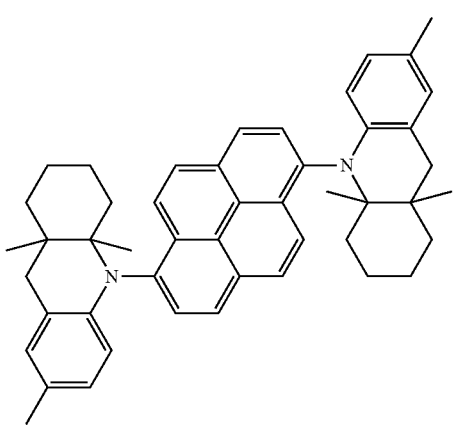

53
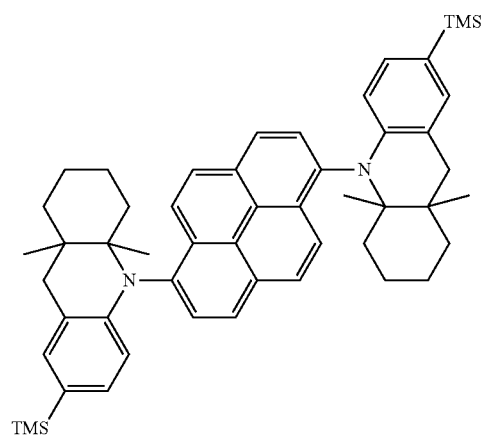
54
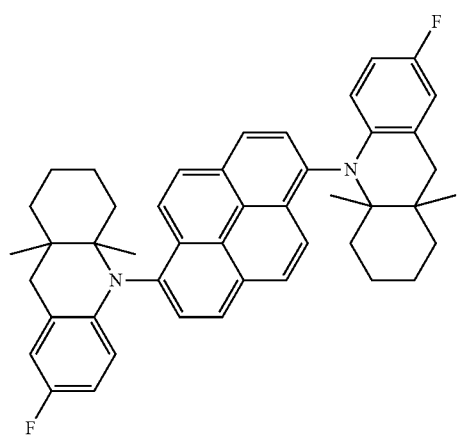
55
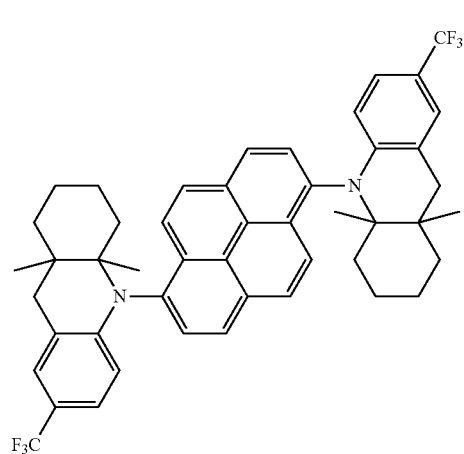
56
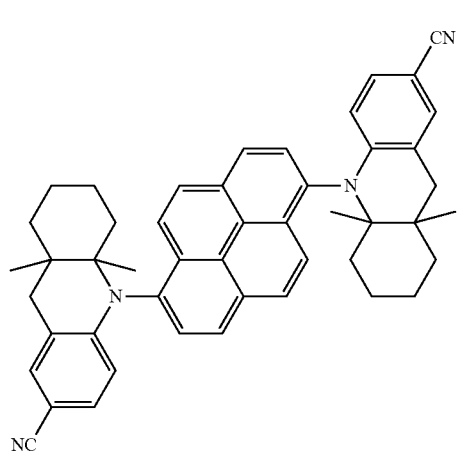
57
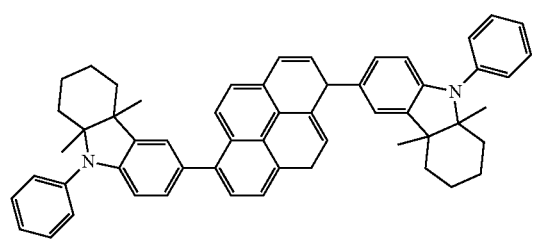
58
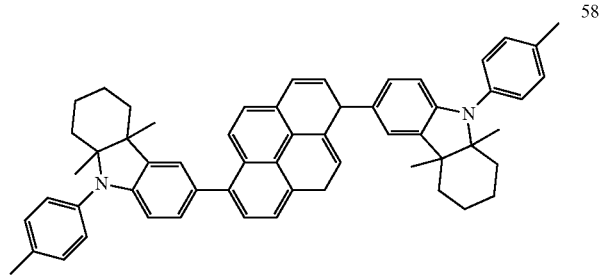
59
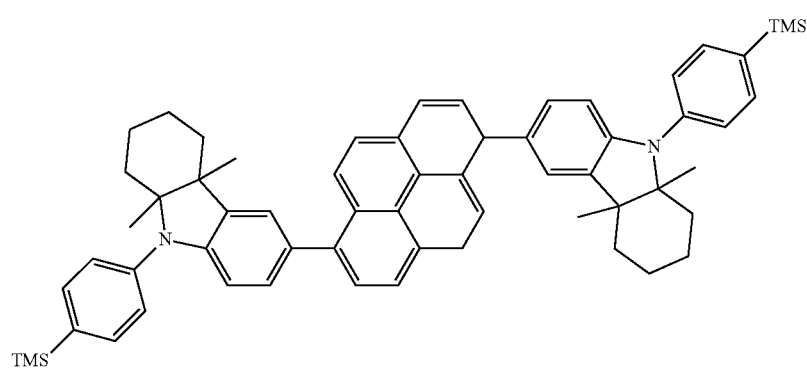

-continued
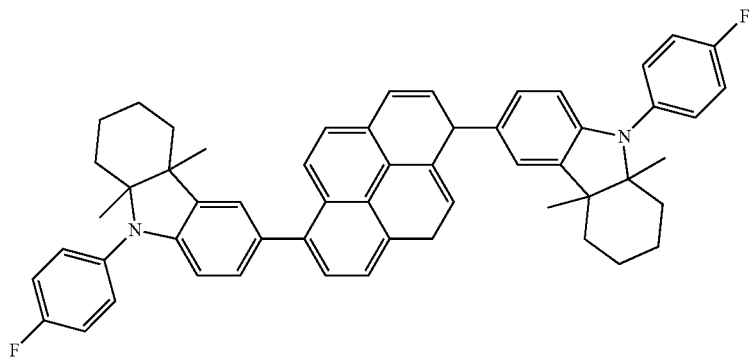
60
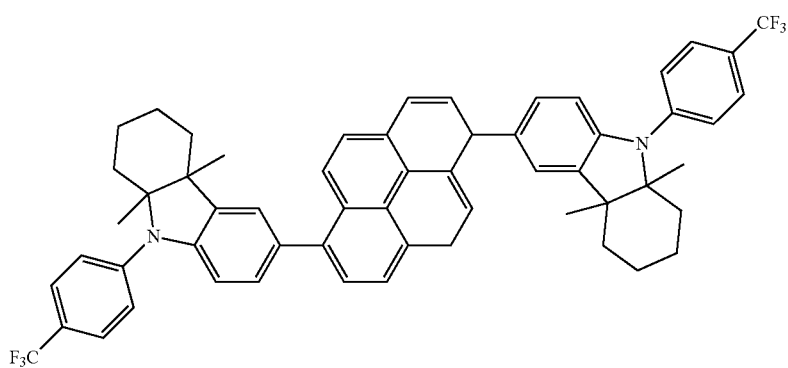
61
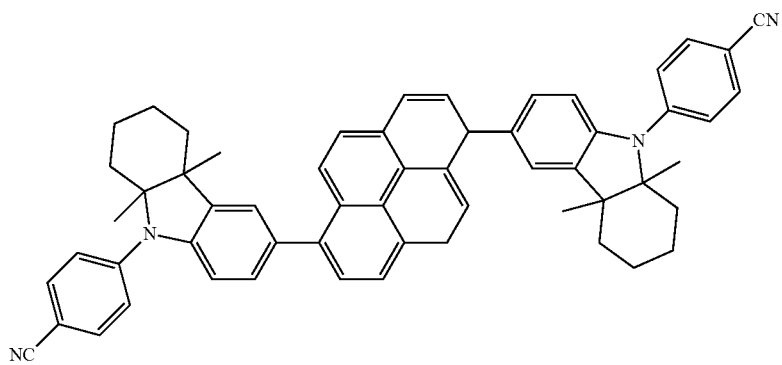
62
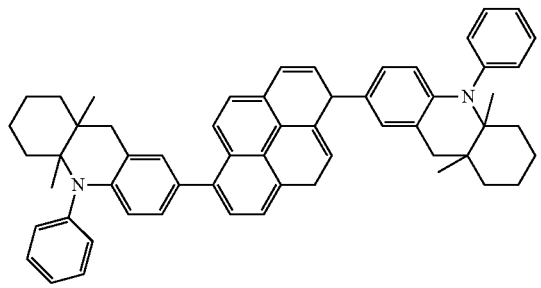
63
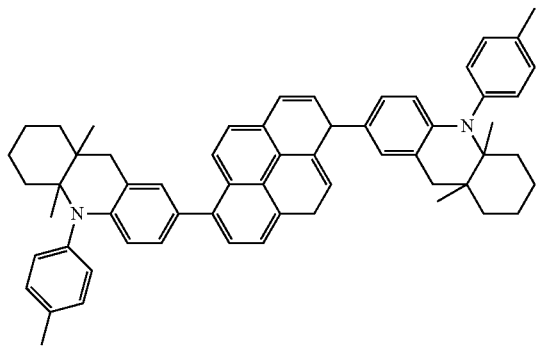
64

-continued

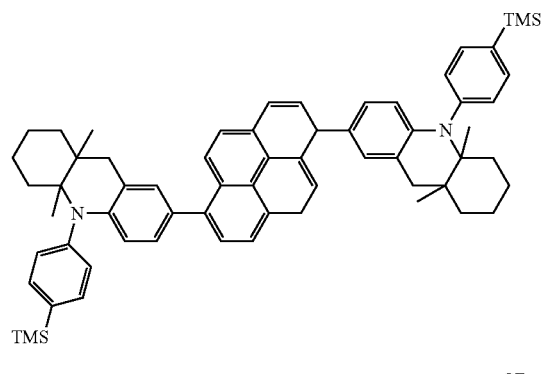
65

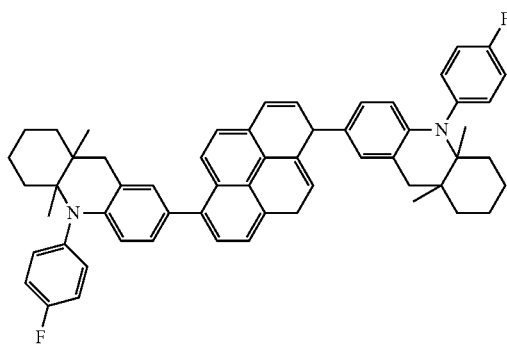
66

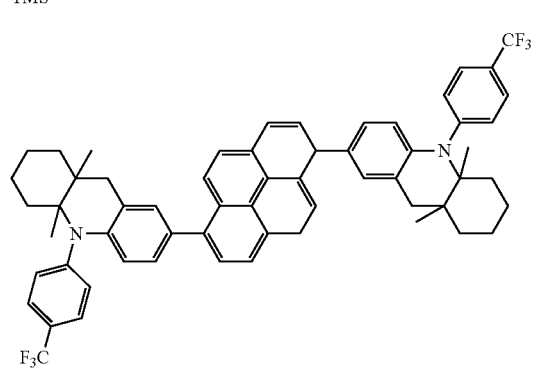
67

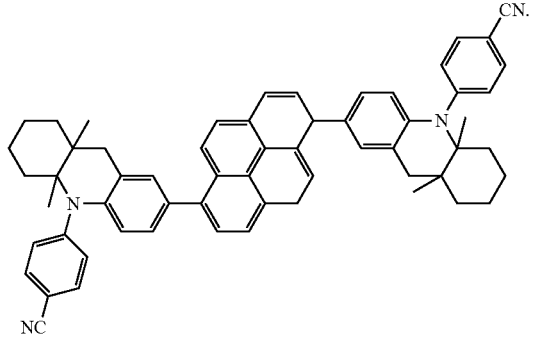
68

The embodiments may also be realized by providing an organic light-emitting diode including a substrate; a first electrode on the substrate; a second electrode disposed opposite to the first electrode; and an emission layer between the first electrode and the second electrode, the emission layer including an anthracene-based compound represented by one of Compounds 1 to 24, below, and a condensed cyclic compound represented by one of compounds 25 to 68, below:

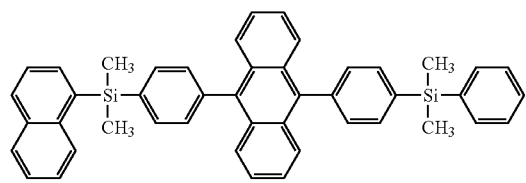
1

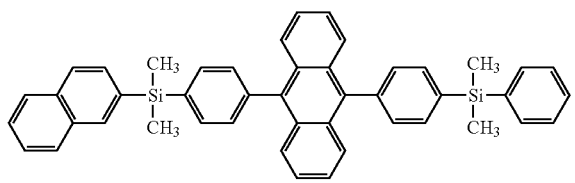
2

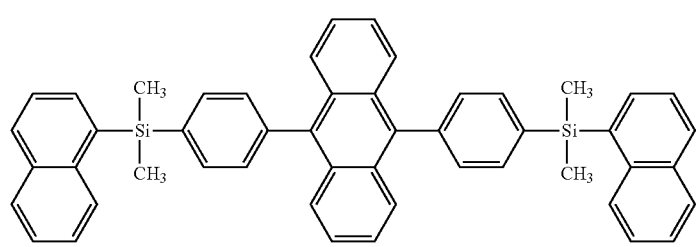
3

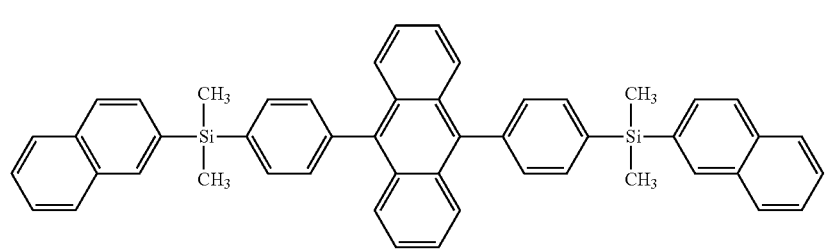
4

5
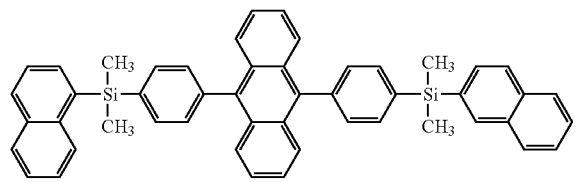
6
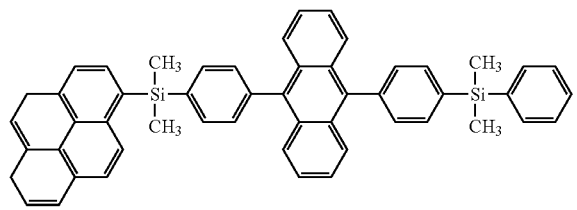
7
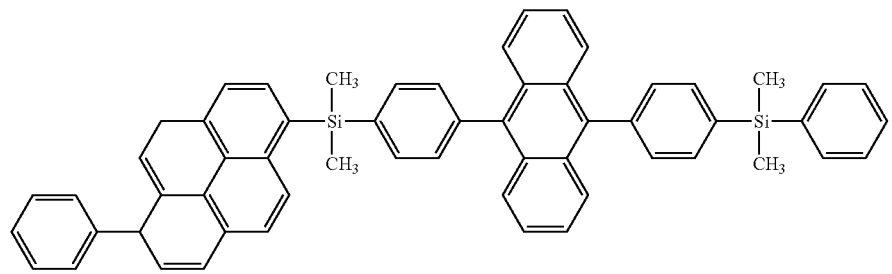
8
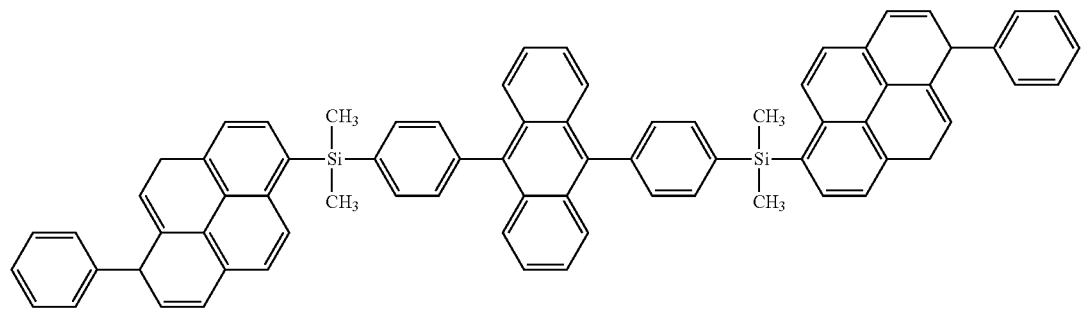
9
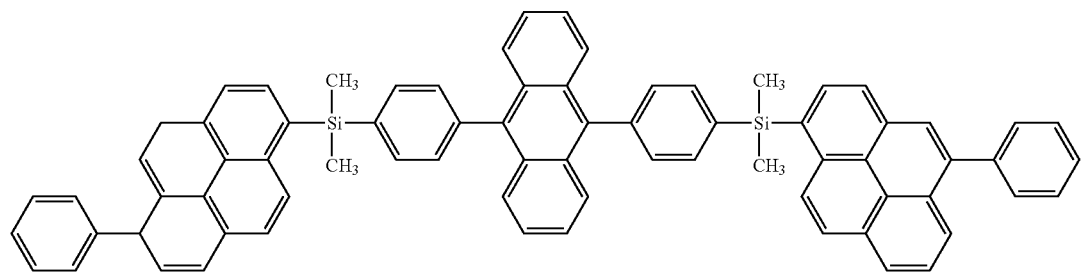
10
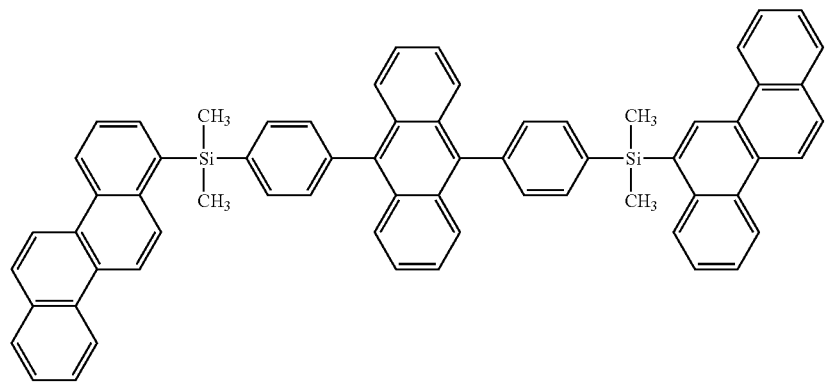

11
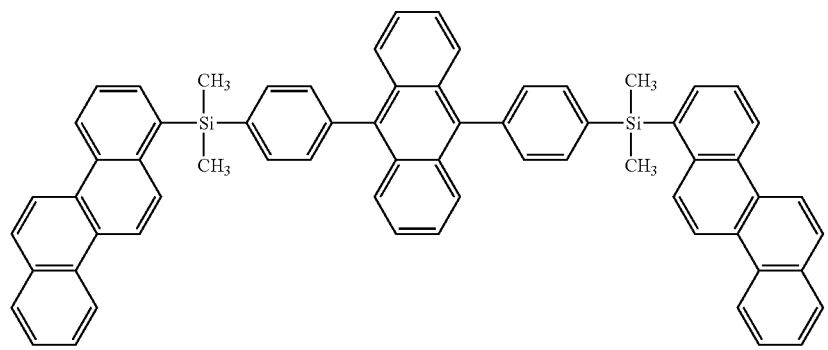
12
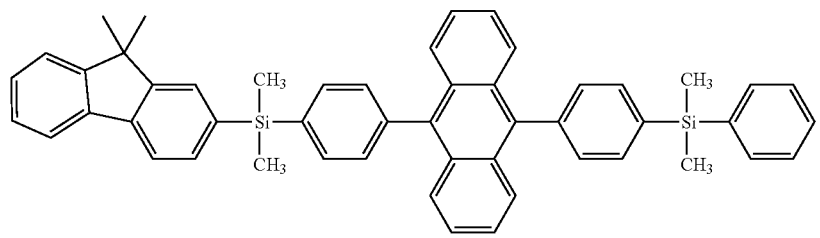
13
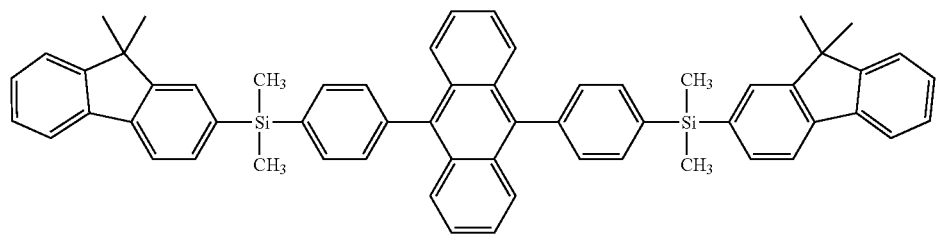
14
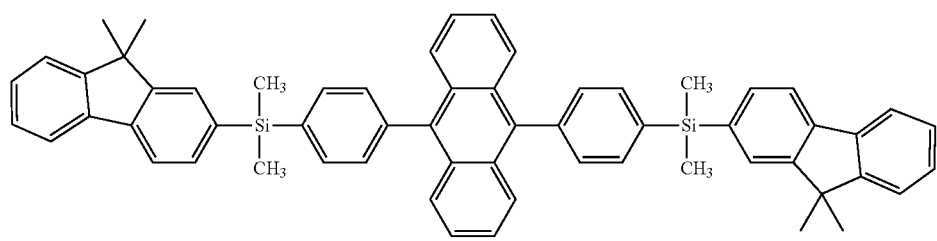
15
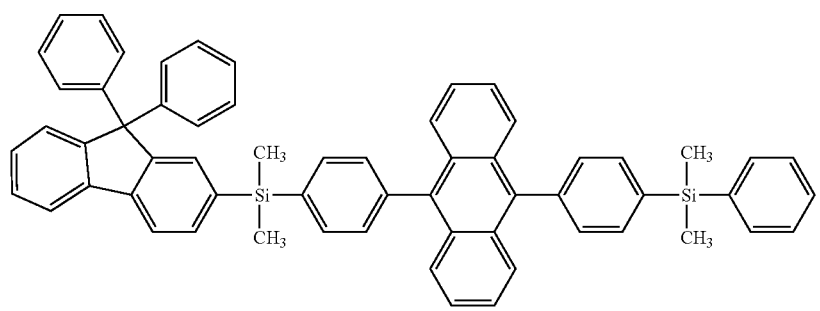

16
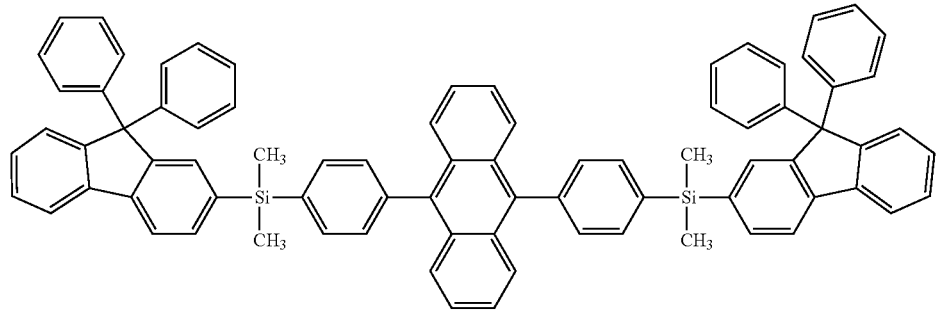
17
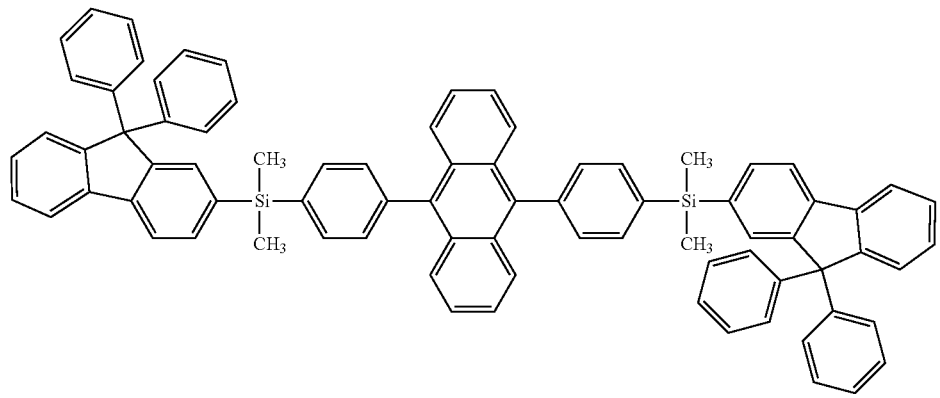
18
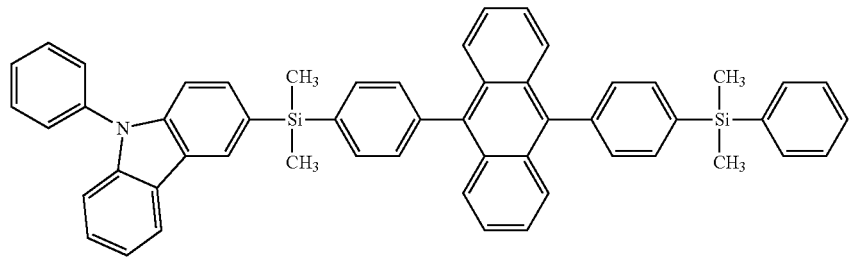
19
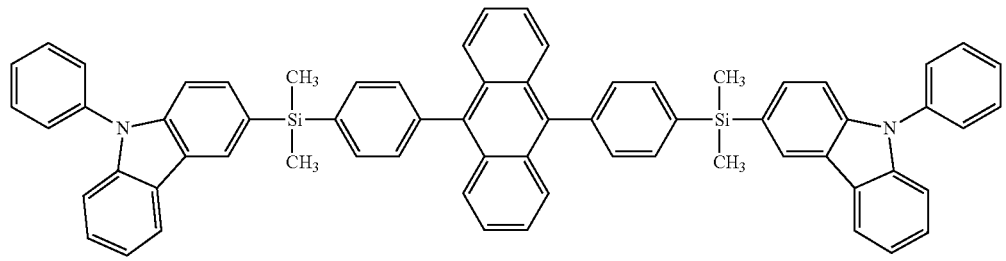
20
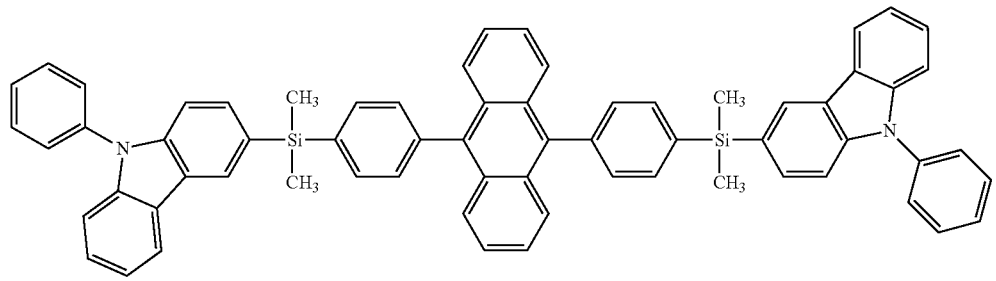

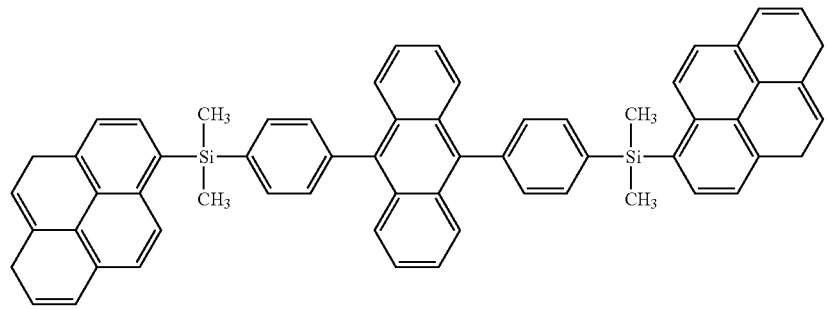
21
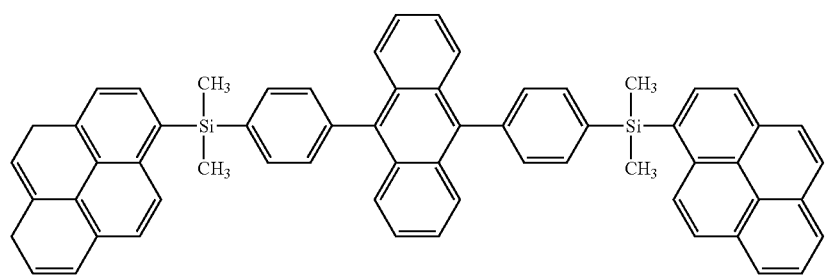
22
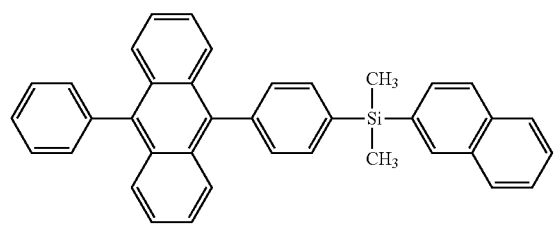
23
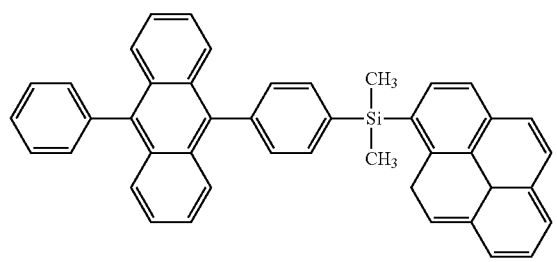
24
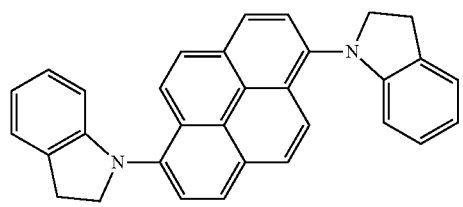
25
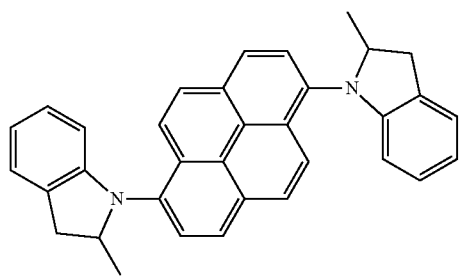
26
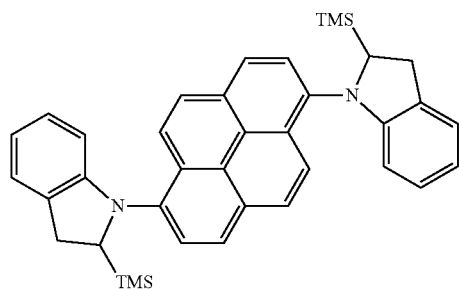
27
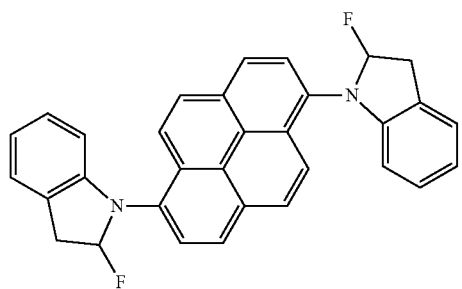
28

-continued
29
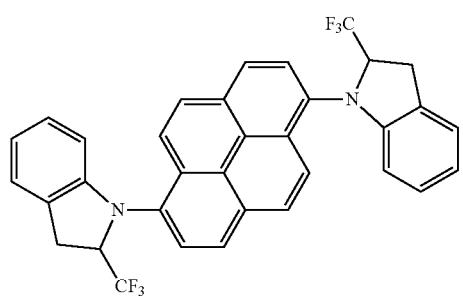
30
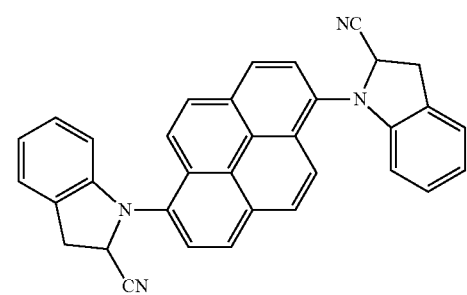
31
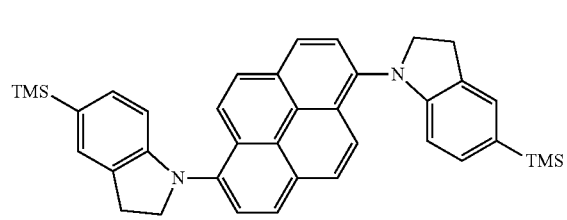
32
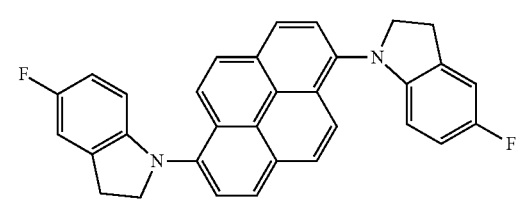
33
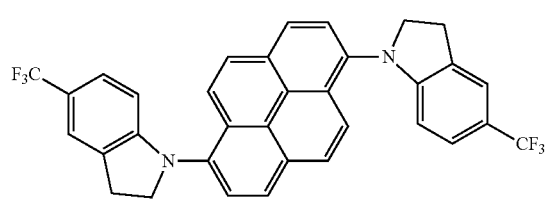
34
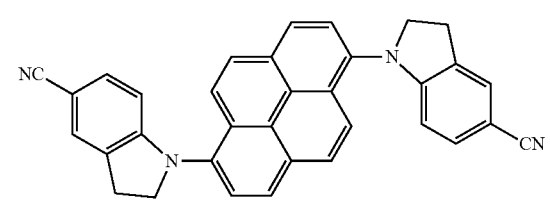
35
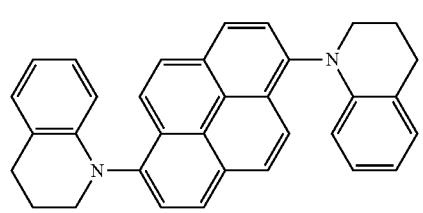
36
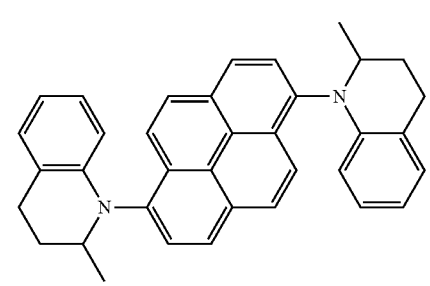
37
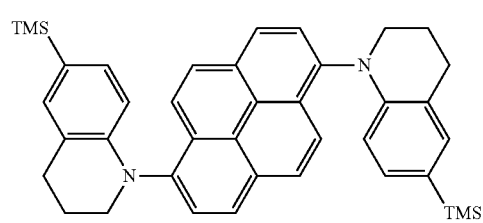
38
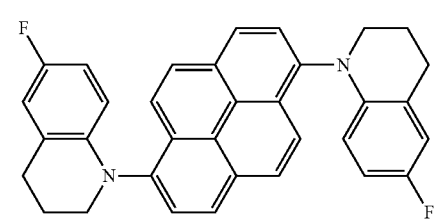
39
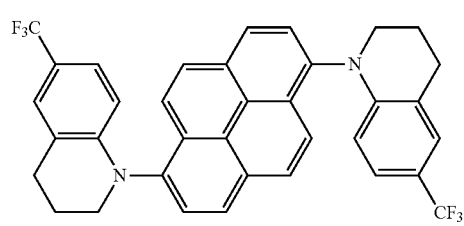
40
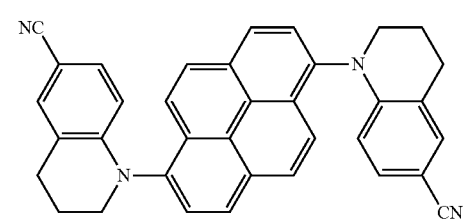

-continued
41
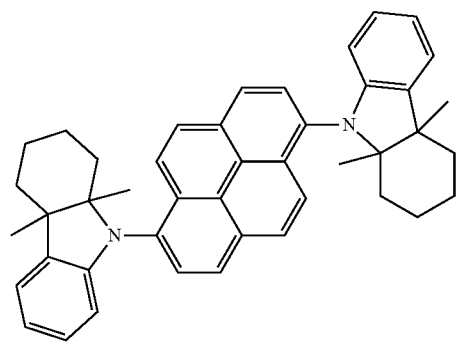
42
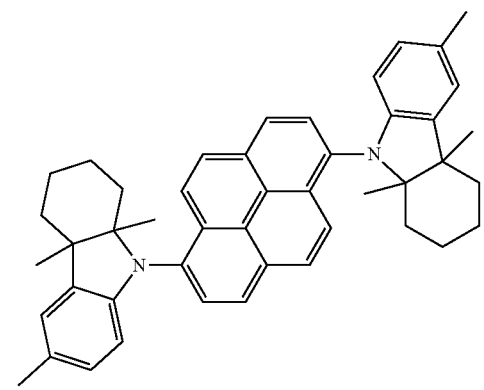
43
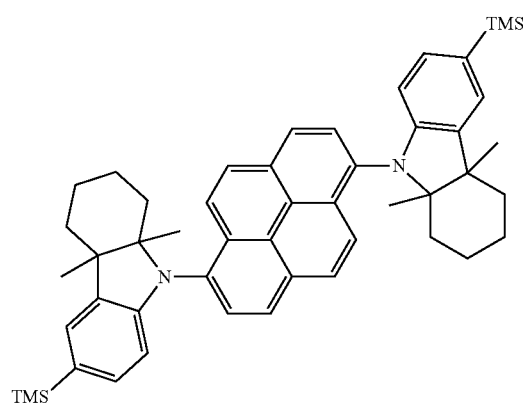
44
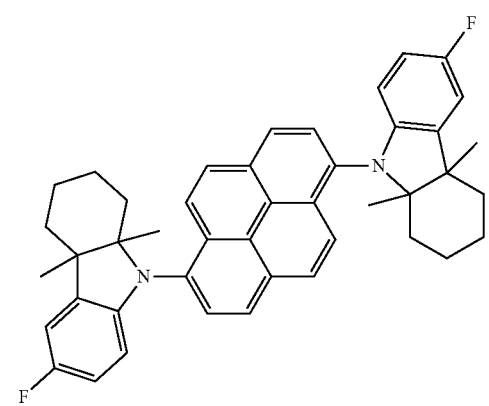
45
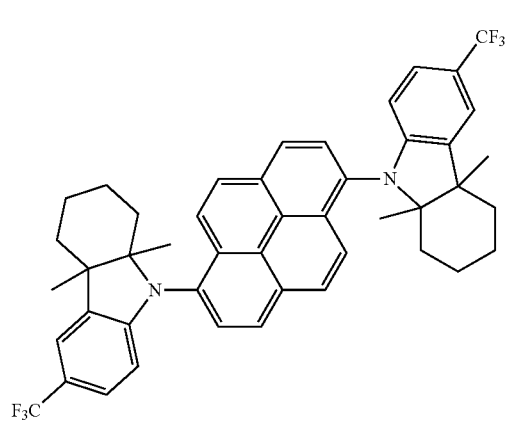
46
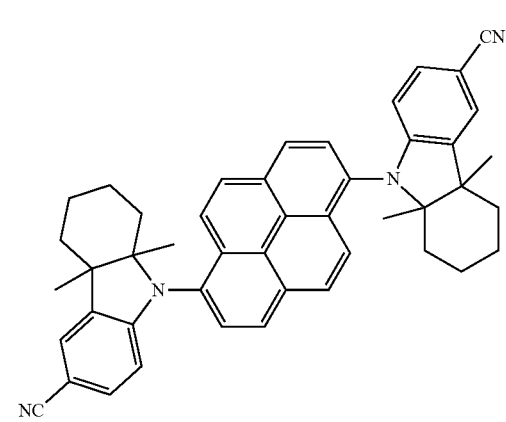

-continued
47
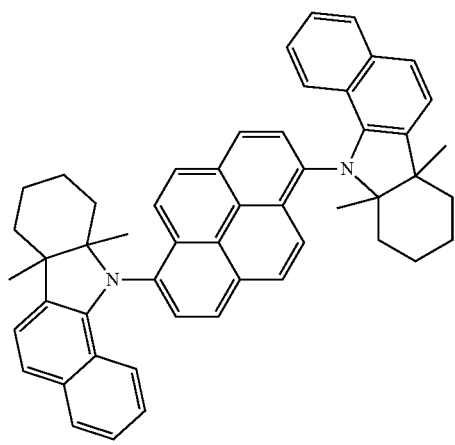
48
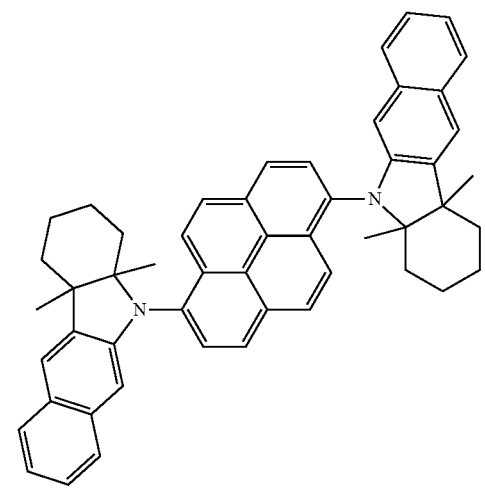
49
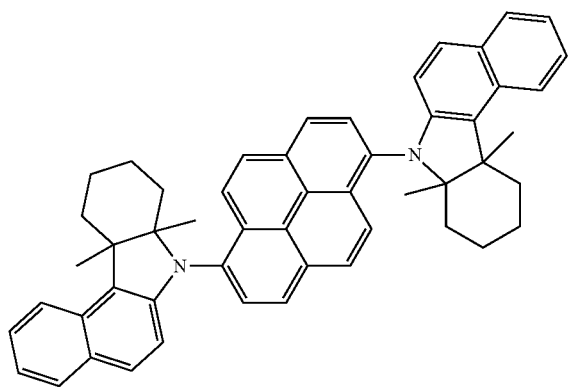
50
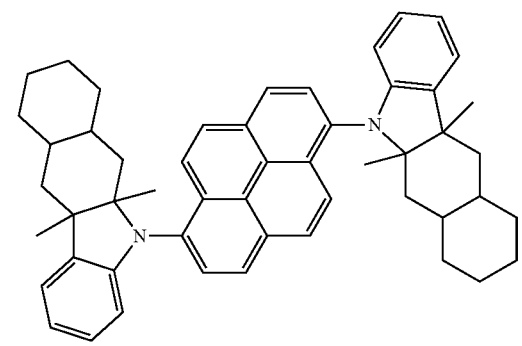
51
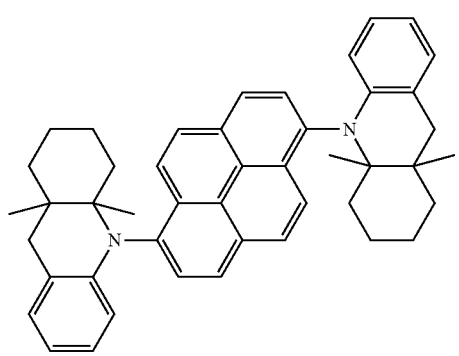
52
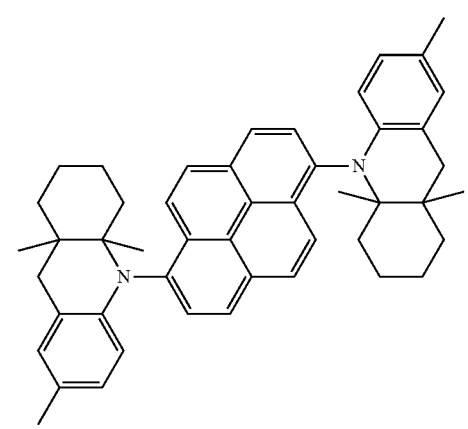

-continued
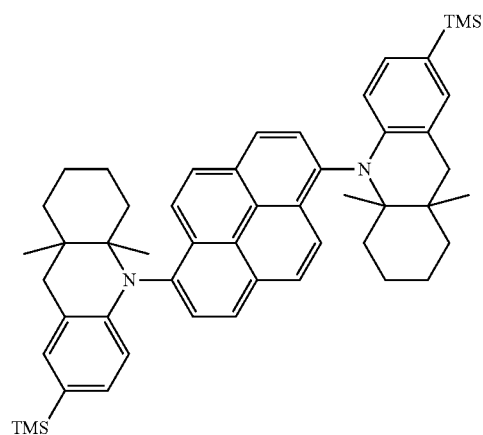
53
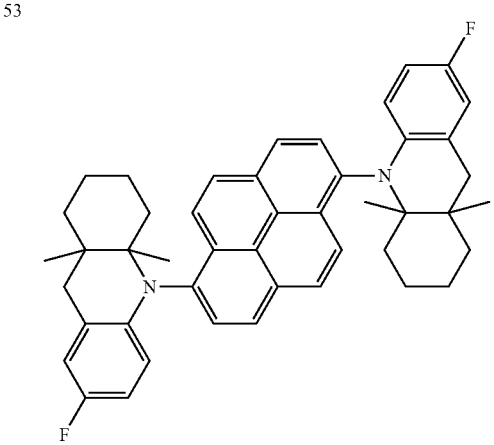
54
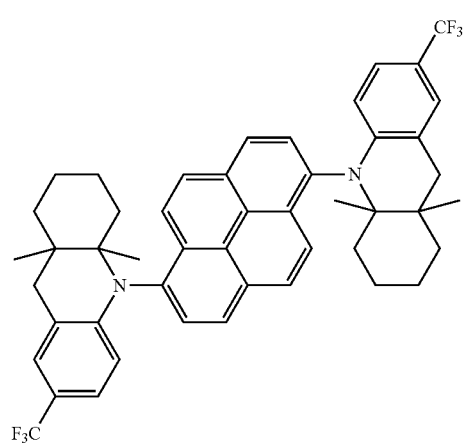
55
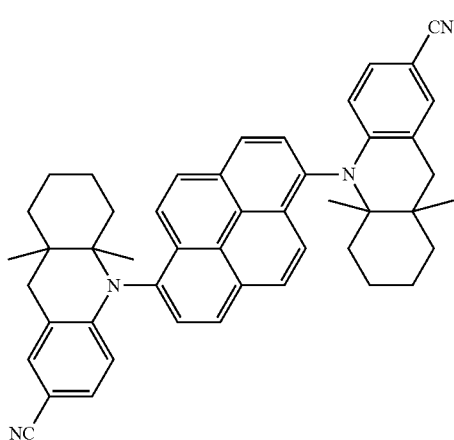
56
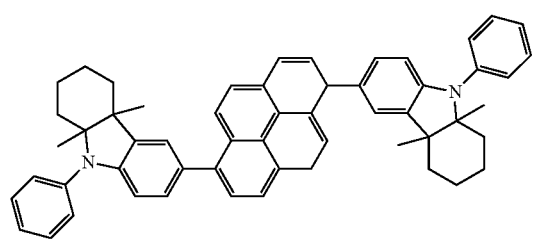
57
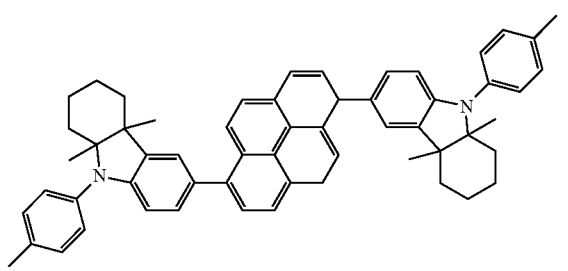
58
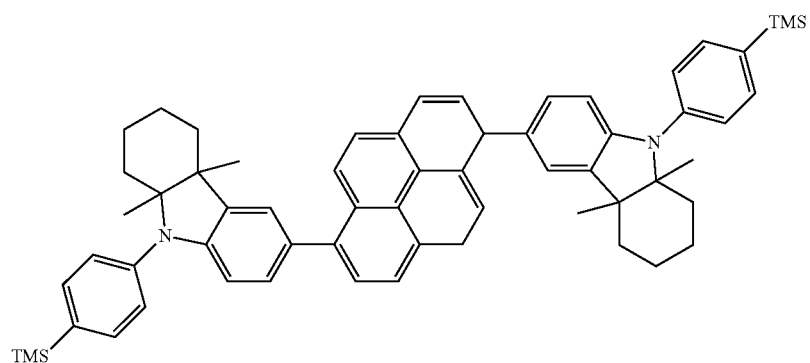
59

-continued
60
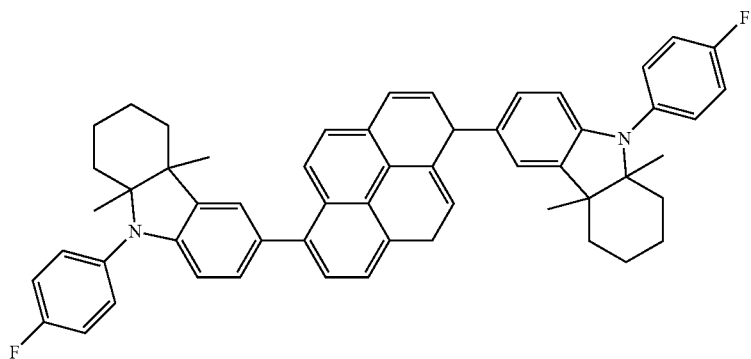
61
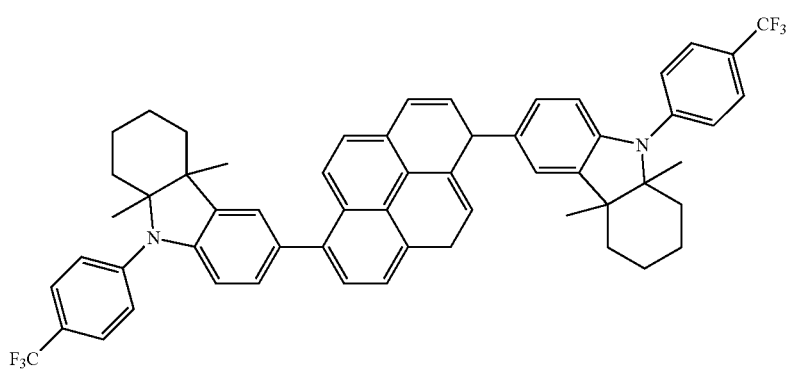
62
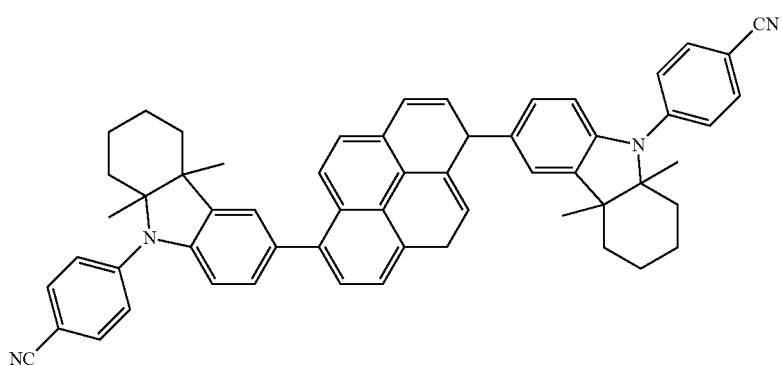
63
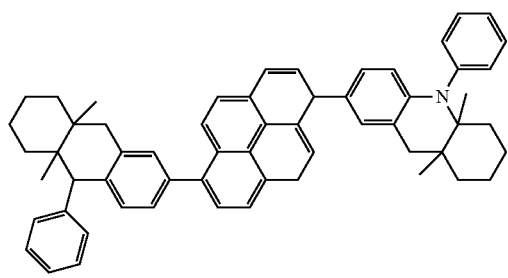
64
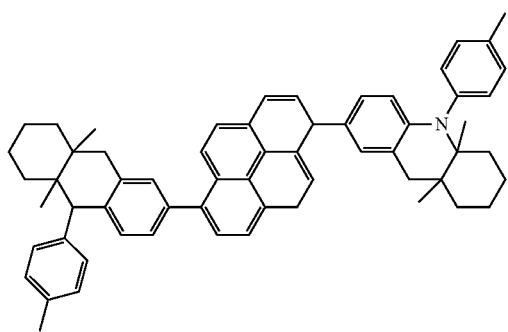

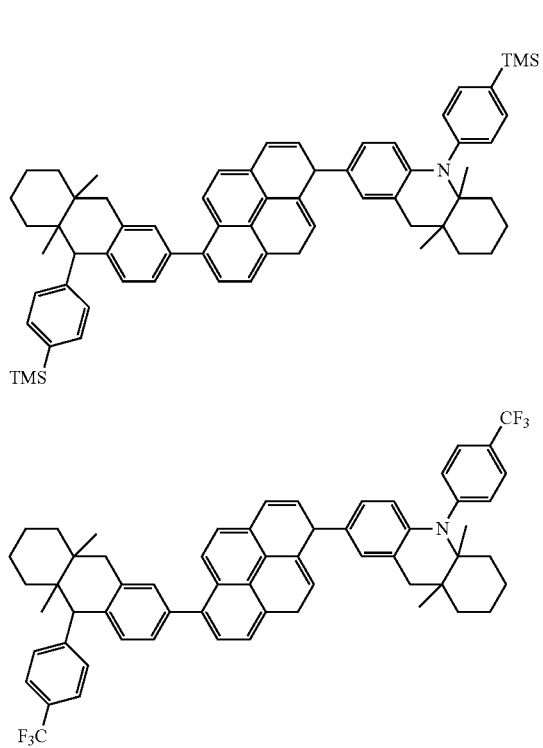

65

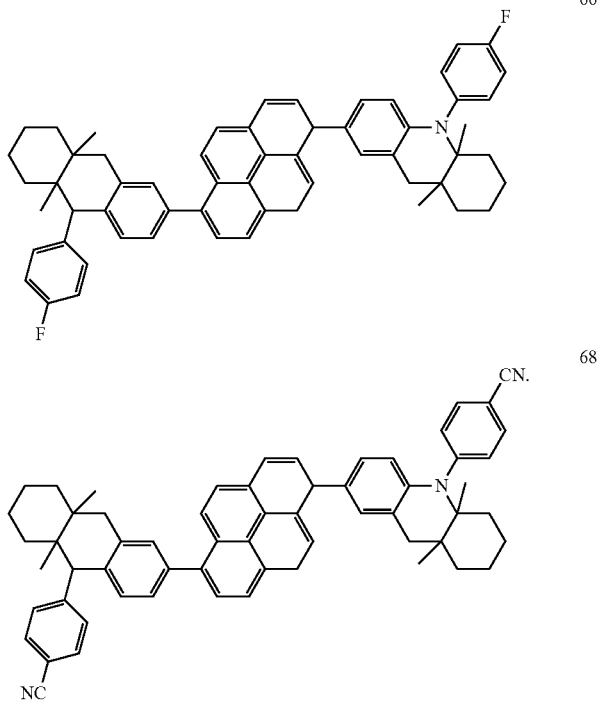

66

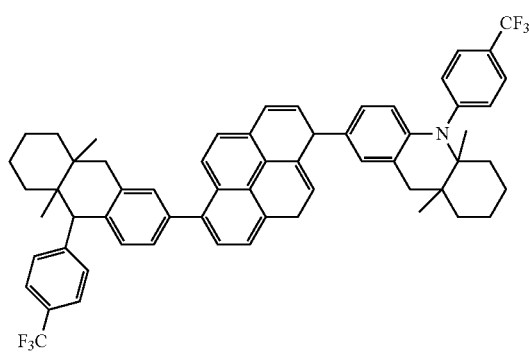

67

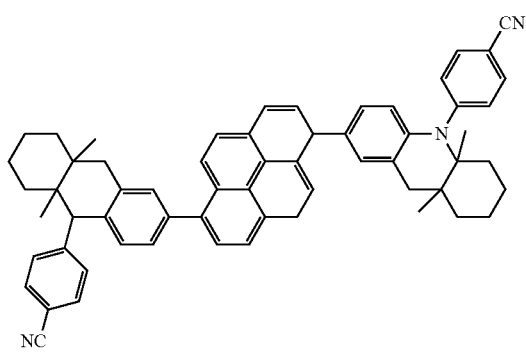

68

BRIEF DESCRIPTION OF THE DRAWING

Features will be apparent to those of skill in the art by describing in detail exemplary embodiments with reference to the attached drawings in which:

FIG. 1 illustrates a schematic view of a structure of an organic light-emitting diode according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a schematic sectional view of an organic light-emitting diode 10 according to an embodiment. Referring to FIG. 1, the organic light-emitting diode 10 may include a substrate 11, a first electrode 13, an organic layer 15, and a second electrode 17. Hereinafter, a structure of an organic light-emitting diode according to an embodiment and a method of manufacturing the same will now be described with reference to FIG. 1.

The substrate 11 may be a suitable substrate that is used for organic light-emitting diodes. In an implementation, the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 is an anode, a material having a high work function may be used as the first electrode-forming material, to facilitate hole injection. The first electrode 13 may be a reflective electrode or a transmissive electrode. In an implementation, transparent and conductive materials, e.g., ITO, IZO, SnO$_2$, or ZnO, may be used to form the first electrode. In an implementation, the first electrode 13 may be formed as a reflective electrode using, e.g., magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO.

The organic layer 15 may be disposed on the first electrode 13.

The organic layer 15 may include a plurality of layers disposed between the first electrode 13 and the second electrode 17 of the organic light-emitting diode 10. The organic layer 15 may include at least one of a hole injection layer, a hole transport layer, a functional layer having both hole injection and hole transport capabilities, a buffer layer, an electron blocking layer, an emission layer, a hole blocking layer, an electron transport layer, an electron injection layer, and a functional layer having both electron injection and electron transport capabilities.

In an implementation, the organic layer 15 may include a hole injection layer (HIL), a hole transport layer (HTL), a buffer layer, an emission layer (EML), an electron transport layer (ETL), and an electron injection layer (EIL) that are stacked upon one another in this order.

The HIL may be formed on the first electrode 13 by any of a variety of methods, including vacuum deposition, spin coating, casting, Langmuir-Blodgett (LB) deposition, and the like.

When the HIL is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary depending on the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C. However, the coating conditions are not limited thereto.

A material for forming the HIL may be a suitable hole injecting material. Non-limiting examples of the hole injecting material may include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

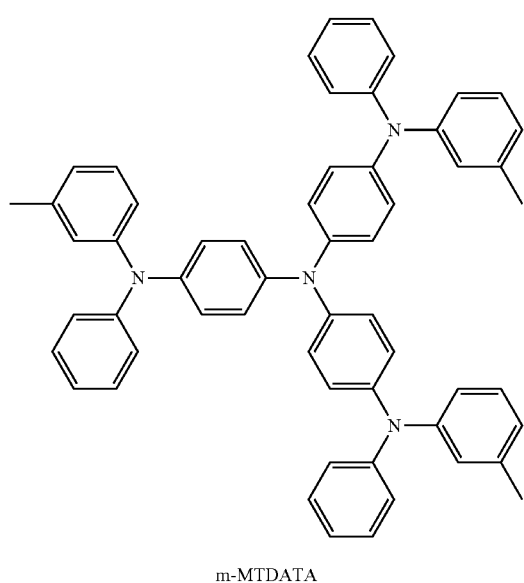

m-MTDATA

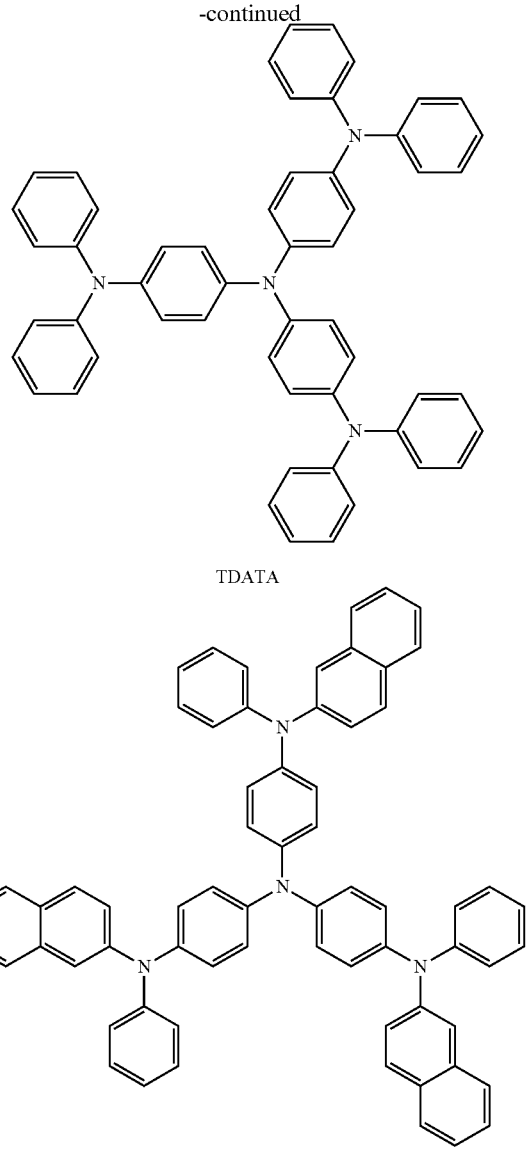

TDATA

2-TNATA

The thickness of the HIL may be about 100 Å to about 10,000 Å, e.g., about 100 Å to about 1000 Å. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary depending on the material that is used to form the HTL.

Non-limiting examples of suitable known HTL forming materials may include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

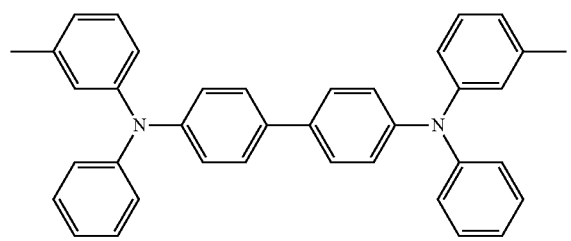

TPD

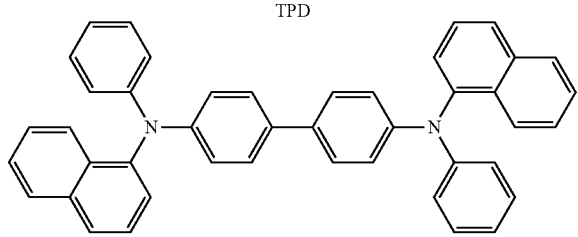

<NPB>

The thickness of the HTL may be from about 50 Å to about 2,000 Å, e.g., about 100 Å to about 1,500 Å. When the thickness of the HTL is within these ranges, the HTL may have good hole transporting ability without a substantial increase in driving voltage.

In an implementation, a functional layer ("H-functional layer") having both hole injection and hole transport capabilities may be included in the organic light-emitting diode, instead of the HIL and the HTL. The H-functional layer may include at least one material from each group of the hole injection layer materials and hole transport layer materials. The thickness of the H-functional layer may be from about 100 Å to about 10,000 Å, e.g., about 100 Å to about 1,000 Å. When the thickness of the H-functional layer is within these ranges, the H-functional layer may have good hole injection and transport capabilities without a substantial increase in driving voltage.

In an implementation, at least one of the HIL, HTL, and H-functional layer may include a compound represented by Formula 300, below, or a compound represented by Formula 350, below.

<Formula 300>

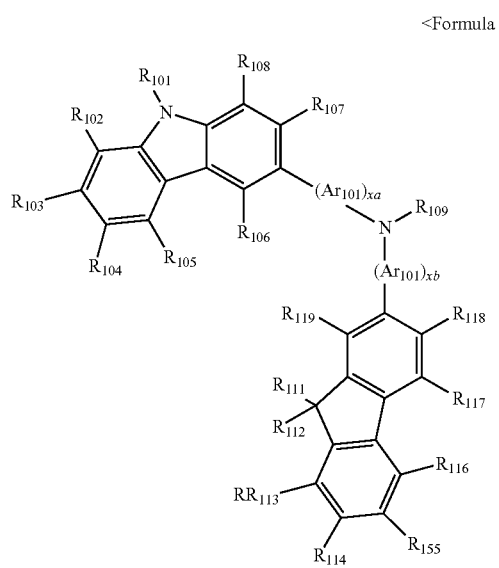

<Formula 301>

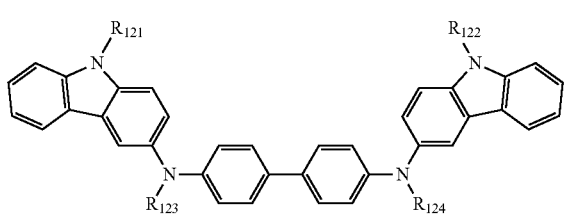

In Formula 300, $Ar_{101}$ and $Ar_{102}$ may each independently be a substituted or unsubstituted $C_6$-$C_{60}$ arylene group.

In an implementation, $Ar_{101}$ and $Ar_{102}$ may be each independently one of a phenylene group, a pentalenylene group, an indenylene group, a naphthylene group, an azulenylene group an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group; or a phenylene group, a pentalenylene group, an indenylene group, a naphthylene group, an azulenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, or a pentacenylene group, each substituted with at least one of a deuterium atom, a halogen atom, a hydroxyl group, a nitro group, a cyano group, an amino group, an amidino group, a hydrazine group, a hydrazine group, a carboxyl group or salt thereof, a sulfuric acid group or salt thereof, a phosphoric acid group or salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group.

In Formula 300, xa and xb may each independently be an integer from 0 to 5, e.g., may be 0, 1, or 2. For example, xa may be 1, and xb may be 0.

In Formulae 300 and 301 above, $R_{101}$ to $R_{108}$, $R_{111}$ to $R_{119}$, and $R_{121}$ to $R_{124}$ may each independently be a hydrogen atom, a deuterium atom, a halogen atom, a hydroxyl group, a cyano group, a nitro group, an amino group, an amidino group, a hydiazine group, a hydrazine group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

In an implementation, in Formulae 300 and 301, $R_{101}$ to $R_{108}$, $R_{111}$ to $R_{119}$, and $R_{121}$ to $R_{124}$ may each independently be selected from
a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, or a hexyl group), and a $C_1$-$C_{10}$ alkoxy group (for example, a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{109}$ may be one of a phenyl group, a naphthyl group, an anthracenyl group, a biphenyl group and a pyridyl group; and a phenyl group, a naphthyl group, an anthracenyl group, a biphenyl group, and a pyridyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an implementation, the compound of Formula 300 may be a compound represented by Formula 300A, below.

<Formula 300A>

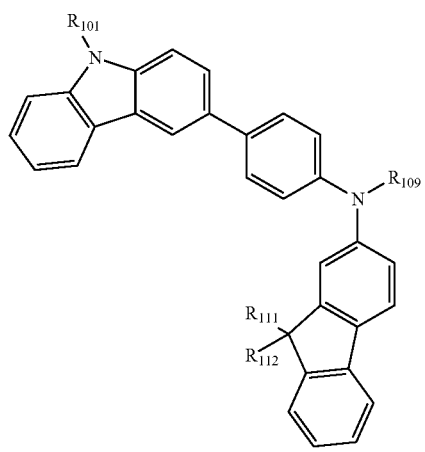

In Formula 300A, $R_{101}$, $R_{111}$, $R_{112}$, and $R_{109}$ may be as defined above.

In an implementation, at least one of the HIL, HTL, and H-functional layer may include at least one of the compounds represented by Formulae 301 to 320 below:

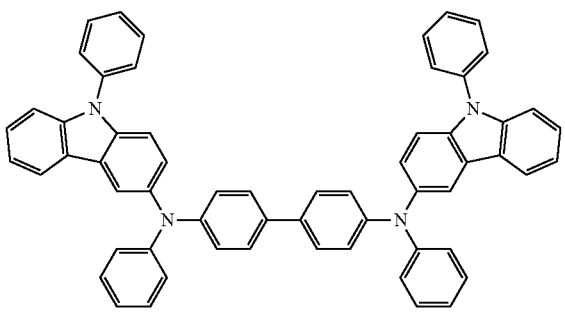

301

302

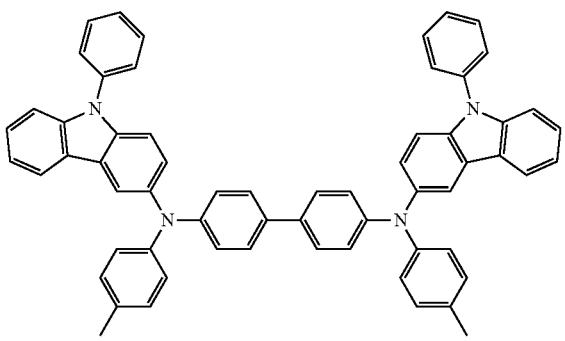

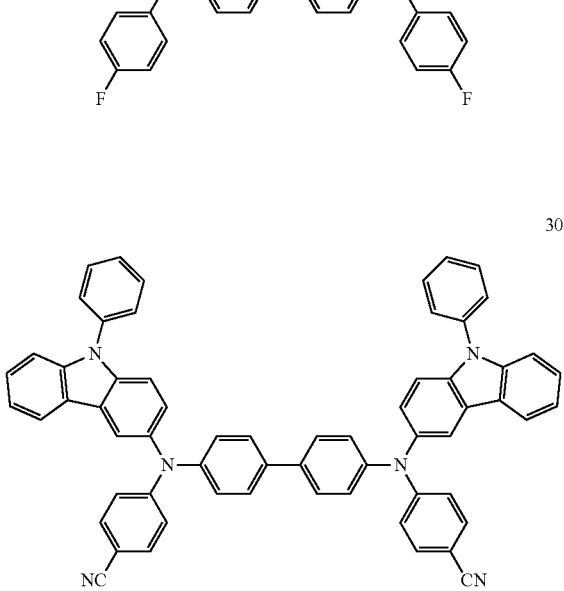

303

304

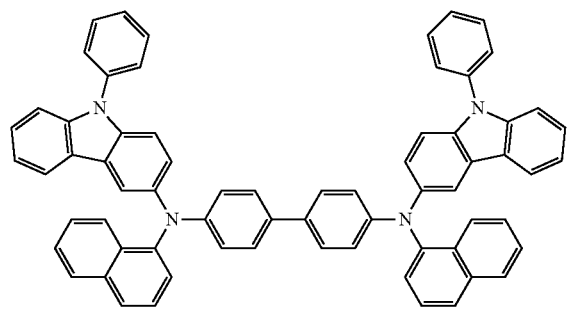
305
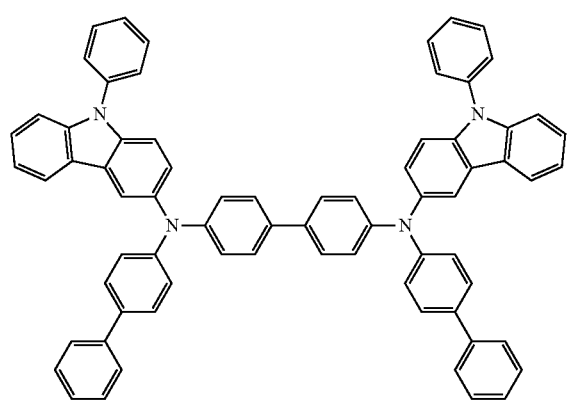
306
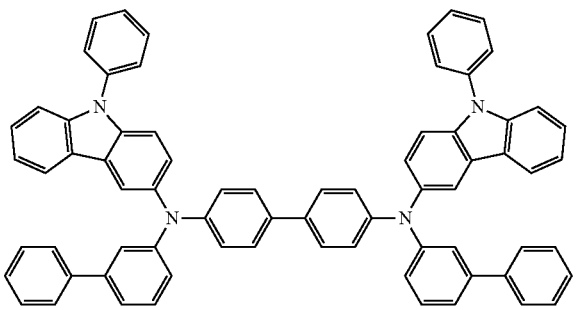
307
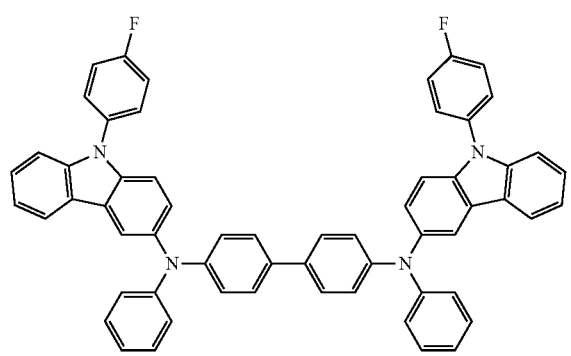
308
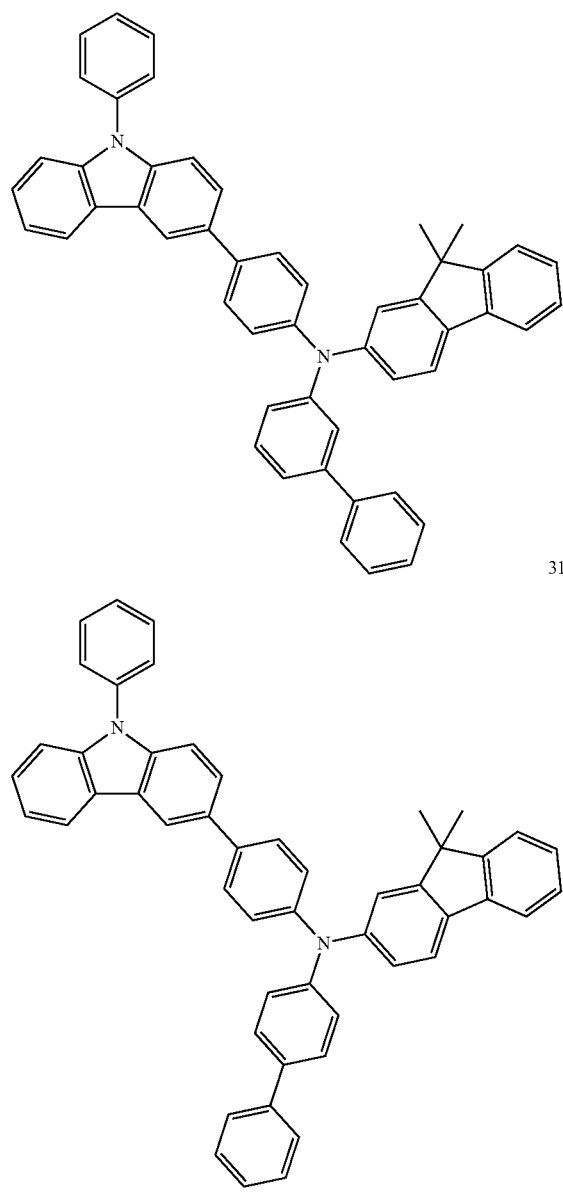

312
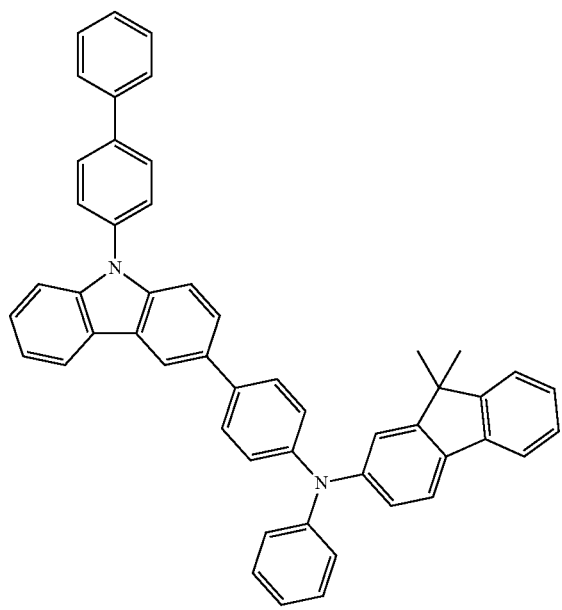
313
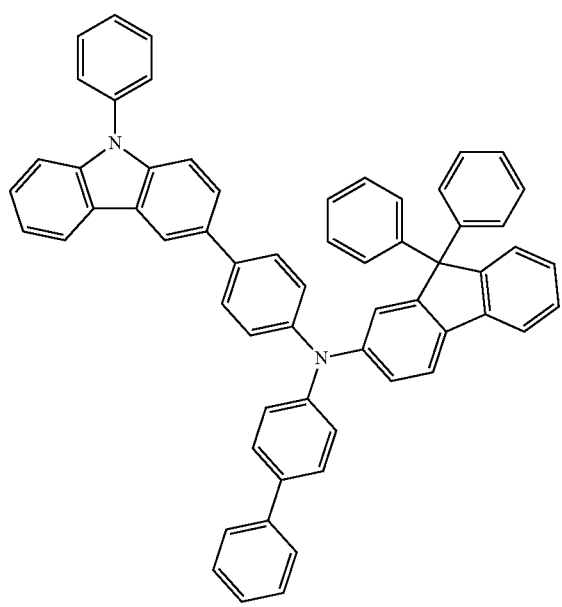
314
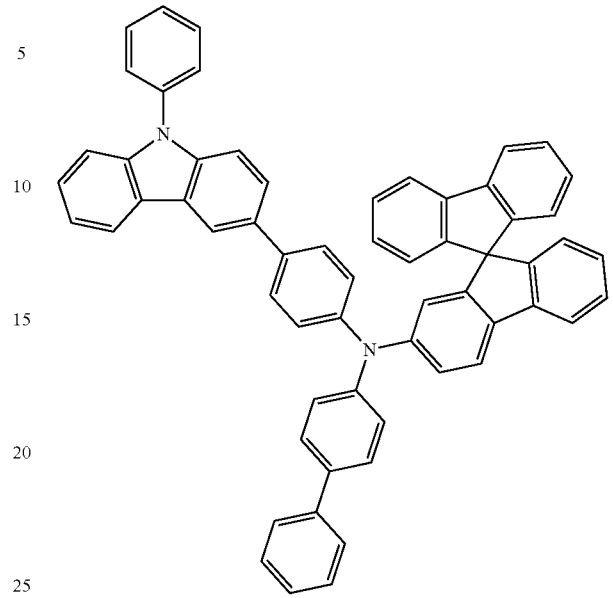
315
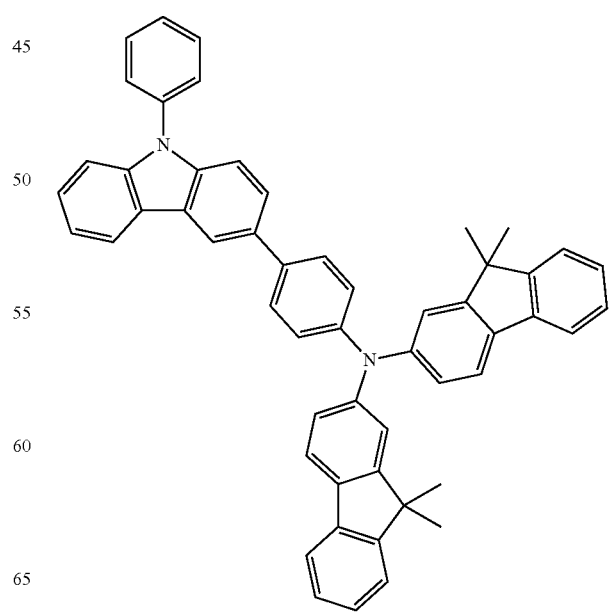

316

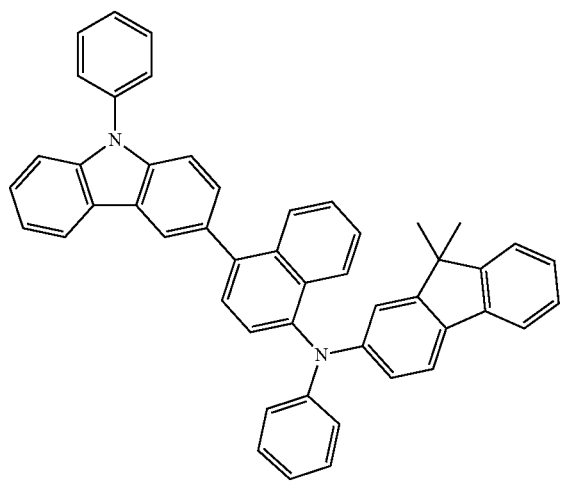

317

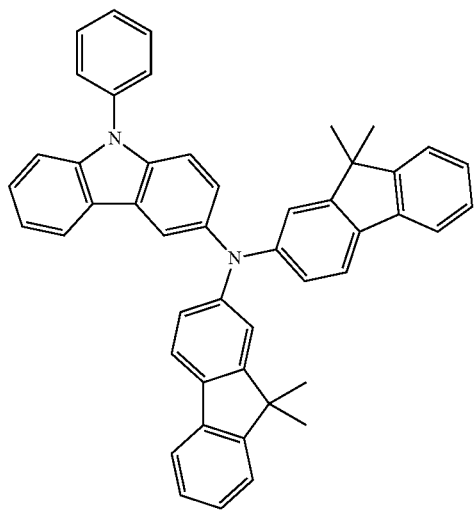

318

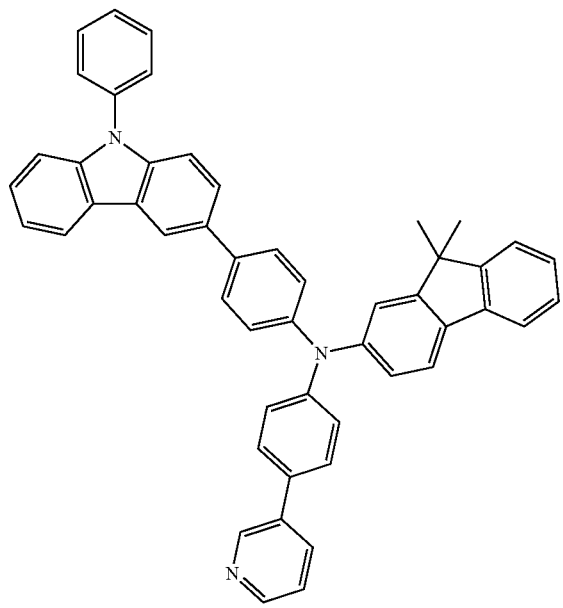

319

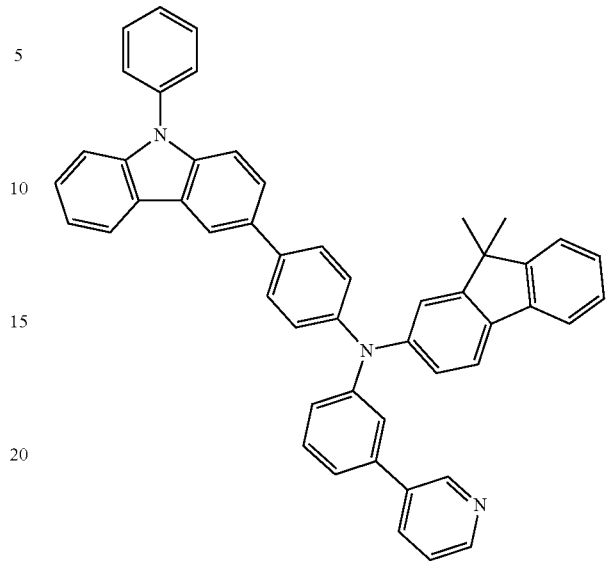

320

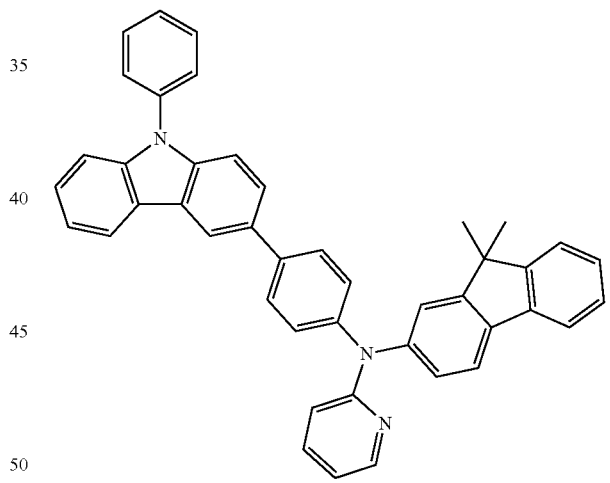

At least one of the HIL, HTL, and H-functional layer may further include a charge-generating material for improved layer conductivity, in addition to a known hole injecting material, hole transport material, and/or material having both hole injection and hole transport capabilities as described above.

The charge-generating material may be, for example, a p-dopant. The p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

<Compound 200>

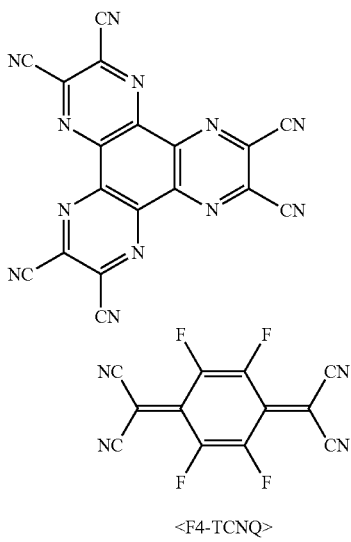

<F4-TCNQ>

When the hole injection layer, hole transport layer, or H-functional layer further includes a charge-generating material, the charge-generating material may be homogeneously dispersed or inhomogeneously distributed in the layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The butter layer may include any hole injecting material or hole transporting material that are widely known. In some other embodiments, the buffer layer may include the same material as one of the materials included in the HIL, HTL, and H-functional layer that underlie the buffer layer.

Then, an EML may be formed on the HTL, the H-functional layer, or the buffer layer by vacuum deposition, spin coating, casting, Langmuir-Blodgett (LB) deposition, or the like. When the EML is formed using vacuum deposition or spin coating, the deposition and coating conditions may be similar to those for the formation of the HIL, though the conditions for deposition and coating may vary depending on the material that is used to form the EML.

The EML may include an anthracene-based compound represented by Formula 1, below, and a condensed cyclic compound represented by Formula 20, below.

<Formula 1>

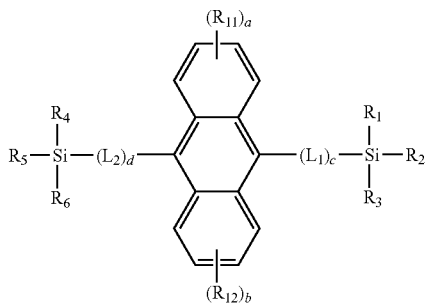

<Formula 20>

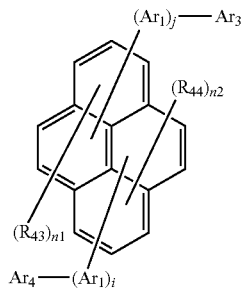

In an implementation, the anthracene-based compound may serve as a host, and the condensed cyclic compound may serve as a dopant. The condensed cyclic compound may also serve as a blue fluorescent dopant emitting blue light based on fluorescence mechanism. A weight ratio of the anthracene-based compound to the condensed cyclic compound in the emission layer may be from about 99.9:0.01 to about 80:20.

In Formula 1 above, n may be 0 or 1. If n is 0, the substituent —$Si(R_4)(R_5)(R_6)$ may not be in Formula 1.

In Formula 1, $R_1$ to $R_6$ may each independently be a substituted or unsubstituted $C_1$-$C_{60}$ alkyl group, a 3-membered to 10-membered substituted or unsubstituted non-condensed cyclic group, or a substituted or unsubstituted condensed cyclic group with condensed at least two rings, wherein at least one of $R_1$ to $R_3$ if n is 0, or at least one of $R_1$ to $R_6$ if n is 1 may be each independently a substituted or unsubstituted condensed cyclic group with at least two condensed rings.

As used herein, the terms "the 3-membered to 10-membered substituted or unsubstituted non-condensed cyclic group" refers to a 3-membered to 10-membered cyclic group with one ring unable to form a condensed ring. Ring-member atoms of "the 3-membered to 10-membered substituted or unsubstituted non-condensed cyclic group" may be selected from C, N, O, P, S, and Si. This will be understood with reference to Formulae 2A to 2T described below.

As used herein, the terms "substituted or unsubstituted condensed cyclic group with at least two condensed rings" refers to a group with at least two rings that are fused to each other. The "substituted or unsubstituted condensed cyclic group with at least two condensed rings" may be an aromatic or non-aromatic group, and may include 3 to 60 ring-member atoms, wherein these ring-member atoms may be selected from C, N, O, P, S, and Si. The "substituted or unsubstituted condensed cyclic group with at least two condensed rings" will be understood with reference to, for example, Formulae 3A to 3R and Formulae 4A to 4J described below.

In Formula 1, $R_1$ to $R_6$ may be each independently selected from
a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexcenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group; and a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$alkoxy group, a $C_3$-$C_{10}$cycloalkyl group, a $C_3$-$C_{10}$cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —N($Q_{11a}$)($Q_{12a}$) where $Q_{11a}$ and $Q_{12a}$ are each independently a hydrogen atom, a $C_1$-$C_{10}$ alkyl group, a $C_6$-$C_{20}$ aryl group, and a $C_2$-$C_{20}$ heteroaryl group.

In an implementation, at least one of $R_1$ to $R_3$, if n is 0, or at least one of $R_1$ to $R_6$, if n is 1, may be each independently selected from a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group; and a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$) where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group.

In an implementation, $R_1$ to $R_6$ in Formula 1 may be each independently selected from:

a methyl group, an ethyl group, a n-propyl group, a i-propyl group, a n-butyl group, a i-butyl group, a t-butyl group, a pentyl group, a hexyl group, a heptyl group, an octyl group, a nonyl group, and a decyl group;

a methyl group, an ethyl group, a n-propyl group, a i-propyl group, a n-butyl group, a i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —N($Q_{11a}$)($Q_{12a}$) where $Q_{11a}$ and $Q_{12a}$ are each independently, a hydrogen atom, a $C_1$-$C_{10}$ alkyl group, a $C_6$-$C_{20}$ aryl group, and a $C_2$-$C_{20}$ heteroaryl group;

groups represented by Formulae 2A to 2T; and groups represented by Formulae 3A to 3R.

In an implementation, at least one of $R_1$ to $R_3$, if n is 0, or at least one of $R_1$ to $R_6$, if n is 1, may be each independently selected from the groups represented by Formulae 3A to 3R below.

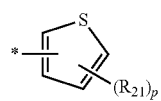

Formula 2A

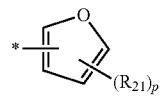

Formula 2B

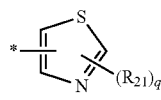

Formula 2C

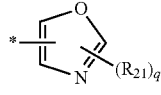

Formula 2D

-continued
Formula 2E
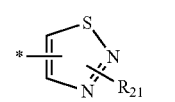
Formula 2F
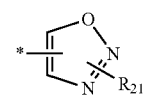
Formula 2G
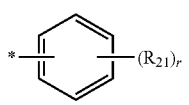
Formula 2H
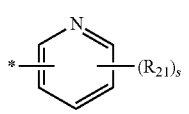
Formula 2I
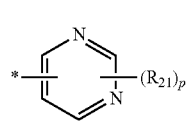
Formula 2J
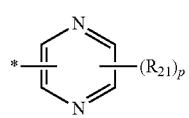
Formula 2K
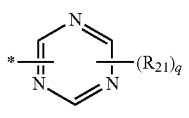
Formula 2L
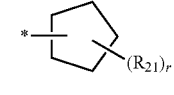
Formula 2M
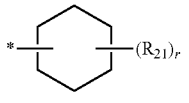
Formula 2N
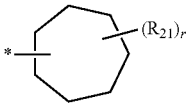
Formula 2O
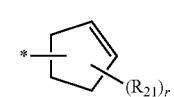
Formula 2P
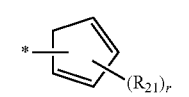
Formula 2Q
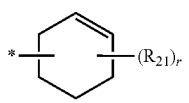
Formula 2R
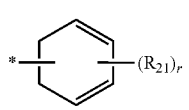
-continued
Formula 2S
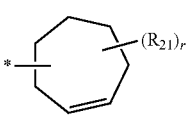
Formula 2T
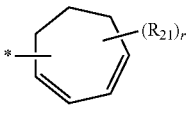
Formula 3A
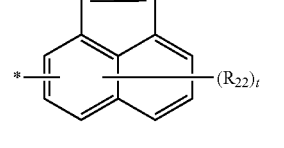
Formula 3B
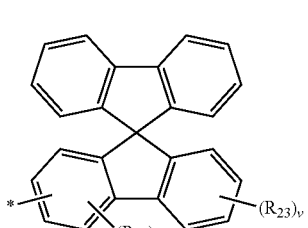
Formula 3C
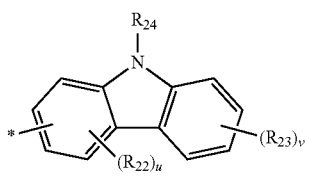
Formula 3D
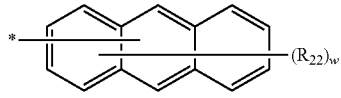
Formula 3E
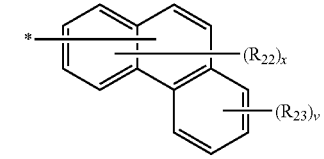
Formula 3F
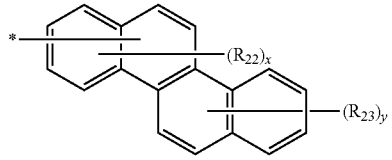
Formula 3G
Formula 3H -continued Formula 3I
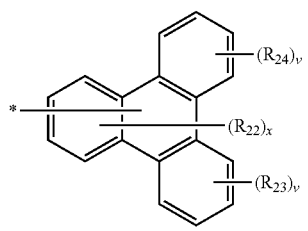

Formula 3J
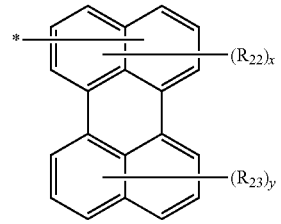

Formula 3K
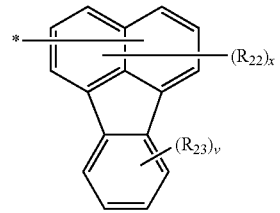

Formula 3L
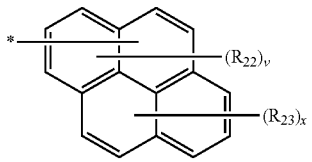

Formula 3M
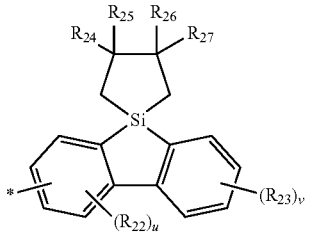

Formula 3N
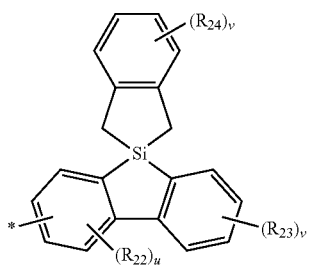

Formula 3O
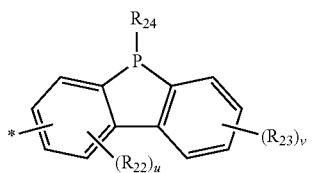

Formula 3P
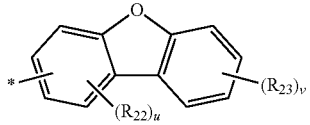

Formula 3Q
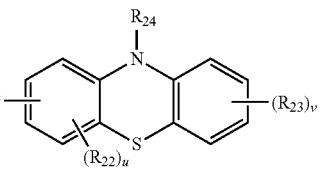

Formula 3R
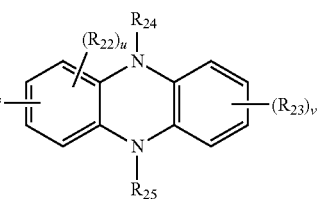

In Formulae 2A to 2T, and 3A to 3R, $R_{21}$ to $R_{27}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —$N(Q_{11a})(Q_{12a})$, where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group. p and u may be each independently an integer from 1 to 3; q may be 1 or 2; r and x may be each independently an integer from 1 to 5; s and v may be each independently an integer from 1 to 4; t may be an integer from 1 to 7; w may be an integer from 1 to 9; and y may be an integer from 1 to 6. In Formulae 2A to 2T and 3A to 3R, "*" may represent a binding site to a Si atom in Formula 1.

In an implementation, in Formulae 2A to 2T, and Formulae 3A to 3R, $R_{21}$ to $R_{27}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a dimethyl-fluorenyl group, a phenyl-carbazolyl group, a pyrenyl group, a chrysenyl group, a benzothiazolyl group, a benzooxazolyl group, a phenyl-benzoimidazolyl group, and —$N(Q_{11a})(Q_{12a})$, where $Q_{11a}$ and $Q_{12a}$ are each independently a hydrogen atom, a $C_1$-$C_{10}$ alkyl group, a phenyl group, a naphthyl group, or an anthracenyl group.

In an implementation, $R_1$ to $R_6$ in Formula 1 may be each independently selected from:
a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group;

a methyl group, an ethyl group, an n-propyl group, an i-propyl group, an n-butyl group, an i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a phenyl group, a naphthyl group, and an anthracenyl group;

a group represented by Formula 2G; and groups represented by Formulae 4A to 4J.

In an implementation, at least one of $R_1$ to $R_3$, if n is 0, or at least one of $R_1$ to $R_6$, if n is 1, may be each independently selected from the groups represented by Formulae 4A to 4J below.

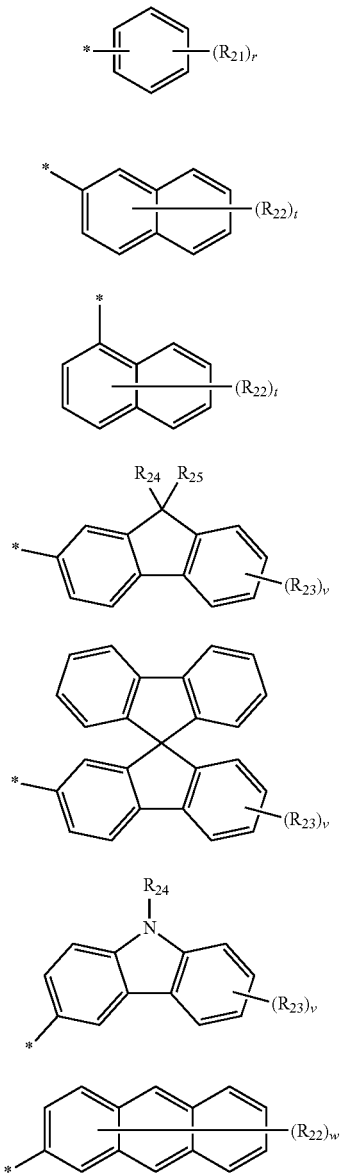

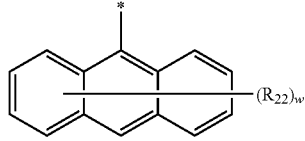

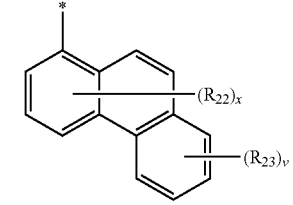

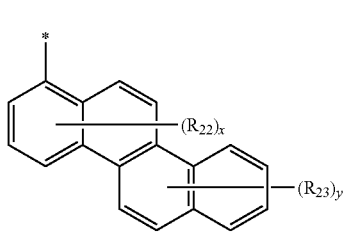

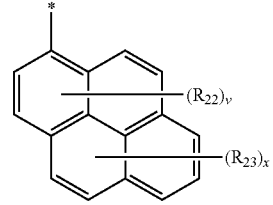

In an implementation, in Formula 2G and Formulae 4A to 4J, $R_{21}$ to $R_{25}$ may be each independently selected from a hydrogen atom, a deuterium atom, a halogen atom, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a dimethyl-fluorenyl group, a phenyl-carbazolyl group, a pyrenyl group, a crysenyl group, a benzothiazolyl group, a benzoxazolyl group, a phenyl-benzoimidazolyl group, and —N($Q_{11a}$)($Q_{12a}$), where $Q_{11a}$ and $Q_{12a}$ are each independently a hydrogen atom, a $C_1$-$C_{10}$ alkyl group, a phenyl group, a naphthyl group, or an anthracenyl group. r and x may be each independently an integer from 1 to 5; v may be an integer from 1 to 4; t may be an integer from 1 to 7; w may be an integer from 1 to 9; and y may be an integer from 1 to 6. In Formulae 2G and 4A to 4J, "*" may represent a binding site to an Si atom in Formula 1.

In Formulae 1 and 20, $L_1$, $L_2$, $Ar_1$, and $Ar_2$ may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group.

In an implementation, in Formulae 1 and 20, $L_1$, $L_2$, $Ar_1$, and $Ar_2$ may be each independently selected from:

a cyclopropylene group, a cyclobutylene group, a cyclopentylene group, a cyclohexylene group, a cycloheptylene group, a cyclooctylene group, a cyclopentenylene group, a cyclopentadienylen group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxatinylene group, and a phenanthridinylene group; and a cyclopropylene group, a cyclobutylene group, a cyclopentylene group, a cyclohexylene group, a cycloheptylene group, a cyclooctylene group, a cyclopentenylene group, a cyclopentadienylen group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxatinylene group, and a phenanthridinylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$), where $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group.

In an implementation, in Formulae 1 and 20, $L_1$, $L_2$, $Ar_1$, and $Ar_2$ may be each independently selected from the groups represented by Formulae 5A to 5J below.

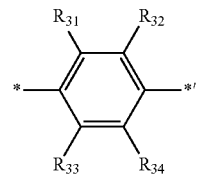

Formula 5A

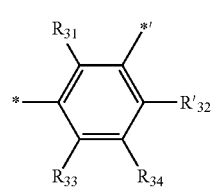

Formula 5B

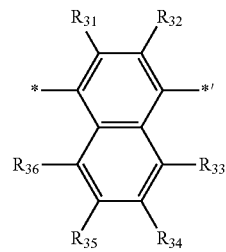

Formula 5C

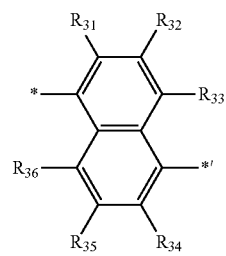

Formula 5D

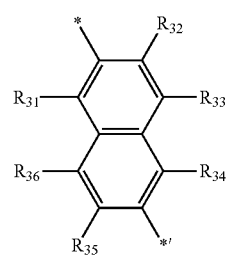

Formula 5E

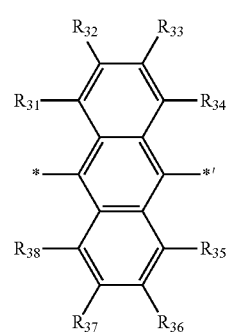

Formula 5F

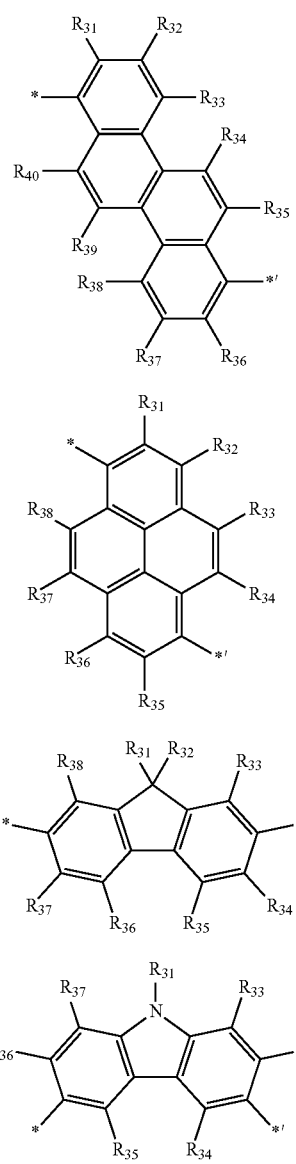

Formula 5G

Formula 5H

Formula 5I

Formula 5J

In Formulae 5A to 5J, $R_{31}$ to $R_{40}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$) where $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group. In Formulae 5A to 5J, "*" may indicate a binding site to Formula 1 and/or Formula 20, e.g., at an anthracene core in Formula 1.

In an implementation, in Formulae 5A to 5J, $R_{31}$ to $R_{40}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a dimethyl-fluorenyl group, a phenyl-carbazolyl group, a pyrenyl group, a chrysenyl group, a benzothiazolyl group, a benzooxazolyl group, and a phenyl-benzoimidazolyl group.

In Formula 1, c, which indicates the number of $L_1$s, may be an integer from 1 to 3. If c is 2 or greater, at least two $L_1$s may be the same or different. In Formula 1, d, which indicates the number of $L_2$s, may be an integer from 1 to 3. If d is 2 or greater, at least two $L_2$s may be the same or different. In Formula 1, c and d may both be an integer of 1.

In an implementation, in Formulae 1 and 20, $R_{11}$, $R_{12}$, $R_{43}$, and $R_{44}$ may be each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), and —Si($Q_3$)($Q_4$)($Q_5$), where $Q_1$ to $Q_5$ are each independently selected from a hydrogen atom, a $C_1$-$C_{10}$ alkyl group, a $C_6$-$C_{20}$ aryl group, and a $C_2$-$C_{20}$ heteroaryl group.

In an implementation, $R_{11}$, $R_{12}$, $R_{43}$, and $R_{44}$ in Formulae 1 and 20 may be each independently selected from a hydrogen atom, a deuterium atom, a halogen atom, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, and an anthracenyl group.

In an implementation, in Formulae 1 and 20, $R_{11}$, $R_{12}$, $R_{43}$, and $R_{44}$ may all be hydrogen atoms.

In Formula 1, n may be 1; $R_1$, $R_3$, $R_4$, and $R_6$ may be each independently a substituted or unsubstituted $C_1$-$C_{60}$ alkyl group; and $R_2$ and $R_5$ may be each independently selected from a 3-membered to 10-membered substituted or unsubstituted non-condensed cyclic group, and a substituted or unsubstituted condensed cyclic group with at least two condensed rings, wherein at least one of $R_3$ and $R_5$ may be a substituted or unsubstituted condensed cyclic group with at least two condensed rings.

In an implementation, in Formula 1, n may be 0; $R_1$ and $R_3$ may be each independently a substituted or unsubstituted $C_1$-$C_{60}$ alkyl group; and $R_2$ may be a substituted or unsubstituted condensed cyclic group with at least two condensed rings.

In an implementation, the anthracene-based compound of Formula 1 above may be one of Compounds 1 to 24 below.

1
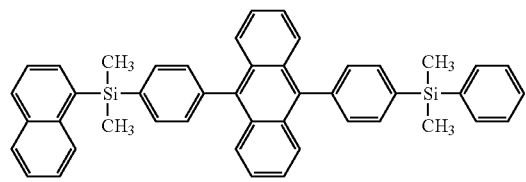
2
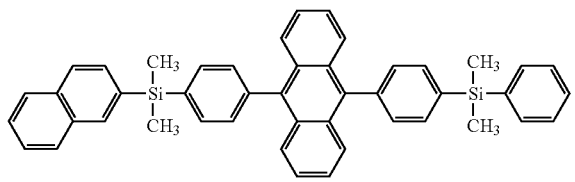
3
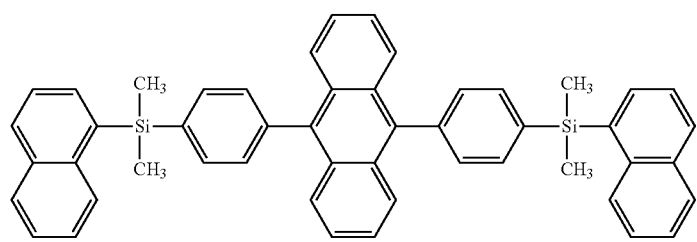
4
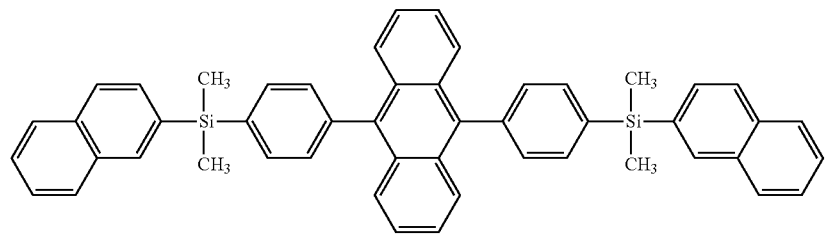
5
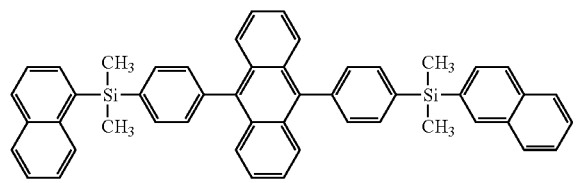
6
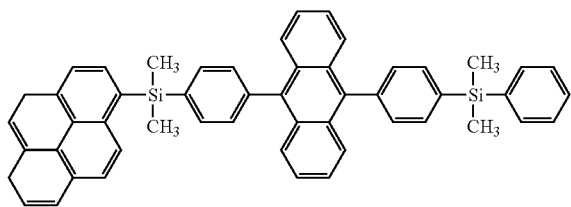
7
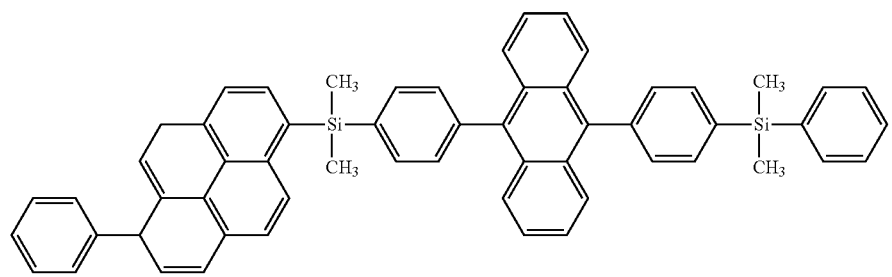
8
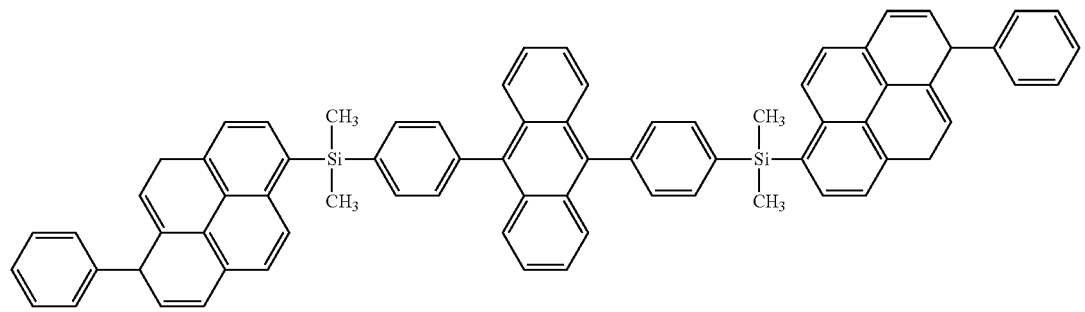

9
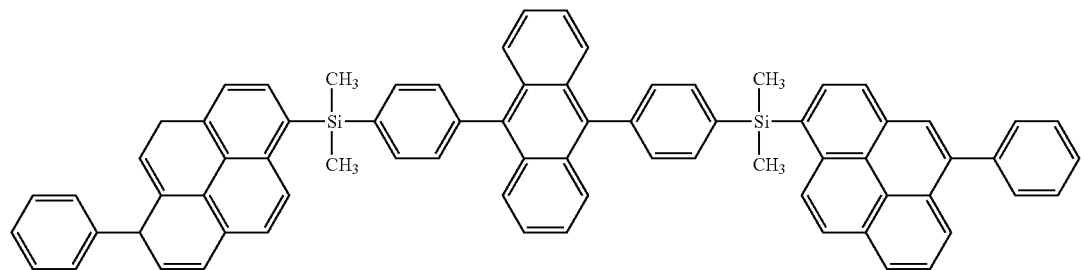
10
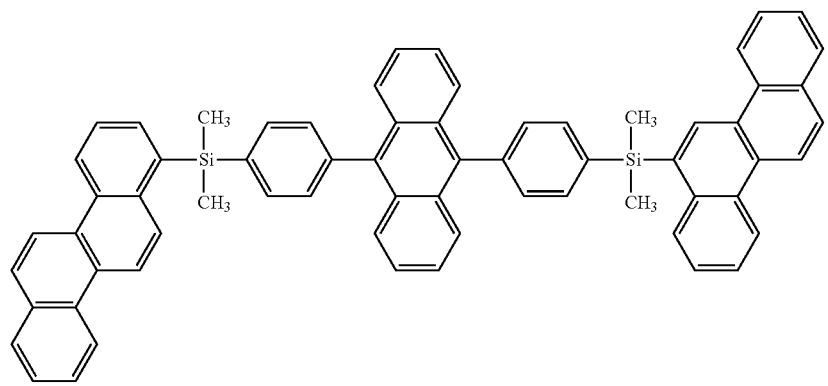
11
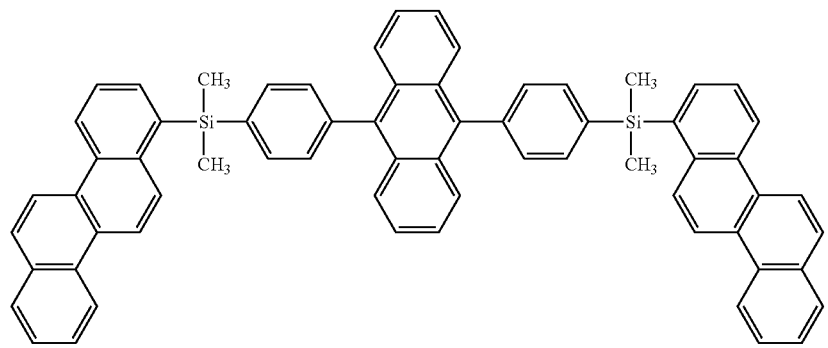
12
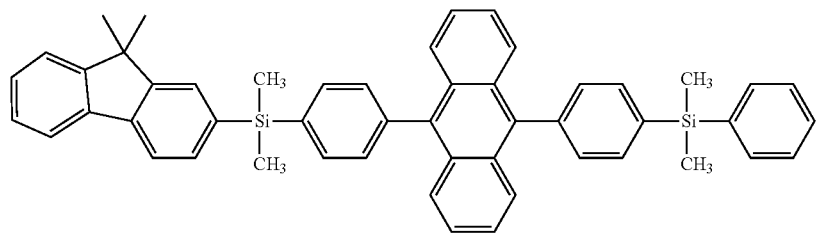
13
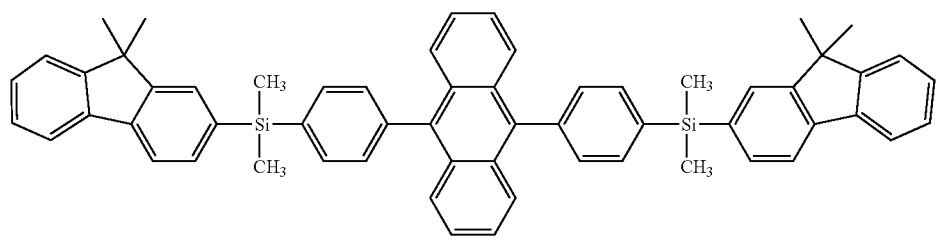

14
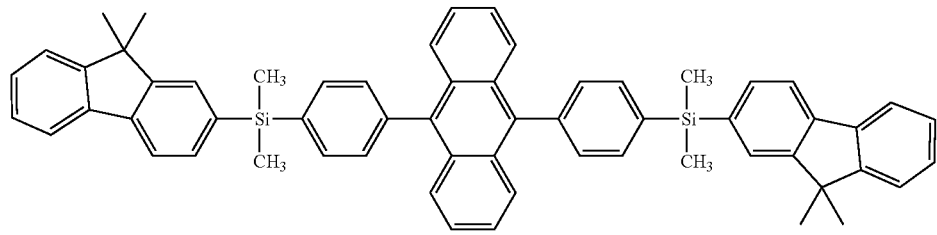
15
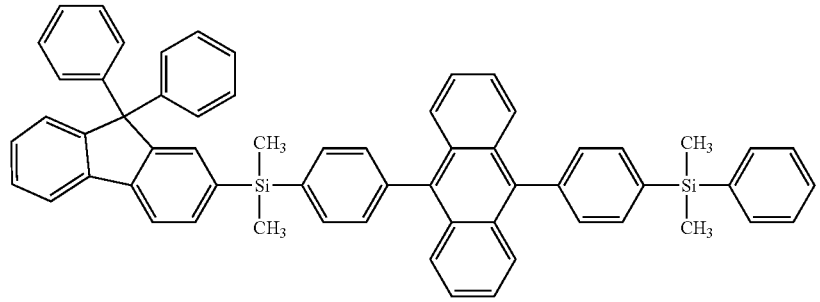
16
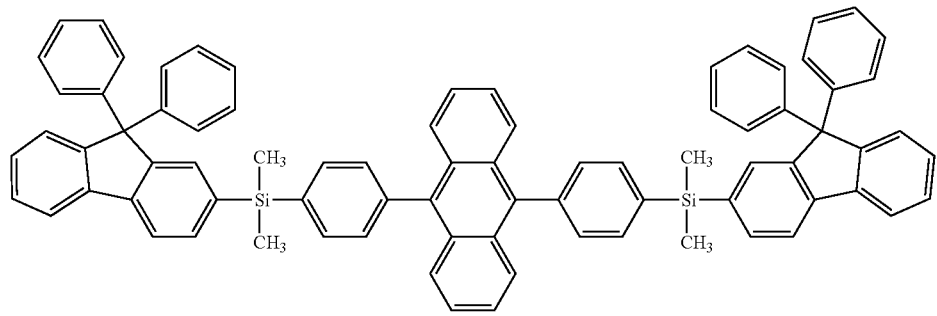
17
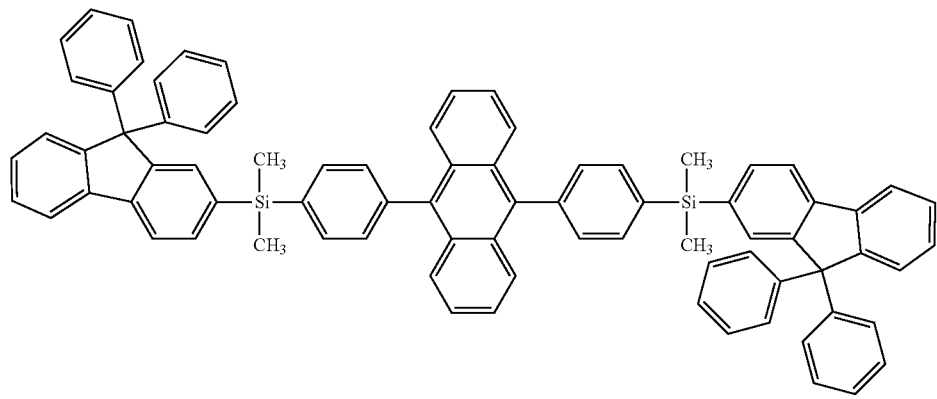
18
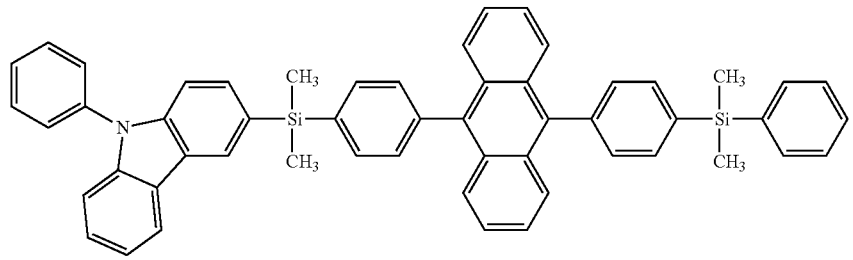

-continued
19
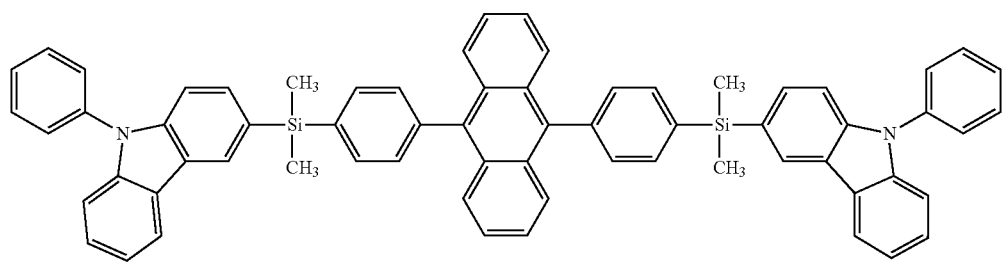
20
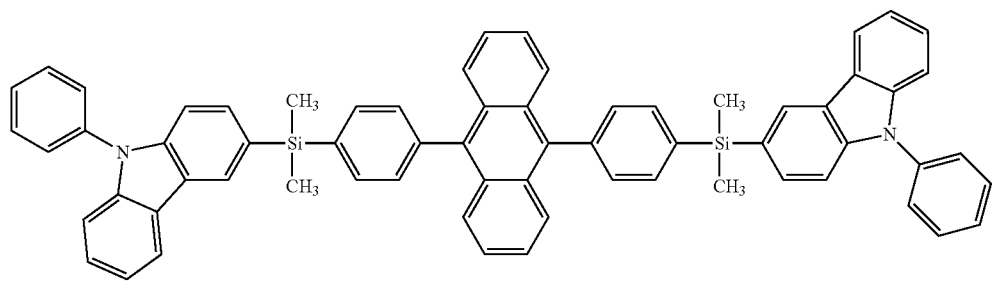
21
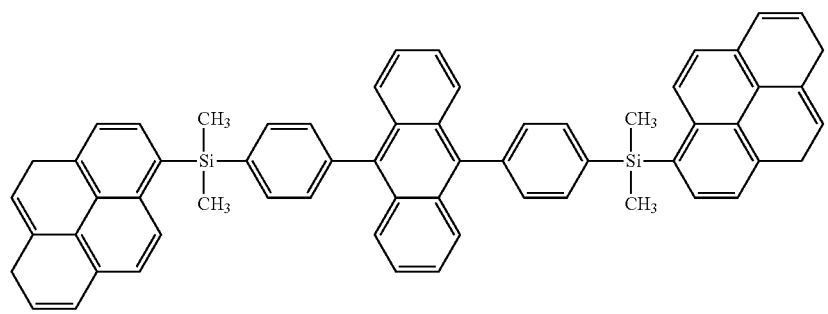
22
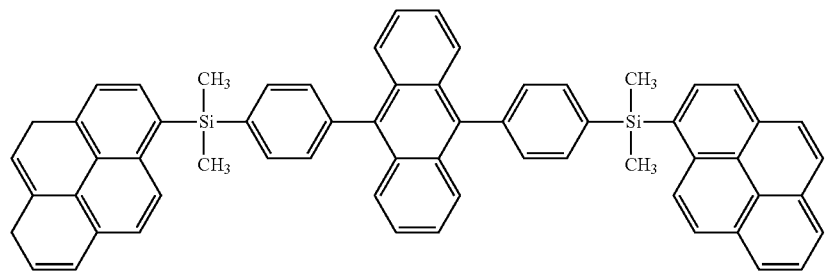
23
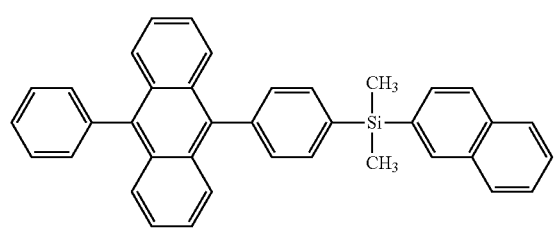
24
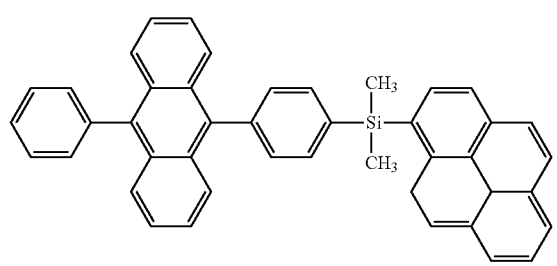

In Formula 1, i, which indicates the number of $Ar_1$s, may be an integer from 0 to 3. When i is 0, $Ar_3$ may be bonded directly to the core of Formula 20. When i is 2 or greater, at least two $Ar_1$ may be the same or different. In Formula 1, j, which indicates the number of $Ar_2$s, may be an integer from 0 to 3. When j is 0, $Ar_4$ may be bonded directly to the core of Formula 20. When j is 2 or greater, at least two $Ar_2$ may be the same or different.

In an implementation, in Formula 20, i=0 and j=0; i=1 and j=0; i=0 and j=1; or i=1 and j=1. For example, in Formula 20, i may be 0, and j may be 0.

In Formula 20, $Ar_3$ and $Ar_4$ may be each independently one of the groups represented by Formulae 7A to 7F below.

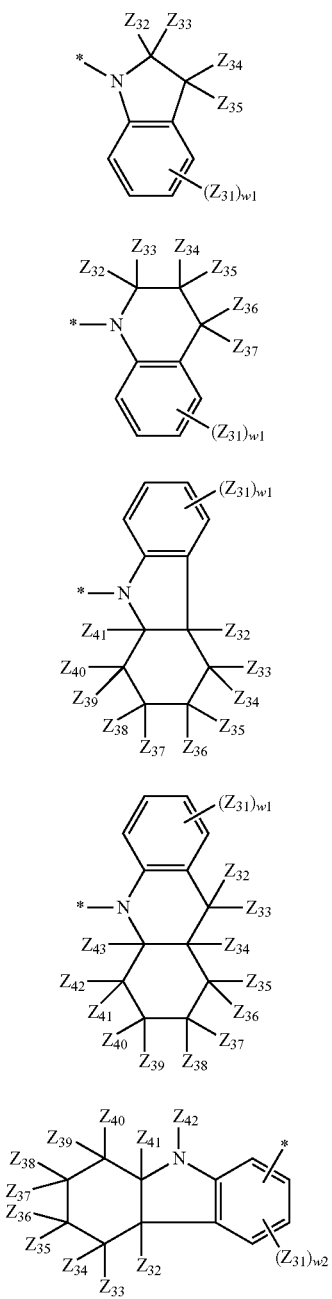

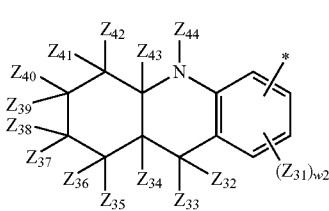

<Formula 7F>

In Formulae 7A to 7F:

$Z_{31}$ to $Z_{44}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_{51})(Q_{52})$, and —$Si(Q_{53})(Q_{54})(Q_{55})$, where $Q_{51}$ to $Q_{55}$ are each independently selected from a hydrogen atom, a $C_1$-$C_{10}$ alkyl group, a $C_6$-$C_{20}$ aryl group, and a $C_2$-$C_{20}$ heteroaryl group. In an implementation, at least two of $Z_{31}$ to $Z_{44}$ may be linked to each other to form a $C_6$-$C_{20}$ saturated or unsaturated ring.

w1 may be an integer from 1 to 4 and w2 may be an integer from 1 to 5. In Formulae 7A to 7F, "*" may represent a binding site with $Ar_1$, $Ar_2$, and/or a carbon atom in Formula 20.

In an implementation, in Formulae 7A to 7F, $Z_{31}$ to $Z_{44}$ may be each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a pentalenyl group, an indenyl group, a naphthyl group, an azulenyl group, an indacenyl group, an acenaphtyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenylene group, a benzothiophenyl group, a thiazolyl group, an isothiazolyl group, a benzothiazolyl group an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, and a $C_2$-$C_{60}$ heteroaryl group; or —Si($Q_{53}$)($Q_{54}$)($Q_{55}$), where $Q_{53}$ to $Q_{55}$ are each independently selected from a hydrogen atom, a $C_1$-$C_{10}$ alkyl group, a $C_6$-$C_{20}$ aryl group, and a $C_2$-$C_{20}$ heteroaryl group.

In an implementation, in Formulae 7A to 7F, $Z_{31}$ to $Z_{44}$ may be each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, and a triazinyl group; and —Si($Q_{53}$)($Q_{54}$)($Q_{55}$), where $Q_{53}$ to $Q_{55}$ are each independently selected from a hydrogen atom, a $C_1$-$C_{10}$ alkyl group, a phenyl group, a naphthyl group, an anthracenyl group, and a pyrenyl group.

In Formula 20, $Ar_3$ and $Ar_4$ may be each independently selected from the groups represented by Formulae 7A(1) to 7A(3), Formulae 7B(1) to 7B(3), Formulae 7C(1) to 7C(6), and Formulae 7D(1), 7D(2), 7E(1), and 7F(1) below.

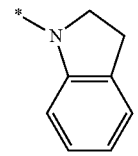

<Formula 7A(1)>

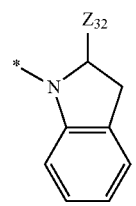

<Formula 7A(2)>

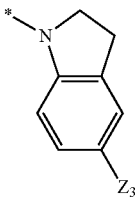

<Formula 7A(3)>

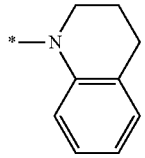

<Formula 7B(1)>

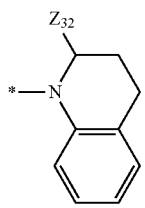

<Formula 7B(2)>

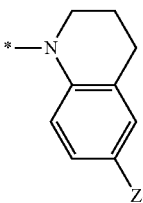

<Formula 7B(3)>

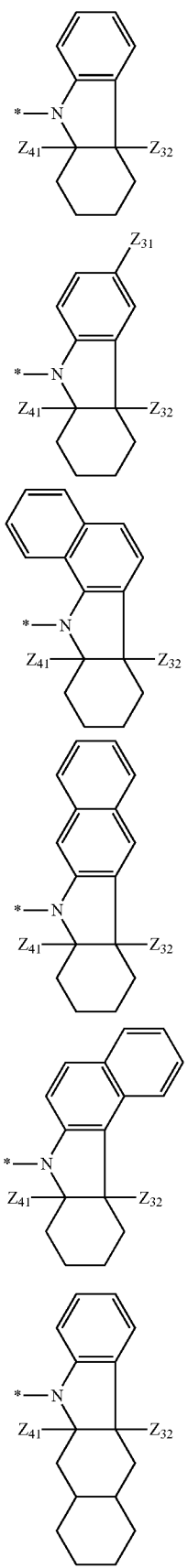

<Formula 7C(1)>

<Formula 7C(2)>

<Formula 7C(3)>

<Formula 7C(4)>

<Formula 7C(5)>

<Formula 7C(6)>

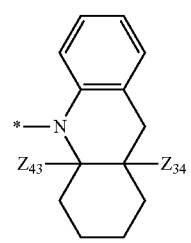

<Formula 7D(1)>

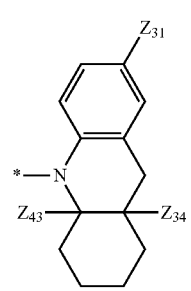

<Formula 7D(2)>

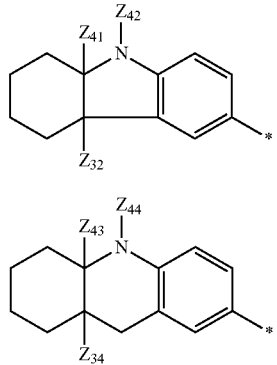

<Formula 7E(1)>

<Formula 7F(1)>

In Formulae 7A(1) to 7A(3), 7B(1) to 7B(3), 7C(1) to 7C(6), 7D(1), 7D(2), 7E(1), and 7F(1), $Z_{31}$, $Z_{32}$, $Z_{34}$, and $Z_{41}$ to $Z_{44}$ may be the same as defined above in the specification.

For example, in Formulae 7A(1) to 7A(3), 7B(1) to 7B(3), 7C(1) to 7C(6), 7D(1), 7D(2), 7E(1), and 7F(1), $Z_{31}$, $Z_{32}$, $Z_{34}$, and $Z_{41}$ to $Z_{44}$ may be each independently selected from:

a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, or a phosphoric acid group or a salt thereof;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, or a benzothiophenyl group;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, or a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, or a triazinyl group; or —Si($Q_{53}$)($Q_{54}$)($Q_{55}$), where $Q_{53}$ to $Q_{55}$ are each independently selected from a hydrogen atom, a $C_1$-$C_{10}$ alkyl group, a phenyl group, a naphthyl group, an anthracenyl group, and a pyrenyl group.

In Formula 20, $Ar_3$ and $Ar_4$ may be the same.

The condensed cyclic compound of Formula 20 above may a compound represented by one of Formula 20A, 20B, or 20C, below:

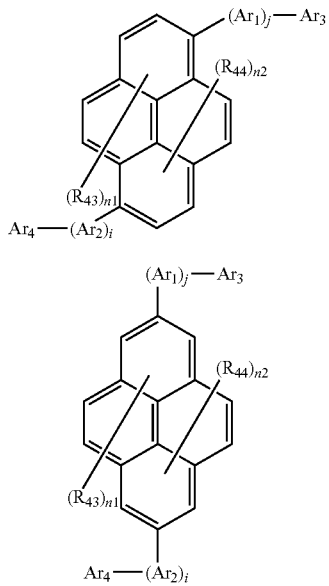

<Formula 20A>

<Formula 20B>

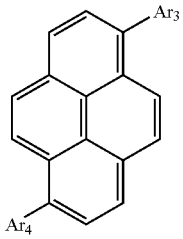

<Formula 20C>

In Formulae 20A to 20C, $Ar_1$ to $Ar_4$, i, j, n1, and n2 may be the same as defined above.

For example, in Formulae 20A to 20C:

$R_{43}$ and $R_{44}$ may be each independently selected from a hydrogen atom, a deuterium atom, a halogen atom, a hydroxyl group, a cyano group, a nitro group, an amino group, an amidino group, a hydrazine group, a hydrazine group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, and a chrysenyl group;

n1 and n2 may be each independently 1 or 2; and $Ar_3$ to $Ar_4$ may be each independently selected from the groups represented by Formulae 7A(1) to 7A(3), 7B(1) to 7B(3), 7C(1) to 7C(6), 7D(1), 7D(2), 7E(1), and 7F(1) above.

For example, the condensed cyclic compound of Formula 20 above may be a compound represented by Formula 20A(1), below.

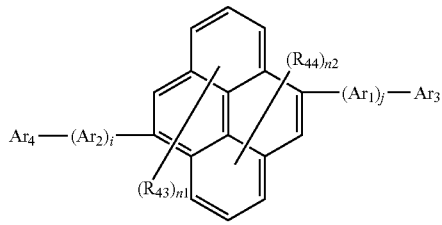

<Formula 20A(1)>

In Formula 20A(1), $Ar_3$ and $Ar_4$ may be the same as defined above.

In an implementation, the condensed cyclic compound of Formula 20 may be one of Compounds 25 to 68 below.

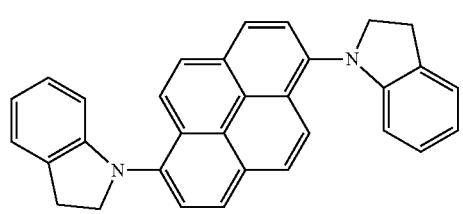

25

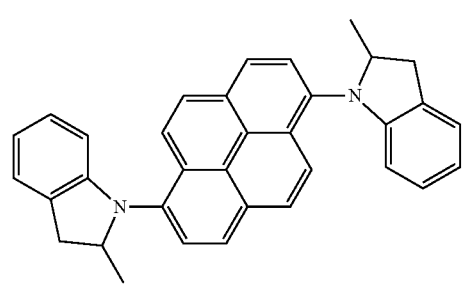

26

-continued
| 27 | 28 |
|---|---|
| 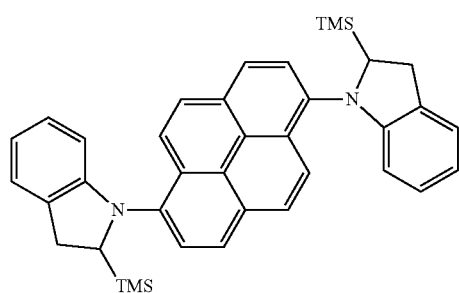 | 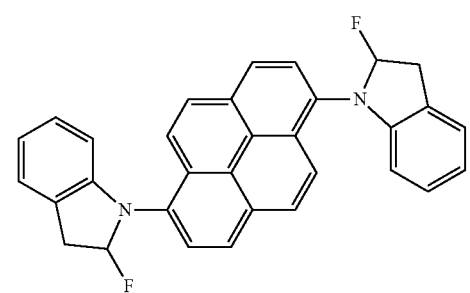 |
| 29 | 30 |
| 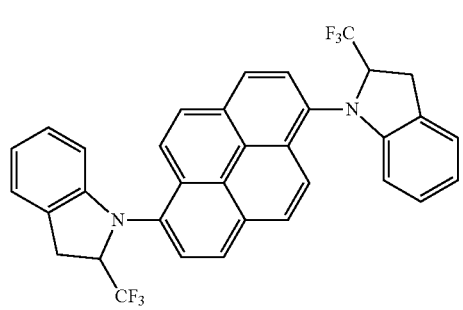 | 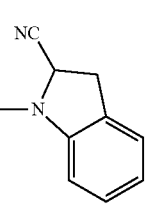 |
| 31 | 32 |
| 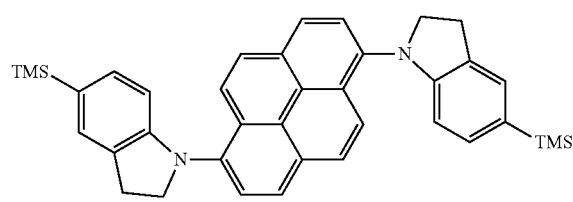 | 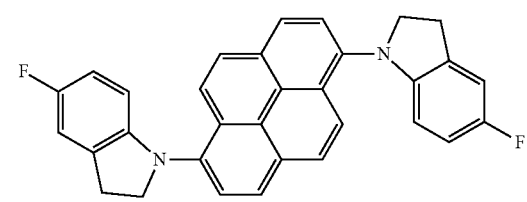 |
| 33 | 34 |
| 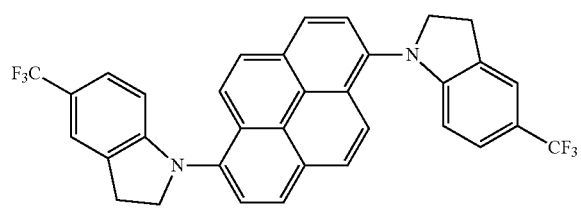 | 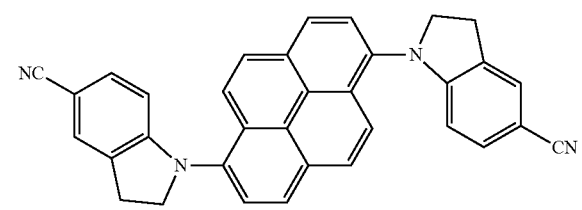 |
| 35 | 36 |
| 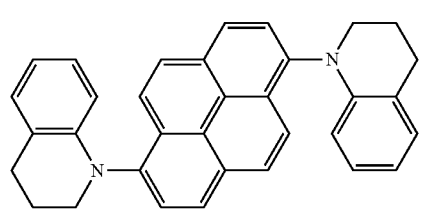 | 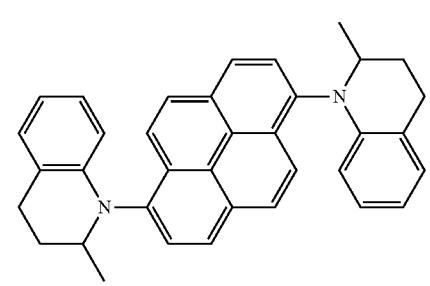 |
| 37 | 38 |
| 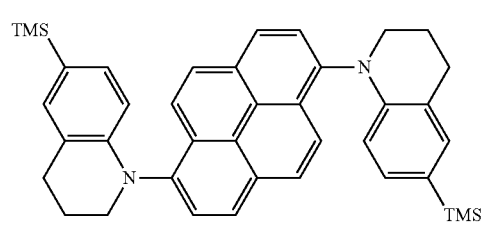 | 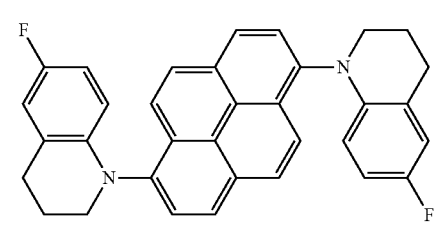 |

-continued
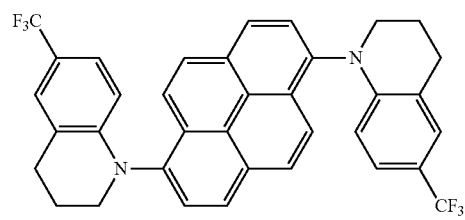
39
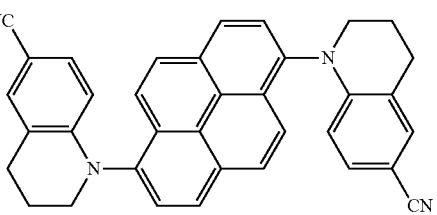
40
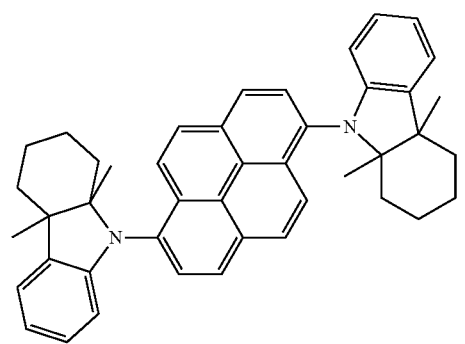
41
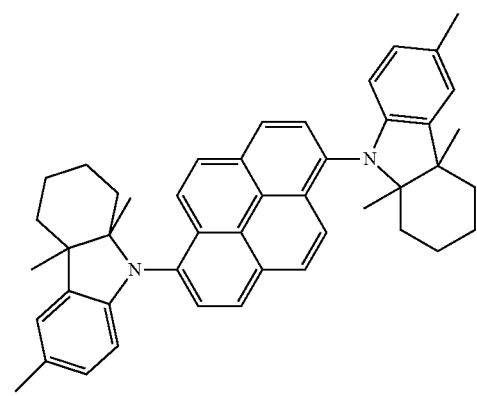
42
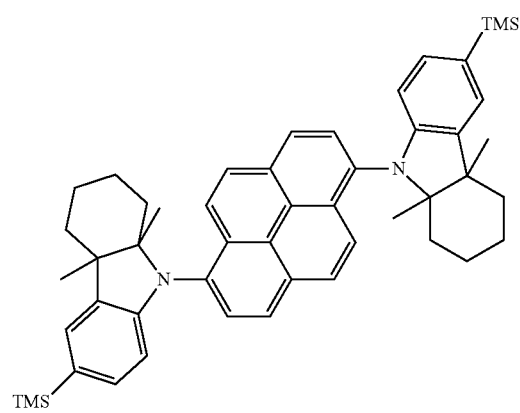
43
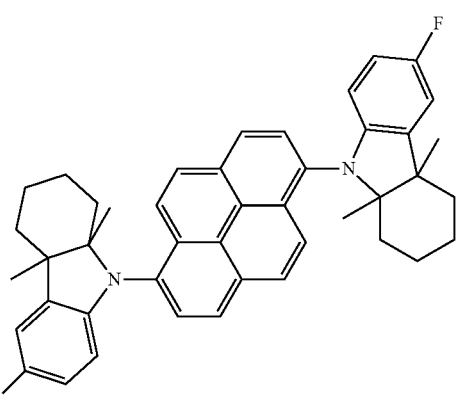
44
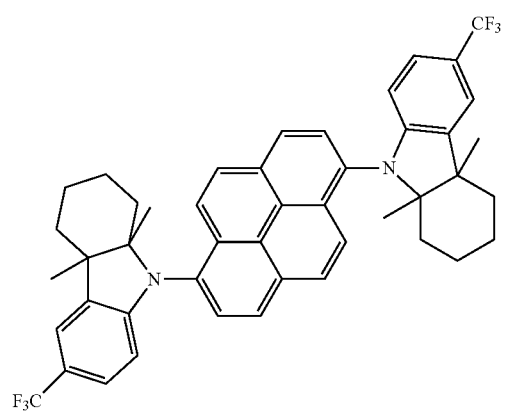
45
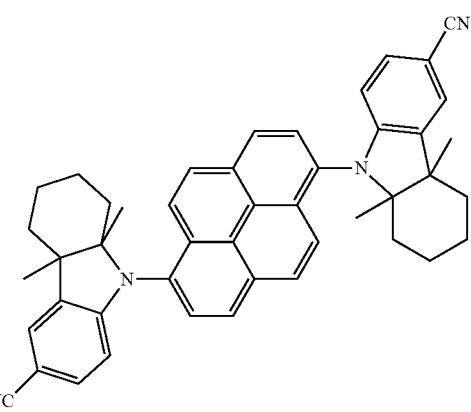
46

47
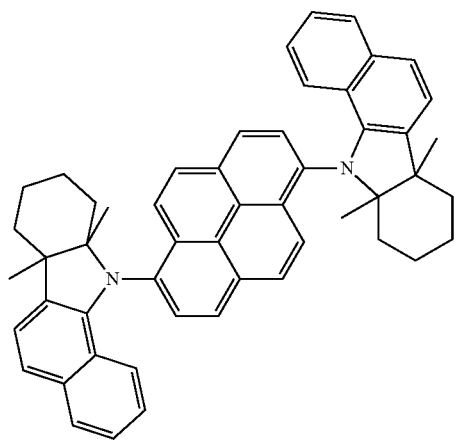
48
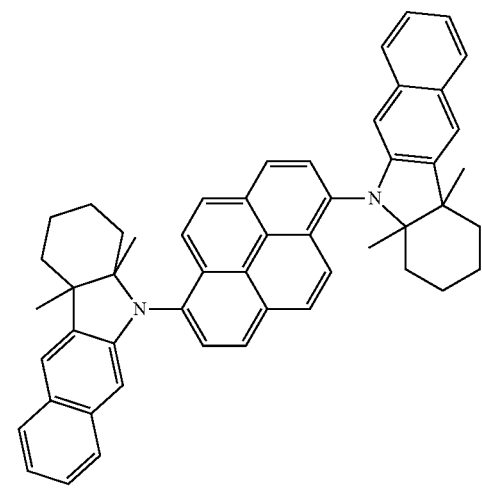
49
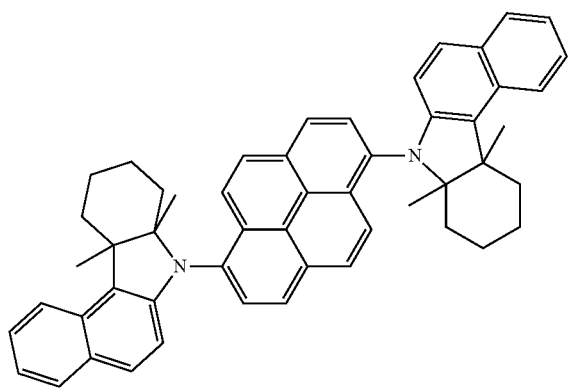
50
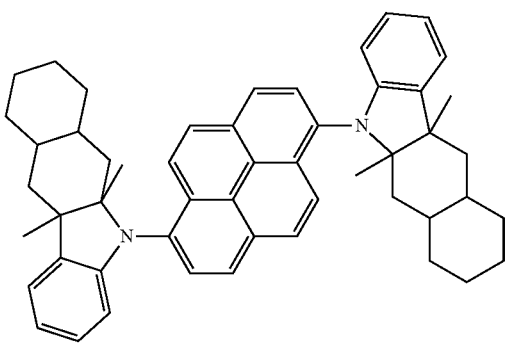
51
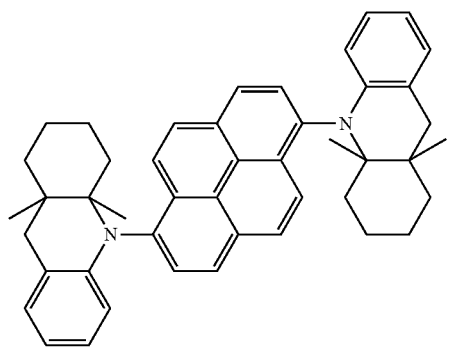
52
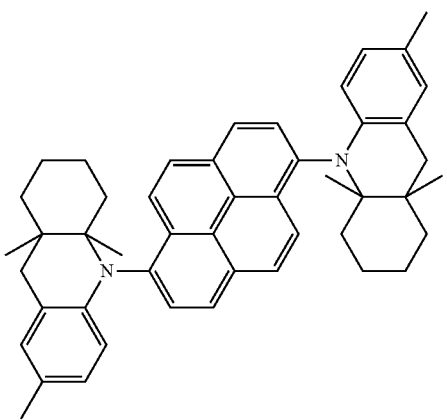

-continued
53
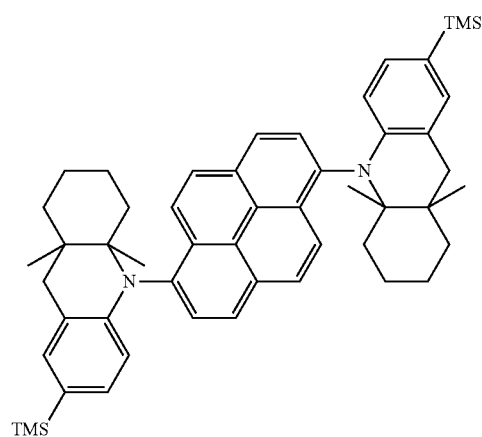
54
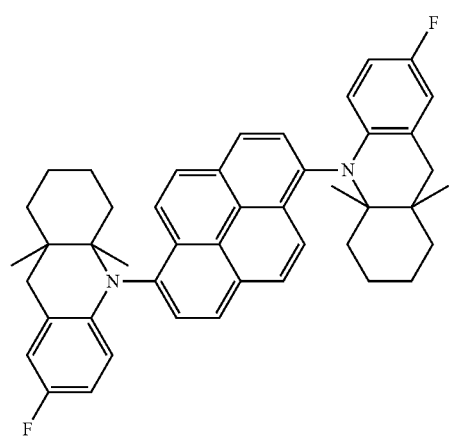
55
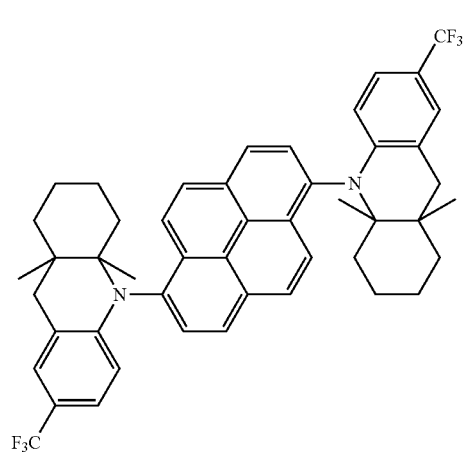
56
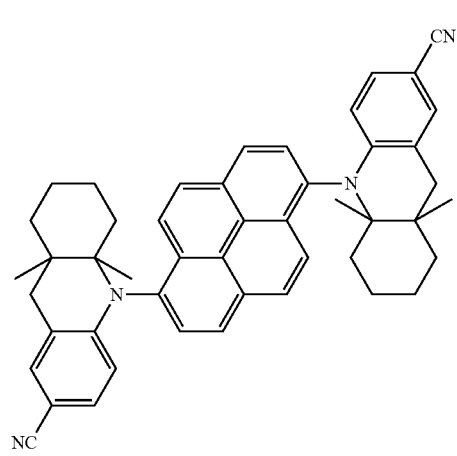
57
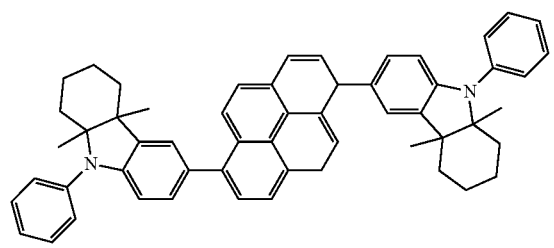
58
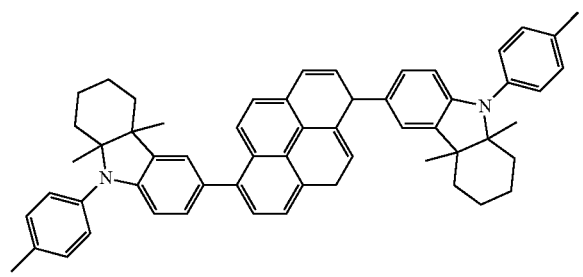
59
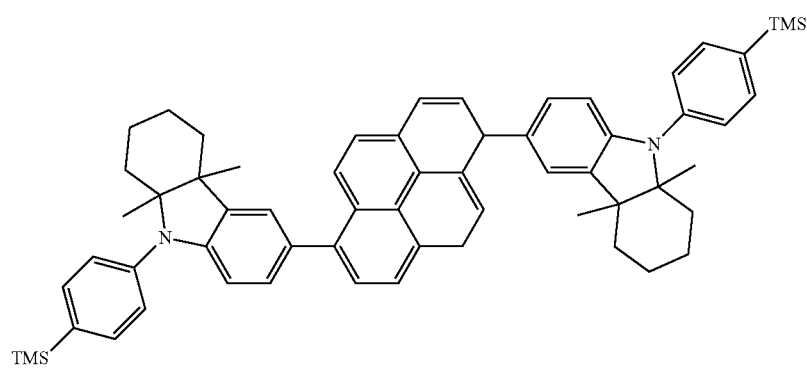

-continued
60
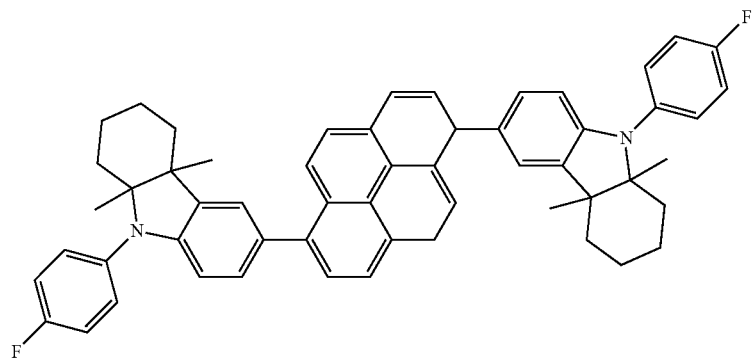
61
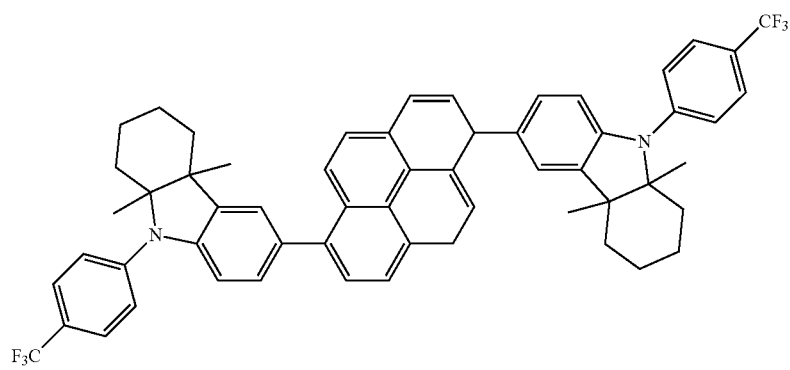
62
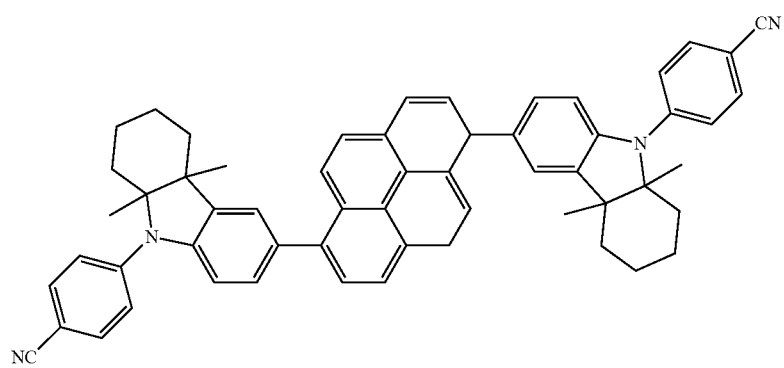
63 64
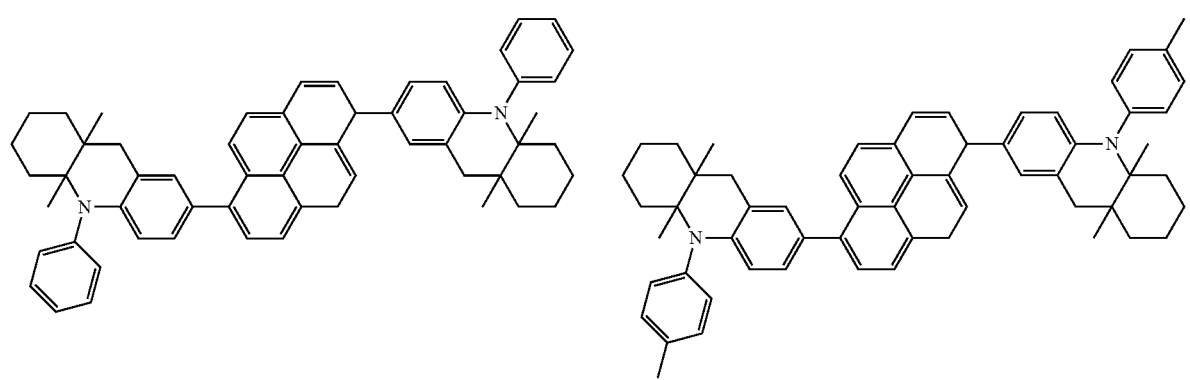

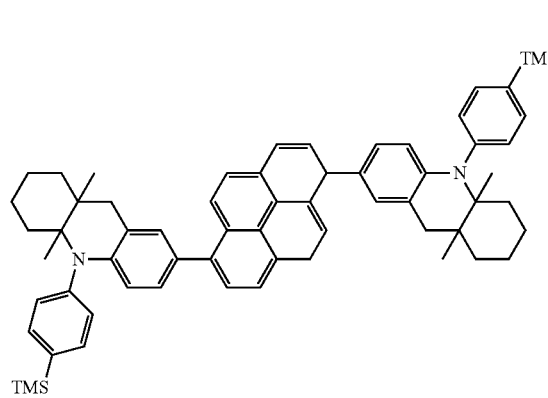

65

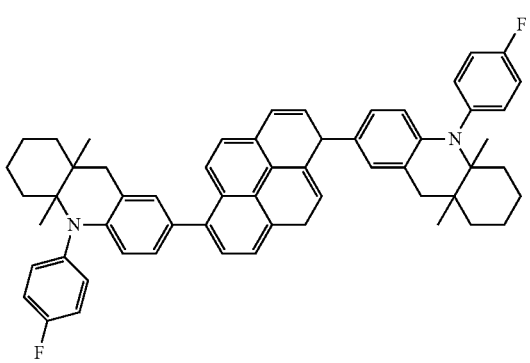

66

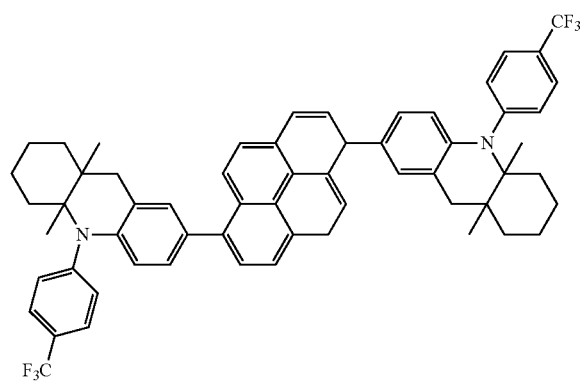

67

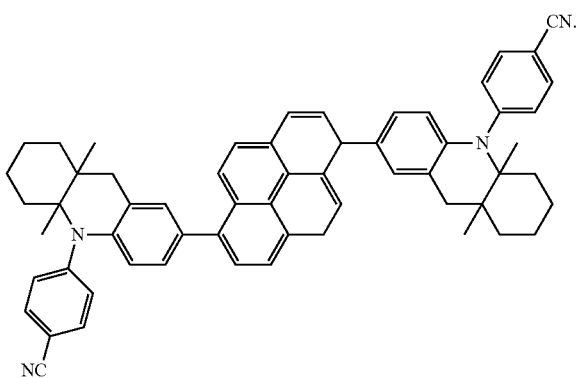

68

In an implementation, the EML may include an anthracene-based compound selected from Compounds 1 to 24, and a condensed cyclic compound selected from Compounds 25 to 68.

The anthracene-based compound represented by Formula 1 should include "a condensed cyclic group with at least two condensed substituted or unsubstituted rings" as a Si substituent, and thus may have a cascade structure with high light-emitting efficiency. Therefore, when the anthracene-based compound of Formula 1 above is used as a host in an emission layer of an organic light-emitting diode, the organic light-emitting diode may have a high efficiency and a long lifetime. When the anthracene-based compound of Formula 1 above is used as a host and the condensed cyclic compound of Formula 20 above is used as a dopant, these two compounds may have very high energy transfer efficiency, and thus may provide a high light-emitting efficiency and improve lifetime characteristics to an organic light-emitting diode when both of the compounds are used in the emission layer of the organic light-emitting diode.

When the organic light-emitting diode is a full color organic light-emitting diode, the emission layer may be patterned into a red emission layer, a green emission layer, and a blue emission layer. In an implementation, the emission layer may include at least two of the red emission layer, the green emission layer, and the blue emission layer that are stacked upon one another, and thus may emit white light. The blue emission layer may include a host and a dopant as described above.

At least one of the red emission layer and the green emission layer may include a dopant below (ppy=phenylpyridine).

Non-limiting examples of the red dopant may include compounds represented by the following formulae. For example, the red dopant may be DCM or DCJTB, which will be described later.

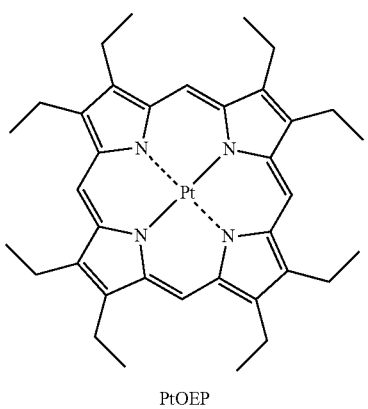

PtOEP

-continued
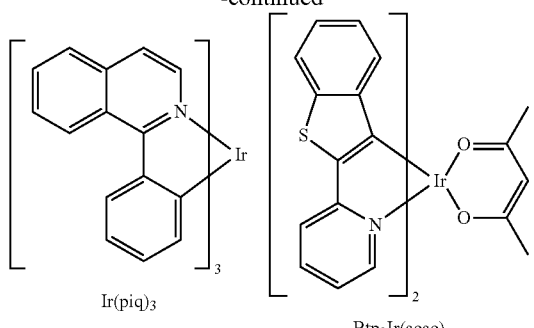
Ir(piq)₃
Btp₂Ir(acac)
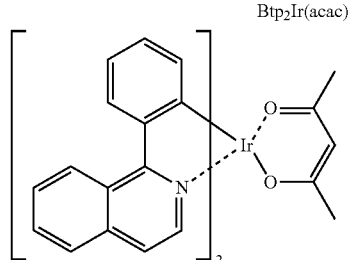
Ir(pq)₂(acac)
Ir(2-phq)₃
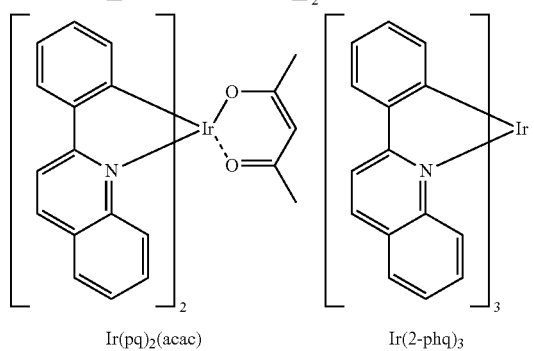
Ir(BT)₂(acac)
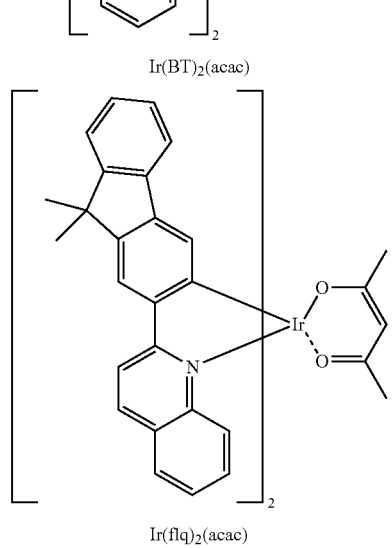
Ir(flq)₂(acac)
-continued
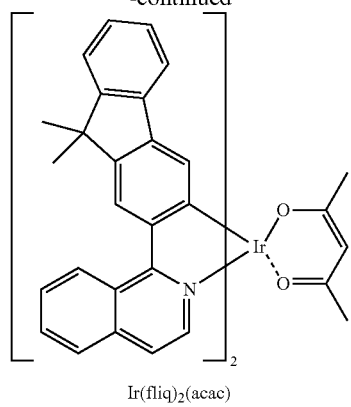
Ir(fliq)₂(acac)
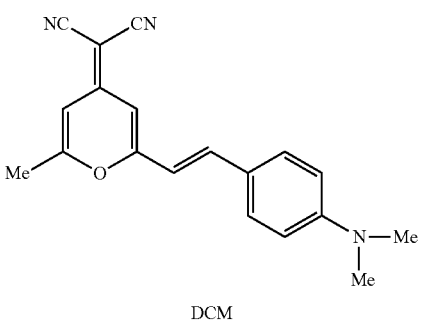
DCM
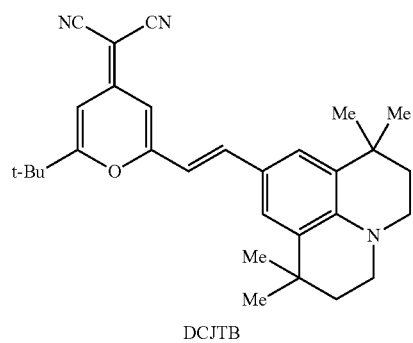
DCJTB
Non-limiting examples of the green dopant may include compounds represented by the following formulae. For example, the green dopant may be C545T represented below.
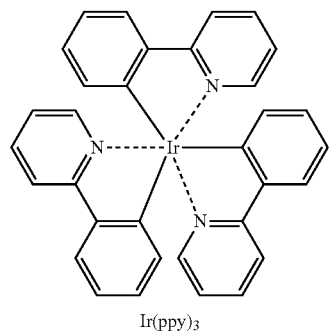
Ir(ppy)₃

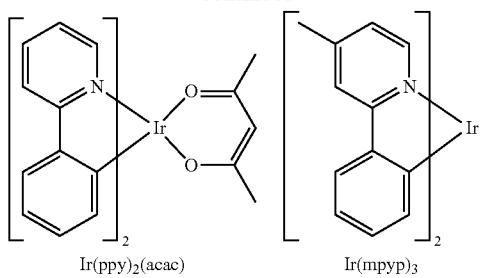

Ir(ppy)₂(acac)  Ir(mpyp)₃

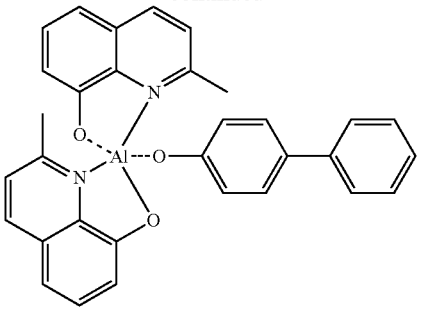

BAlq

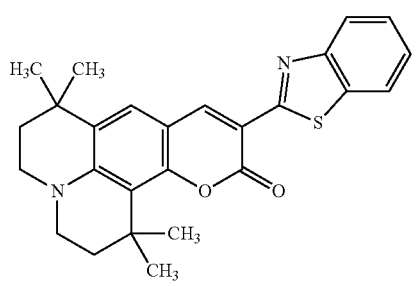

C545T

The thickness of the EML may be about 100 Å to about 1,000 Å, e.g., about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary depending on a compound that is used to form the ETL. A material for forming the ETL may be any known material that can stably transport electrons injected from an electron injecting electrode (cathode). Non-limiting examples of materials for forming the ETL are a quinoline derivative, such as tris(8-quinolinonate)aluminum (Alq₃), TAZ, BAlq, beryllium bis(benzoquinolin-10-olate (Bebq₂), 9,10-di(naphthalene-2-yl)anthracene (DNA), Compound 201, and Compound 202.

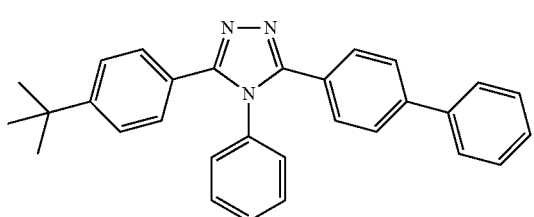

TAZ

<Compound 201>

<Compound 202>

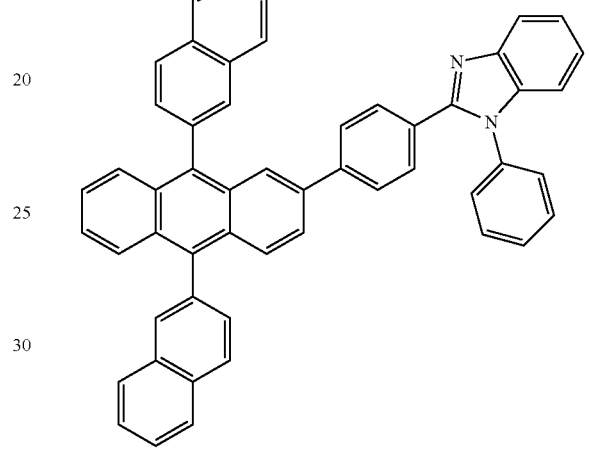

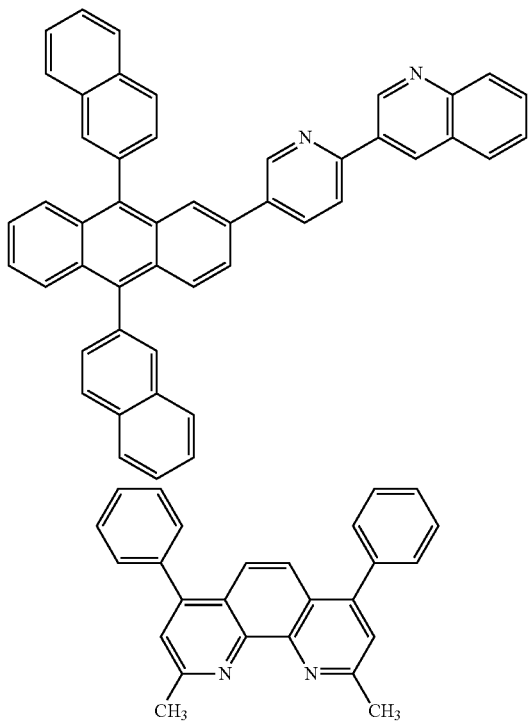

BCP

The thickness of the ETL may be from about 100 Å to about 1,000 Å, e.g., about 150 Å to about 500 Å. When the thickness of the ETL is within these ranges, the ETL may have satisfactory electron transporting ability without a substantial increase in driving voltage.

In an implementation, the ETL may further include a metal-containing material, in addition to a suitable electron-transporting organic compound.

The metal-containing material) may include a lithium (Li) complex. Non-limiting examples of the Li complex may include lithium quinolate (LiQ) and Compound 203 below:

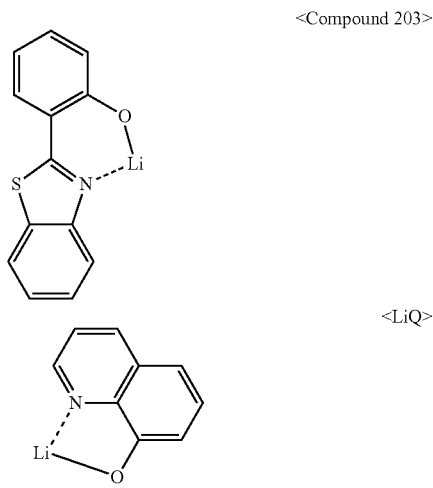

<Compound 203>

<LiQ>

Then, an EIL, which facilitates injection of electrons from the cathode, may be formed on the ETL. A suitable electron-injecting material may be used to form the EIL.

Non-limiting examples of materials for forming the EIL may include LiF, NaCl, CsF, Li$_2$O, and BaO. The deposition and coating conditions for forming the EIL 18 may be similar to those for the formation of the HIL, though the deposition and coating conditions may vary depending on the material that is used to form the EIL 18.

The thickness of the EIL may be from about 1 Å to about 100 Å, e.g., about 3 Å to about 90 Å. When the thickness of the EIL is within these ranges, the EIL may have satisfactory electron injection ability without a substantial increase in driving voltage.

The second electrode 17 may be disposed on the organic layer 15. The second electrode 17 may be a cathode that is an electron injection electrode. A material for forming the second electrode 17 may include, e.g., a metal, an alloy, an electro-conductive compound, which have a low work function, or a mixture thereof. In this regard, the second electrode 9 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In an implementation, to manufacture a top-emission light-emitting diode, the transmission electrode may be formed of indium tin oxide (ITO) or indium zinc oxide (IZO).

Although the organic light-emitting diode of FIG. 1 is described above, the embodiments are not limited thereto.

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to help reduce and/or prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. A suitable hole-blocking material may be used. Non-limiting examples of hole-blocking materials may include oxadiazole derivatives, triazole derivatives, and phenanthroline derivatives. For example, bathocuproine (BCP) represented by the following formula may be used as a material for forming the HBL.

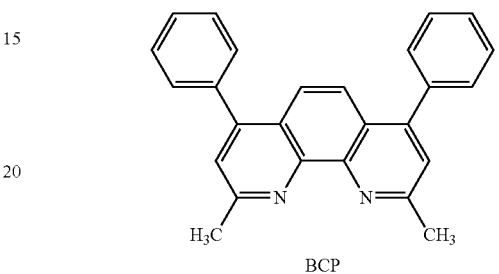

BCP

The thickness of the HBL may be from about 20 Å to about 1,000 Å, e.g., about 30 Å to about 300 Å. When the thickness of the HBL is within these ranges, the HBL may have improved hole blocking ability without a substantial increase in driving voltage.

As used herein, examples of the unsubstituted $C_1$-$C_{60}$ alkyl group (or a $C_1$-$C_{60}$ alkyl group) may include a linear or branched $C_1$-$C_{60}$ alkyl groups, including a methyl group, an ethyl group, a propyl group, an isobutyl group, a sec-butyl group, a pentyl group, an iso-amyl group, and a hexyl group. The substituted $C_1$-$C_{60}$ alkyl group refers to a $C_{60}$ alkyl group of which at least one hydrogen atom is substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_1$-$C_{60}$ fluoro alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, —N($Q_{11}$)($Q_{12}$), and —Si($Q_{13}$)($Q_{14}$)($Q_{15}$), where $Q_{11}$ to $Q_{15}$ are each independently selected from a hydrogen atom, a $C_1$-$C_{60}$ alkyl group, a $C_2$-$C_{60}$ alkenyl group, a $C_2$-$C_{60}$ alkynyl group, a $C_6$-$C_{60}$ aryl group, and a $C_2$-$C_{60}$ heteroaryl group.

As used herein, the description of $Q_{11}$ may be referred to as descriptions of $Q_{11a}$, $Q_{11b}$, and $Q_{11c}$, the description of $Q_{12}$ may be referred to as descriptions of $Q_{12a}$, $Q_{12b}$, and $Q_{12c}$, the description of $Q_{13}$ may be referred to as descriptions of $Q_{13a}$, $Q_{13b}$, $Q_{13c}$, the description of $Q_{14}$ may be referred to as descriptions of $Q_{14a}$, $Q_{14b}$, and $Q_{14c}$, and the description of $Q_{15}$ may be referred to as descriptions of $Q_{15a}$, $Q_{15b}$, and $Q_{15c}$.

The unsubstituted $C_1$-$C_{60}$ alkoxy group (or a $C_1$-$C_{60}$ alkoxy group) is a group represented by —OA, wherein A is an unsubstituted $C_1$-$C_{60}$ alkyl group as described above. Examples of the unsubstituted $C_1$-$C_{60}$ alkoxy group are a methoxy group, an ethoxy group, and an isopropyloxy group. At least one hydrogen atom in the alkoxy group may be substituted with those substituents described above in conjunction with the substituted $C_1$-$C_{60}$ alkyl group.

The unsubstituted $C_2$-$C_{60}$ alkenyl group (or a $C_2$-$C_{60}$ alkenyl group) is a $C_2$-$C_{60}$ alkyl group having at least one carbon-carbon triple bond in the center or at a terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described above in conjunction with the substituted $C_1$-$C_{60}$ alkyl group.

The unsubstituted $C_2$-$C_{60}$ alkynyl group (or a $C_2$-$C_{60}$ alkynyl group) is a $C_2$-$C_{60}$ alkyl group having at least one carbon-carbon triple bond in the center or at a terminal thereof. Examples of the unsubstituted $C_2$-$C_{60}$ alkynyl group (or a $C_2$-$C_{60}$ alkynyl group) are an ethenyl group, a propynyl group, and the like. At least one hydrogen atom in the alkynyl group may be substituted with those substituents described above in conjunction with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{60}$ alkyl group.

Examples of the substituted or unsubstituted $C_6$-$C_{60}$ aryl group may include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, an acenaphthylenyl group, a phenalenyl group, a fluorenyl group, an anthraquinolyl group, a methylanthracenyl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, an ovalenyl group, and a spiro-fluorenyl group. Examples of the substituted $C_6$-$C_{60}$ aryl group may be understood easily based on those of the unsubstituted $C_6$-$C_{60}$ aryl group and the substituted $C_1$-$C_{30}$ alkyl group described above. Examples of the substituted or unsubstituted $C_6$-$C_{60}$ arylene group may be understood easily based on those examples of the substituted or unsubstituted $C_6$-$C_{60}$ aryl group described above.

The unsubstituted $C_2$-$C_{60}$ heteroaryl group is a monovalent group having at least one aromatic ring having at least one of the heteroatoms selected from the group consisting of N, O, P, S, and Si. The unsubstituted $C_2$-$C_{60}$ heteroarylene group is a divalent group having at least one aromatic ring having at least one of the heteroatoms selected from N, O, P, S, and Si. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group may include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, a furanyl group, a thiophenyl group, a benzofuranyl group, a benzothiophenyl group, a dibenzofuranyl group, and a dibenzothiophenyl group. Examples of the substituted or unsubstituted $C_2$-$C_{60}$ heteroarylene group may be understood easily based on those examples of the substituted or unsubstituted $C_2$-$C_{60}$ arylene group described above.

The substituted or unsubstituted $C_6$-$C_{60}$ aryloxy group indicates —$OA_2$ (where $A_2$ is a substituted or unsubstituted $C_6$-$C_{60}$ aryl group described above). The substituted or unsubstituted $C_6$-$C_{60}$ arylthiol group indicates —$SA_3$ (where $A_3$ is a substituted or unsubstituted $C_6$-$C_{60}$ aryl group described above).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Example 1

Synthesis of Compound 2

<Synthesis of Compound 2-1>

[Reaction Scheme 2-1]

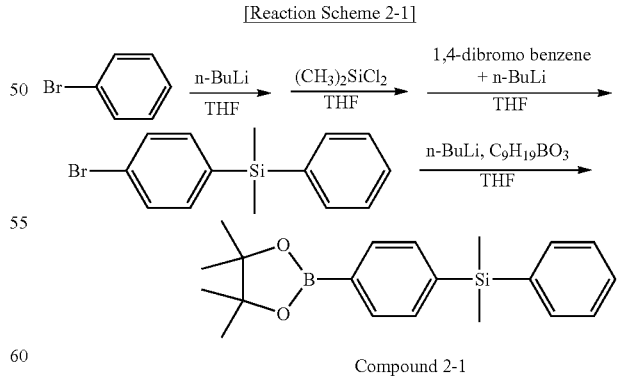

Compound 2-1

After 12 g (58.25 mmol) of 1-bromobenzene was dissolved in 200 ml of THF in a 500-ml 3-necked round flask (flask 1) in a nitrogen atmosphere, 23.65 ml (58.25 mmol) of 2.5M n-BuLi was slowly dropped into the solution at −78° C. and stirred for about 20 minutes while the temperature was maintained. Afterward, 6.93 g (54.17 mmol) of dimethyldichlorosilane was very slowly dropwise added into the mixture at −80° C. or less, and the temperature was slowly increased to about −10° C. or less, at which the mixture was further stirred for about 2 hours. After 18.97 g (80.39 mmol) of 1,4-dibromobenzene was dissolved in 200 ml of THF in a 250-ml 3-necked round flask (flask 2) in a nitrogen atmosphere, 32.63 ml (80.39 mmol) of n-BuLi was slowly dropped into the solution at −78° C. and stirred for about 20 minutes while the temperature was maintained. While the temperatures of the reaction products in flasks 1 and 2 were maintained at about −78° C., the reaction product in flask 2 was taken using a syringe, dropwise added into flask 1, and then stirred for about 12 hours. After termination of the reaction using water, the reaction product was extracted using chloroform, loaded on a silica gel column equipped with hexane eluent, and then recrystallized using hexane to obtain (4-bromo-phenyl)-dimethyl-phenyl-1-yl-silane. After (4-bromo-phenyl)-dimethyl-phenyl-1-yl-silane and 250 ml of THF were put in a 500-ml 3-necked round flask, 14.21 ml (35 mmol) of 2.5M n-BuLi was slowly dropped into the solution at −78° C. and stirred for about 40 minutes while the temperature was maintained. Afterward, 6.55 g (35 mmol) of 2-isopropoxy-4,4,5,5,-tetramethyl-1,3, 2-dioxaborane was slowly added into the mixture at −78° C. or less and stirred for about 30 minutes, and then further stirred for about 12 hours after the temperature was slowly increased. After termination of the reaction with 10% HCl, the reaction product was extracted using ethyl acetate. An extracted organic layer was collected, loaded on a silica gel column equipped with hexane eluent, and then recrystallized using ethyl acetate and hexane to obtain a white solid Compound 2-1 (3.94 g, 12.65 mmol, Yield: 20%).

1H NMR (300 MHz, 3) δ: 7.85 (2H), 7.55 (1H), 7.46 (4H), 7.37 (2H), 1.24 (12H), 0.66 (6H)

<Synthesis of Compound 2-2>

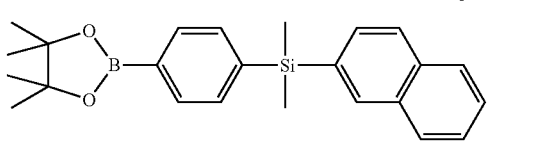

Compound 2-2

Compound 2-2 was synthesized in the same manner as in the synthesis of Compound 2-1, except that 2-bromonaphthalene, instead of 1-bromobenzene, was used (white solid, Yield: 22%).

1H NMR (300 MHz, 3) δ: 8.10 (1H), 8.00 (2H), 7.95 (1H), 7.85 (2H), 7.60 (1H), 7.59 (2H), 7.46 (2H), 1.24 (12H), 0.66 (6H)

<Synthesis of Compound 2>

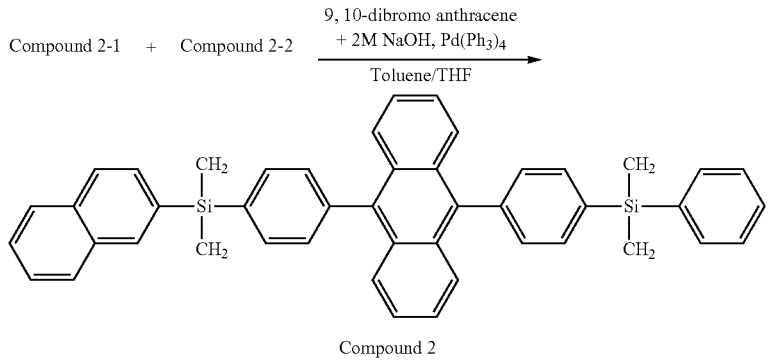

Compound 2

After 5 g (14.79 mmol) of Compound 201, 5.74 g (14.79 mmol) of Compound 202, and 4.28 g (12.86 mmol) of 9,10-dibromoanthracene were added to 300 ml of toluene in a 250-ml 3-necked flask with an addition of 100 ml of 2M NaOH, and reacted for about 30 minutes for nitrogen substitution, a catalytic amount of tetrakis(triphenylphosphine) palladium(0) was added thereto and reacted at about 100° C. for about 36 hours. After termination of the reaction with HCl, the reaction product was filtered, washed several times with acetone, and then dried. The resulting product was subjected to Soxhlet extraction with toluene to obtain Compound 2 (white solid, 4.10 g, 6.36 mmol, Yield: 43%)

1H NMR (300 MHz, 3) δ: 8.10 (1H), 8.00 (2H), 7.95 (1H), 7.91 (4H), 7.89 (4H), 7.60 (1H), 7.59 (2H), 7.55 (1H), 7.52 (4H), 7.46 (2H), 7.39 (4H), 7.37 (2H), 0.66 (12H).

HRMS (FAB): calcd for C46H36Si2: 644.24. found: 644.95.

Synthesis Example 2

Synthesis of Compound 6

<Synthesis of Compound 6-1>

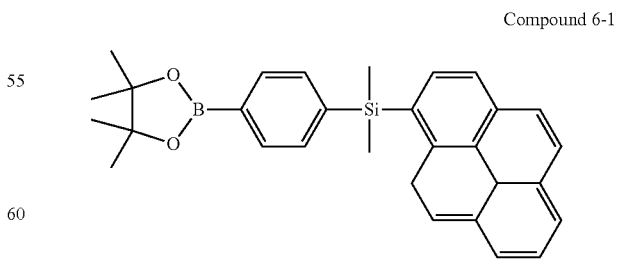

Compound 6-1

Compound 6-1 was synthesized in the same manner as in the synthesis of Compound 2-1, except that 1-bromopyrene, instead of 1-bromobenzene, was used (white solid, Yield: 20%).

1H NMR (300 MHz, 3) δ: 7.91 (1H), 7.85 (1H), 7.81 (1H), 7.46 (2H), 7.17 (1H), 7.10 (1H), 6.58 (1H), 6.44 (1H), 6.19 (1H), 6.00 (1H), 1.24 (12H), 0.66 (6H).

<Synthesis of Compound 6>

Compound 6

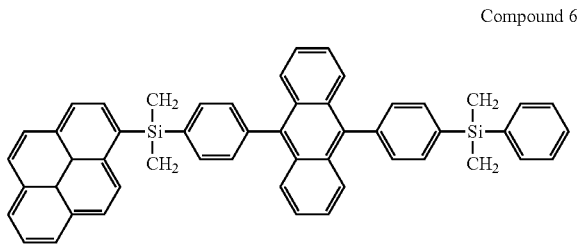 [SMILES: C[Si](C)(C1=CC=C2C=CC3=CC=CC4=CC=C1C2C34)c1ccc(-c2c3ccccc3c(-c3ccc([Si](C)(C)c4ccccc4)cc3)c3ccccc23)cc1]

Compound 6 was synthesized in the same manner as in the synthesis of Compound 2, except that Compound 6-1, instead of Compound 2-2, was used (Yield: 41%).

1H NMR (300 MHz, 3) δ: 7.98 (9H), 7.91 (41-1), 7.89 (2H), 7.79 (2H), 7.55 (1H), 7.52 (2H), 7.46 (2H), 7.39 (4H), 7.37 (2H), 7.24 (2H), 4.82 (2H), 0.66 (12H).

HRMS (FAB): calcd for C52H40Si2: 720.27. found: 721.04.

Synthesis Example 3

Synthesis of Compound 13

<Synthesis of Compound 13-1>

Compound 13-1

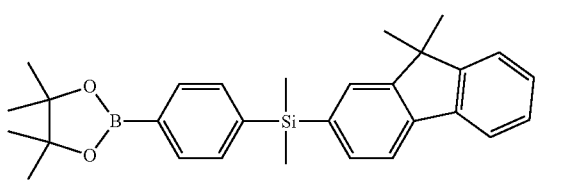

Compound 13-1 was synthesized in the same manner as in the synthesis of Compound 2-1, except that 2-bromo-(9,9'-dimethyl)fluorene, instead of 1-bromobenzene, was used (white solid, Yield: 18%).

1H NMR (300 MHz, 3) δ: 7.97 (1H), 7.87 (1H), 7.85 (2H), 7.83 (1H), 7.66 (1H), 7.55 (1H), 7.46 (2H), 7.38 (1H), 7.28 (1H), 1.72 (6H), 1.24 (12H), 0.66 (6H).

<Synthesis of Compound 13>

Compound 13 was synthesized in the same manner as in the synthesis of Compound 2, except that Compound 13-1, instead of Compound 2-1 and Compound 2-2, was used (Yield: 38%).

1H NMR (300 MHz, CDCl3) δ: 7.97 (2H), 7.91 (4H), 7.89 (4H), 7.87 (2H), 7.83 (2H), 7.66 (2H), 7.55 (2H), 7.52 (4H), 7.39 (4H), 7.38 (2H), 7.28 (2H), 1.72 (12H), 0.66 (12H).

HRMS (FAB): calcd for C60H50Si2: 826.35. found: 827.21.

Synthesis Example 4

Synthesis of Compound 19

<Synthesis of Compound 19-1>

Compound 19-1

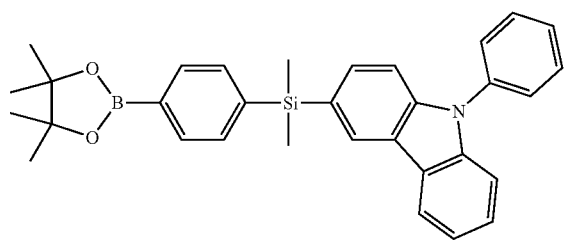

Compound 19-1 was synthesized in the same manner as in the synthesis of Compound 2-1, except that 3-bromo-(9-phenyl)carbazole, instead of 3-bromobenzene, was used (white solid, Yield: 20%).

1H NMR (300 MHz, CDCl3) δ: 8.55 (1H), 7.94 (1H), 7.85 (2H), 7.83 (1H), 7.73 (1H), 7.58 (2H), 7.50 (2H), 7.46 (2H), 7.45 (1H), 7.36 (1H), 7.33 (1H), 7.25 (1H), 1.24 (12H), 0.66 (6H).

Compound 13

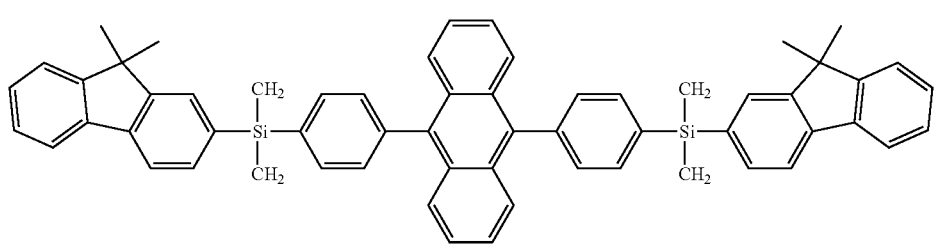

<Synthesis of Compound 19>

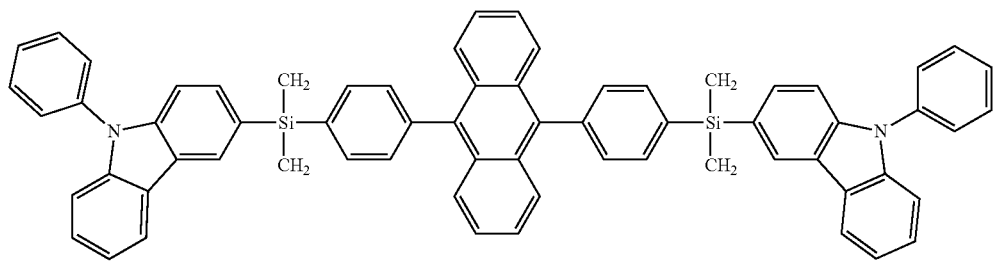

Compound 19

Compound 19 was synthesized in the same manner as in the synthesis of Compound 2, except that Compound 19-1, instead of Compound 2-1 and Compound 2-2, was used (Yield: 39%).

1H NMR (300 MHz, 3) δ: 8.55 (2H), 7.94 (2H), 7.91 (4H), 7.89 (4H), 7.83 (2H), 7.73 (2H), 7.58 (4H), 7.52 (4H), 7.50 (4H), 7.45 (2H), 7.39 (4H), 7.36 (2H), 7.33 (2H), 7.25 (2H), 0.66 (12H).

HRMS (FAB): calcd for C66H48N2Si2: 924.34. found: 925.27.

Synthesis Example 5

Synthesis of Compound 21

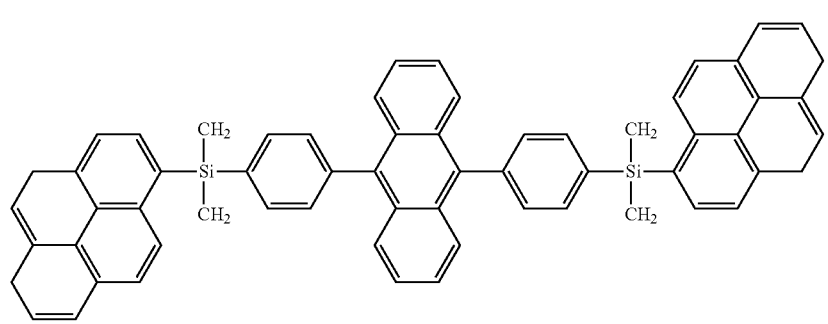

Compound 21

Compound 21 was synthesized in the same manner as in the synthesis of Compound 2, except that Compound 6-1, instead of Compound 2-1 and Compound 2-2, was used (Yield: 42%).

1H NMR (300 MHz, CDCl3) δ: 8.37 (4H), 8.24 (6H), 8.12 (6H), 8.03 (2H), 7.81 (4H), 7.72 (4H), 7.46 (4H), 7.33 (4H), 0.98 (12H)

HRMS (FAB): calcd for C62H46Si2: 846.31. found: 847.20.

Synthesis Example 6

Synthesis of Compound 24

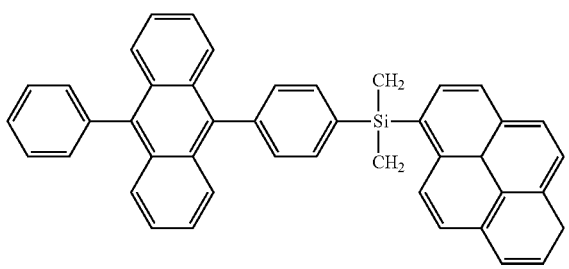

Compound 24

Compound 24 was synthesized in the same manner as in the synthesis of Compound 2, except that 10-bromo-9-phenylanthracene, instead of 9,10-dibromoanthracene, and Compound 6-1, instead of Compound 2-1, were used, and Compound 2-2 was not used (Yield: 47%).

1H NMR (300 MHz, CDCl3) δ: 7.98 (6H), 7.91 (4H), 7.79 (2H), 7.39 (4H), 7.24 (2H), 5.34 (1H), 3.22 (2H), 2.05 (6H), 0.66 (6H).

HRMS (FAB): calcd for C44H32Si: 588.23. found: 588.81.

Synthesis Example 7

Synthesis of Compound 47

<Synthesis of Compound 47-1>

[Reaction Scheme 47-1]

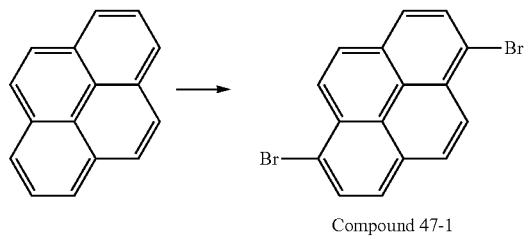

Compound 47-1

10 g (49.5 mmol) of pyrene was put into a 3-neck, round-bottomed flask, and dissolved with 300 ml of $CCl_4$ to obtain a solution, followed by slowly dropwise adding a dilution of 17.38 g (108 mmol) $Br_2$ in $CCl_4$ over about 4 hours. After completion of the reaction, a resulting precipitate was filtered, followed by recrystallization of the resulting precipitate with toluene to obtain Compound 47-1 in white solid form (7.74 g, 16.83 mmol, Yield: 34%).

<Synthesis of Compound 47-2>

[Reaction Scheme 47-2]

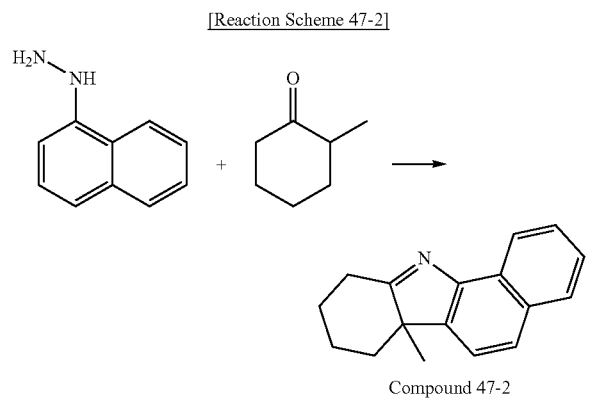

Compound 47-2

50 g (316.30 mmol) of 1-naphthylhydrazine and 170 ml of acetic acid in a 500 mL-round-bottomed flask were heated to about 60° C., followed by dropwise adding 35.45 g (316.30 mmol) of 2-methylcyclohexanone into the heated flask to obtain a mixture, which was then refluxed for about 8 hours. After completion of the reaction, 100 mL of water was added into the reaction product, followed by alkalization with sodium hydroxide. After extraction with water and ethyl acetate, an organic phase was dried using magnesium sulfate and then concentrated in a reduced pressure, followed by separation using column chromatography with hexane and ethyl acetate as eluents to obtain Compound 47-2 (62.47 g, 265.69 mmol, Yield: 84%)

<Synthesis of Compound 47-3>

[Reaction Sheme 47-3]

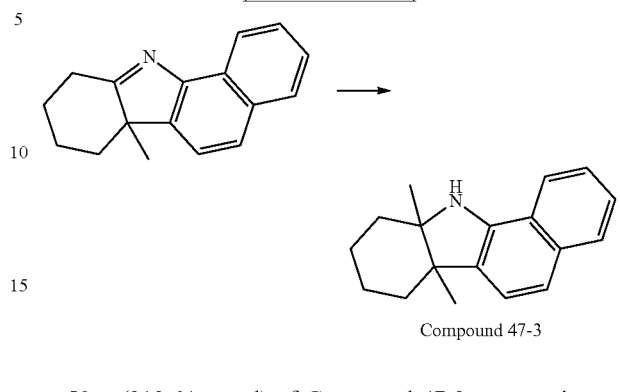

Compound 47-3

50 g (212.64 mmol) of Compound 47-2 was put into a 2L-round-bottomed flask in a nitrogen atmosphere, and dissolved in 570 mL of toluene, followed by cooling down to about −10° C. 202 mL (318.96 mmol) of 1.6M methyl lithium was slowly dropwise added into the solution, and reacted at about −10° C. for about 3 hours. After completion of the reaction, was slowly added into the reaction product until no reactivity appeared. After extraction with water and ethyl acetate, an organic phase was dried using magnesium sulfate and then concentrated in a reduced pressure, followed by separation using column chromatography with hexane and ethyl acetate as eluents to obtain Compound 47-3 (40.59 g, 161.61 mmol, Yield: 76%).

<Synthesis of Compound 47>

[Reaction Scheme 47]

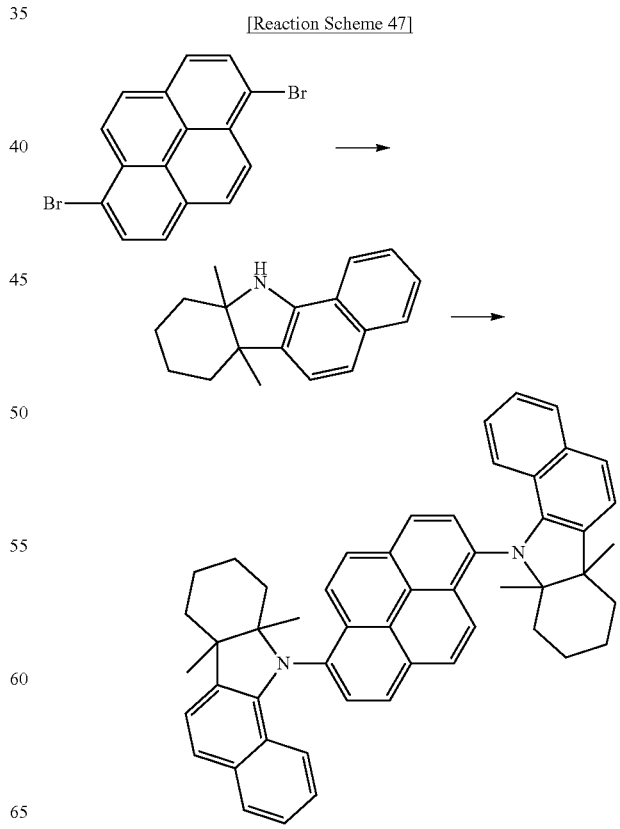

10 g (21.74 mmol) of Compound 47-1, 14.47 g (57.60 mmol) of Compound 47-3, 0.25 g (0.87 mmol) of palladium acetate (Pd(OAc)$_2$), 8.57 g (88.25 mmol) of sodium tert-butoxide, 0.17 g (0.87 mmol) of tri-tert-butylphosphine, and 100 ml of toluene were put into a round-bottomed flask, and then reacted at about 100° C. for about 2 hours. After termination of the reaction, the reaction product was filtered, followed by concentrating the filtrate, which was then separated using column chromatography. After recrystallization with toluene and methanol, the resulting solid was filtered and then dried to obtain Compound 47 (6.39 g, 9.13 mmol, Yield: 42%).

MS: m/z 700 [M]$^+$ $^1$H NMR ($_3$) δ 8.04 (2H), 8.03 (2H), 7.78 (2H), 7.71 (4H), 7.53 (2H), 7.51 (2H), 7.49 (2H), 6.99 (2H), 6.91 (2H), 2.00 (4H), 1.72 (4H), 1.53 (8H), 1.51 (6H), 1.50 (6H)

Synthesis Example 8

Synthesis of Compound 57

<Synthesis of Compound 57-1>

[Reaction Scheme 57-1]

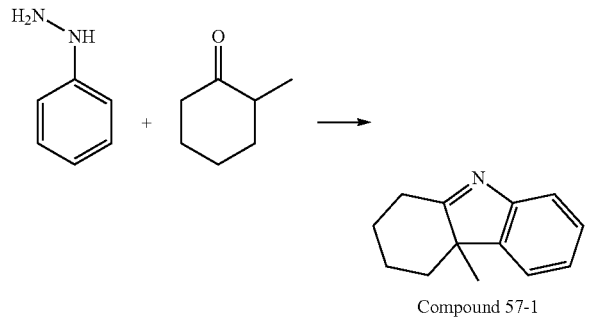

Compound 57-1

50 g (462 mmol) of phenylhydrazine and 170 ml of acetic acid in a 500 mL-round-bottomed flask were heated to about 60° C., followed by dropwise adding 51.9 g (462 mmol) of 2-methylcyclohexanone into the heated flask to obtain a mixture, which was then refluxed for about 8 hours. After completion of the reaction, 100 mL of water was added into the reaction product, followed by alkalization with sodium hydroxide. After extraction with water and ethyl acetate, an organic phase was dried using magnesium sulfate, concentrated in a reduced pressure, purified by column chromatography using hexane and ethyl acetate as eluents to obtain Compound 57-1 (72 g, 388.08 mmol, Yield: 84%)<

Synthesis of Compound 57-2>

[Reaction Scheme 57-2]

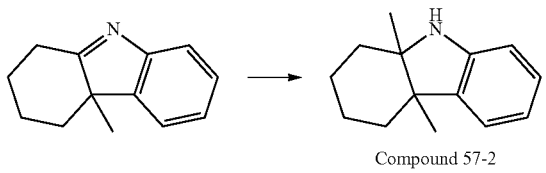

Compound 57-2

57 g (308 mmol) of Compound 57-1 was put into a 2L-round-bottomed flask in a nitrogen atmosphere, and dissolved in 570 mL of toluene, followed by cooling down to about −10° C. 300 mL (474 mmol) of 1.6M methyl lithium was slowly dropwise added into the solution, and reacted at about −10° C. for about 3 hours. After completion of the reaction, was slowly added into the reaction product until no reactivity appeared. After extraction with water and ethyl acetate, an organic phase was dried using magnesium sulfate and then concentrated in a reduced pressure, followed by separation using column chromatography with hexane and ethyl acetate as eluents to obtain Compound 57-2 (47 g, 234.08 mmol, Yield: 76%).

<Synthesis of Compound 57-3>

[Reaction Scheme 57-3]

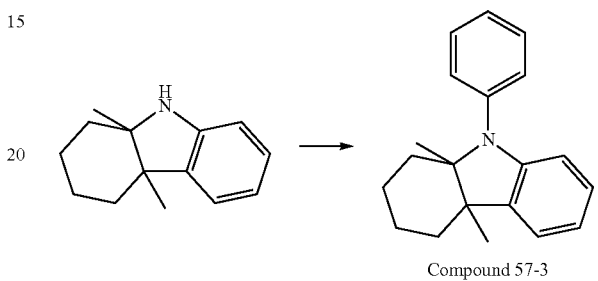

Compound 57-3

40 g (199 mmol) of Compound 57-2, 48.6 g (238 mmol) of iodobenzene, 0.89 g (4 mmol) of tris(dibenzylidene acetone)dipalladium (0), 2.47 g (4 mmol) of 2,2-bisdiphenylphosphino-1,1'-binaphthyl, 38.19 g (397 mmol) of sodium tert-butoxide, and 100 ml of toluene were put into a 1-L round-bottomed flask, and then refluxed for about 8 hours. After completion of the reaction, the reaction product was filtered through Celite and then concentrated in a reduced pressure, followed by separation using column chromatography with hexane as eluent to obtain Compound 57-3 (44 g, 157.21 mmol, Yield: 79%).

<Synthesis of Compound 57-4>

[Reaction Scheme 57-4]

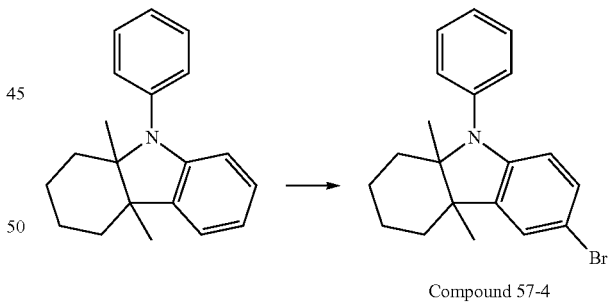

Compound 57-4

44 g (158 mmol) of Compound 57-3 and 130 mL of dimethylformamide were put into a 500-mL round-bottomed flask, followed by cooling down to about 0° C. A solution of 25.2 g (142 mmol) of N-bromosuccinimide dissolved in 200 mL of dimethylformamide was slowly dropwise added into the flask, followed by increasing the temperature to room temperature and stirring for about 2 hours. After completion of the reaction, the reaction product was extracted with water and ethyl acetate. An organic phase was dried using magnesium sulfate and then concentrated in a reduced pressure, followed by adding hexane and filtering the resulting crystals to obtain Compound 57-4 (45 g, 126.4 mol, Yield: 80%).

131
<Synthesis of Compound 57-5>

[Reaction Scheme 57-5]

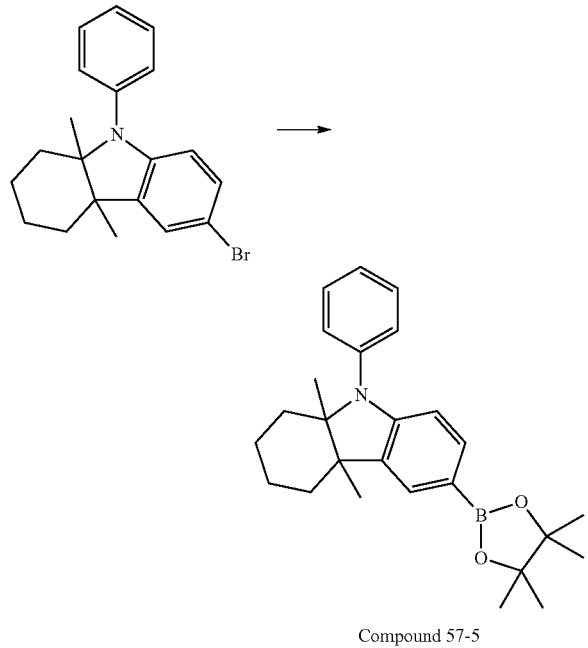

Compound 57-5

40 g (112 mmol) of Compound 57-4, 34 g (134 mmol) of bis(pinacolato)diborone, 2.73 g (3 mmol) of palladium(II) chloride-1-1'-bis(diphenylphospino)ferrocene, 32.9 g (335 mmol) of potassium acetate, and 480 mL of toluene were put into a 1-L round-bottomed flask, and then refluxed for about 8 hours. After completion of the reaction, the reaction product was filtered through Celite, and then concentrated in a reduced pressure, followed by separation using column chromatography with hexane and ethyl acetate as eluents to obtain Compound 57-5 (26 g, 64.96 mmol, Yield: 58%)

<Synthesis of Compound 57>

[Reaction Scheme 57]

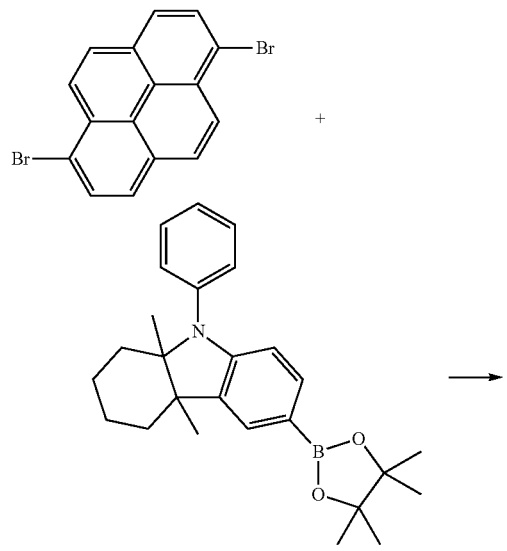

132

-continued

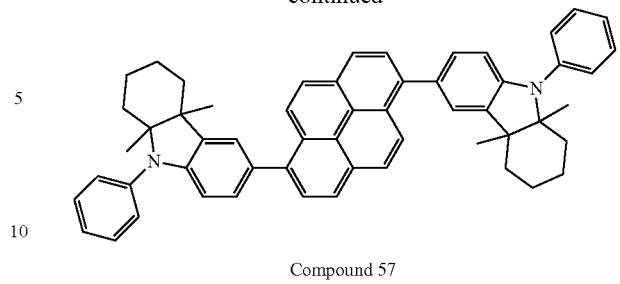

Compound 57

5.0 g (9 mmol) of Compound 47-1, 9.83 g (25.32 mmol) of Compound 57-5, 0.49 g (0.36 mmol) of tetrakis(triphenylphospine)palladium, 4.35 g (31.4 mmol) of potassium carbonate, 25 mL of 1,4-dioxane, 25 mL of toluene, and 10 mL of water were put into a round-bottomed flask, and then refluxed. After completion of the reaction, water and hexane were added into the reaction product, followed by filtering the resulting crystals, and recrystallization of crystals to obtain Compound 57 (4.92 g, 6.52 mmol, Yield: 60%).

MS: m/z 753[M]$^+$ $^1$H NMR ($_3$) δ 8.06 (2H), 8.04 (2H), 7.80 (2H), 7.71 (4H), 7.37 (2H), 7.33 (4H), 7.23 (4H), 6.77 (2H), 6.58 (2H), 2.00 (4H), 1.72 (4H), 1.53 (8H), 1.50 (6H), 1.45 (6H)

Example 1

As a substrate and anode, a Corning 15Ω/☐ (1,200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

2-TNATA was deposited on the ITO glass layer (anode) of the substrate to form an HIL having a thickness of 600 Å on the anode, and then 4.4'-bis[N-(1-naphthyl)-N-phenylamino]biphenyl (NPB) was deposited on the HIL to form a HTL having a thickness of 300 Å.

Compound 2 (host) and Compound 47 (dopant) were co-deposited on the HTL in a weight ratio of about 95:5 to form an EML having a thickness of about 400 Å.

Then, Compound 201 was deposited on the EML to form an ETL having a thickness of about 300 Å, and then LiF was deposited on the ETL to form an EIL having a thickness of about 10 Å. Then, Al was deposited on the EIL to form a second electrode (cathode) having a thickness of about 1,100 Å, thereby completing the manufacture of an organic light-emitting diode.

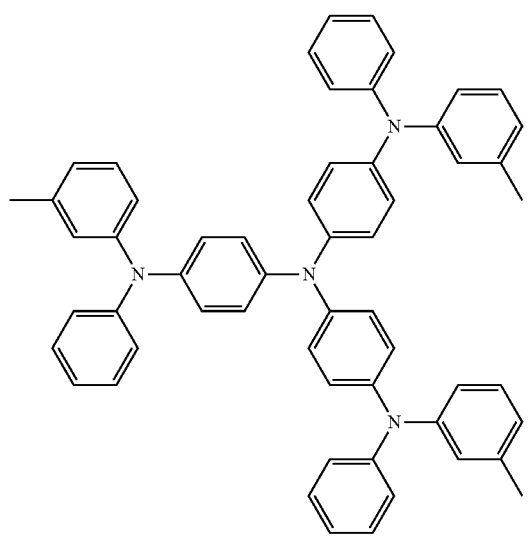
<2-TNATA>

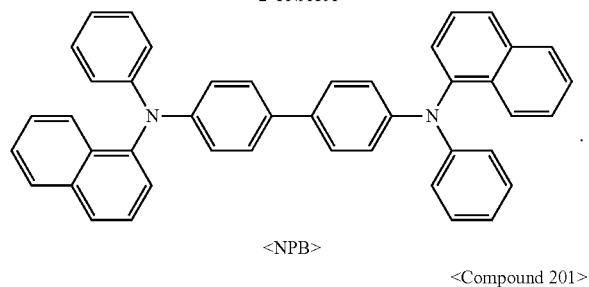
<NPB>

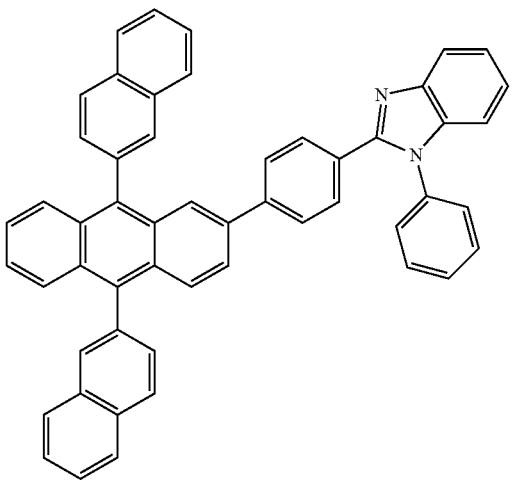
<Compound 201>

Example 2

An organic light-emitting diode was manufactured in the same manner as in Example 1, except that Compound 6, instead of Compound 2, was used to form the EML.

Example 3

An organic light-emitting diode was manufactured in the same manner as in Example 2, except that Compound 13, instead of Compound 2, was used to form the EML.

Example 4

An organic light-emitting diode was manufactured in the same manner as in Example 1, except that Compound 19, instead of Compound 2, was used to form the EML.

Example 5

An organic light-emitting diode was manufactured in the same manner as in Example 1, except that Compound 21, instead of Compound 2, was used to form the EML.

Example 6

An organic light-emitting diode was manufactured in the same manner as in Example 1, except that Compound 24, instead of Compound 2, was used to form the EML.

Example 7

An organic light-emitting diode was manufactured in the same manner as in Example 1, except that Compound 57, instead of Compound 47, was used to form the EML.

Example 8

An organic light-emitting diode was manufactured in the same manner as in Example 7, except that Compound 6, instead of Compound 2, was used to form the EML.

Example 9

An organic light-emitting diode was manufactured in the same manner as in Example 7, except that Compound 13, instead of Compound 2, was used to form the EML.

Example 10

An organic light-emitting diode was manufactured in the same manner as in Example 7, except that Compound 19, instead of Compound 2, was used to form the EML.

Example 11

An organic light-emitting diode was manufactured in the same manner as in Example 7, except that Compound 21, instead of Compound 2, was used to form the EML.

Example 12

An organic light-emitting diode was manufactured in the same manner as in Example 7, except that Compound 24, instead of Compound 2, was used to form the EML.

Comparative Example 1

An organic light-emitting diode was manufactured in the same manner as in Example 1, except that host A below, instead of Compound 2, was used to form the EML.

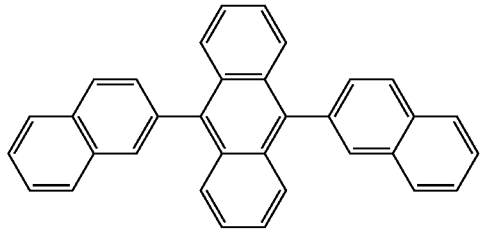

<Host A>

Comparative Example 2

An organic light-emitting diode was manufactured in the same manner as in Example 7, except that Host A above, instead of Compound 2, was used to form the EML.

Comparative Example 3

An organic light-emitting diode was manufactured in the same manner as in Example 1, except that Host B below and 2,3,8,11-tetra-tert-butyl-perylene (TBPe), instead of Compound 2 and Compound 47, respectively, were used to form the EML.

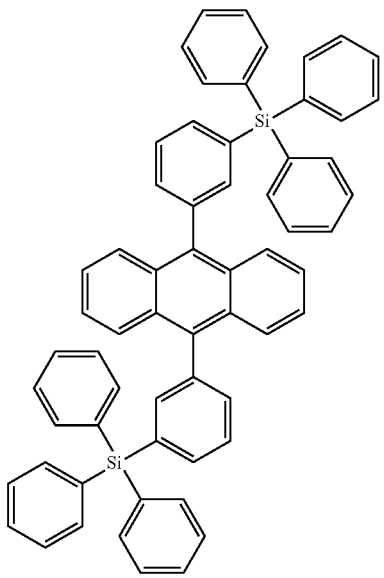

<Host B>

Evaluation Example

Driving voltages, current densities, efficiencies, and color purities of the organic light-emitting diodes of Examples 1 to 12 and Comparative Examples 1 and 3 were measured using a PR650 (Spectroscan) Source Measurement Unit (available from Photo Research, Inc.). The results are shown in Table 1, below. (T95 lifetime indicates the time taken until an initial luminocity (assumed as 100%) measured at a current density of about 10 mA/cm² is reduced to 95%.)

TABLE 1

| Example | Host | Dopant | Driving voltage (V) | Efficiency (cd/A) | Color coordinates CIE x | CIE y | T95 lifetime [hr] |
|---|---|---|---|---|---|---|---|
| Example 1 | Compound 2 | Compound 47 | 3.8 | 2.7 | 0.148 | 0.040 | 160 |
| Example 2 | Compound 6 | Compound 47 | 3.7 | 2.9 | 0.147 | 0.044 | 210 |
| Example 3 | Compound 13 | Compound 47 | 3.4 | 2.8 | 0.147 | 0.043 | 150 |
| Example 4 | Compound 19 | Compound 47 | 3.4 | 2.8 | 0.148 | 0.042 | 170 |
| Example 5 | Compound 21 | Compound 47 | 3.6 | 3.3 | 0.148 | 0.045 | 230 |
| Example 6 | Compound 24 | Compound 47 | 3.8 | 3.2 | 0.148 | 0.045 | 200 |
| Example 7 | Compound 2 | Compound 57 | 3.6 | 2.8 | 0.148 | 0.042 | 180 |
| Example 8 | Compound 6 | Compound 57 | 3.7 | 3.0 | 0.147 | 0.047 | 200 |
| Example 9 | Compound 13 | Compound 57 | 3.4 | 2.9 | 0.148 | 0.044 | 160 |
| Example 10 | Compound 19 | Compound 57 | 3.4 | 2.8 | 0.148 | 0.046 | 180 |
| Example 11 | Compound 21 | Compound 57 | 3.6 | 3.6 | 0.147 | 0.048 | 250 |
| Example 12 | Compound 24 | Compound 57 | 3.8 | 3.3 | 0.148 | 0.046 | 240 |
| Comparative Example 1 | Host A | Compound 47 | 4.8 | 2.5 | 0.148 | 0.052 | 110 |
| Comparative Example 2 | Host A | Compound 57 | 4.9 | 2.6 | 0.148 | 0.058 | 140 |
| Comparative Example 3 | Host B | TBPe | 5.2 | 2.2 | 0.152 | 0.072 | 40 |

Referring to Table 1, the organic light-emitting diodes of Examples 1 to 12 were found to have lower driving voltages, higher efficiencies, improved lifetimes, and better color purity characteristics, compared to the organic light-emitting diodes of Comparative Examples 1 to 3.

As described above, according an embodiment, an organic light-emitting diode including an anthracene-based compound of Formula 1, above, and a condensed cyclic compound of Formula 20, above, may have a low driving voltage, a high efficiency, and a long lifetime.

The embodiments may provide an organic light-emitting diode (OLED) with high efficiency and improved lifetime Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light-emitting diode, comprising:
a substrate;
a first electrode on the substrate;
a second electrode disposed opposite to the first electrode; and
an emission layer between the first electrode and the second electrode, the emission layer including an anthracene-based compound represented by Formula 1, below, and a condensed cyclic compound represented by Formula 20, below:

<Formula 1>

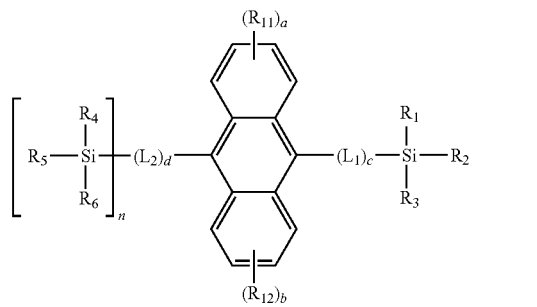

<Formula 20>

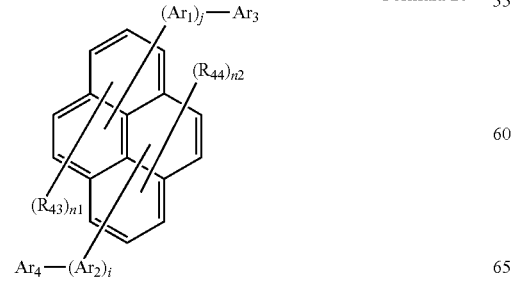

wherein, in Formulae 1 and 20:
n is 0 or 1;
$R_1$ to $R_6$ are each independently selected from a substituted or unsubstituted $C_1$-$C_{60}$ alkyl group, a 3-membered to 10-membered substituted or unsubstituted non-condensed cyclic group, and a substituted or unsubstituted condensed cyclic group with at least two condensed rings, wherein, when n is 0, at least one of $R_1$ to $R_3$ is a substituted or unsubstituted condensed cyclic group with at least two condensed rings, and when n is 1, at least one of $R_1$ to $R_6$ is a substituted or unsubstituted condensed cyclic group with at least two condensed rings;
$L_1$, $L_2$, $Ar_1$, and $Ar_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_3$-$C_{10}$ heterocycloalkylene group, a substituted or unsubstituted $C_3$-$C_{10}$ heterocycloalkenylene group, a substituted or unsubstituted $C_6$-$C_{60}$ arylene group, and a substituted or unsubstituted $C_2$-$C_{60}$ heteroarylene group;
c and d are each independently an integer from 1 to 3;
$R_{11}$, $R_{12}$, $R_{43}$, and $R_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, $-N(Q_1)(Q_2)$, and $-Si(Q_3)(Q_4)(Q_5)$, where $Q_1$ to $Q_5$ are each independently selected from a hydrogen atom, $C_1$-$C_{10}$ alkyl group, a $C_6$-$C_{20}$ aryl group, and a $C_2$-$C_{20}$ heteroaryl group;
a and b are each independently an integer from 1 to 4;
i and j are each independently an integer from 0 to 3;
n1 and n2 are each independently an integer from 1 to 4; and
$Ar_3$ and $Ar_4$ are each independently represented by one of Formulae 7D, 7E, or 7F, below:

<Formula 7D>

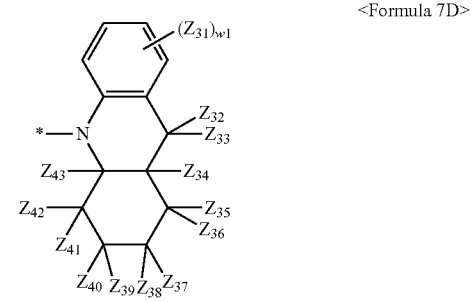

139

-continued

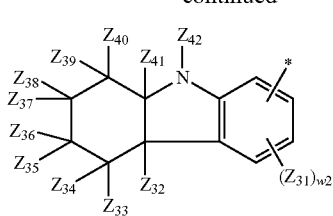

<Formula 7E>

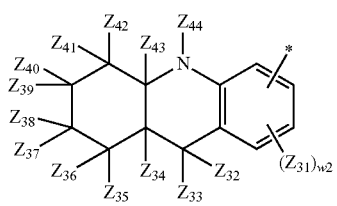

<Formula 7F> wherein, in Formulae 7D, 7E, and 7F:

$Z_{31}$ to $Z_{44}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_{51}$)($Q_{52}$), and —Si($Q_{53}$)($Q_{54}$)($Q_{55}$), where $Q_{51}$ to $Q_{55}$ are each independently selected from a hydrogen atom, a $C_1$-$C_{10}$ alkyl group, a $C_6$-$C_{20}$ aryl group, and a $C_2$-$C_{20}$ heteroaryl group;

w1 is an integer from 1 to 4; and w2 is an integer from 1 to 5.

2. The organic light-emitting diode as claimed in claim 1, wherein a weight ratio of the anthracene-based compound to the condensed cyclic compound in the emission layer is from about 99.9:0.01 to about 80:20.

3. The organic light-emitting diode as claimed in claim 1, wherein $R_1$ to $R_6$ in Formula 1 are each independently selected from:

a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexcenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, acenaphthylenyl group, a

140 fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group; and a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexcenyl group, a cyclohexadienyl group, a cycloheptadienyl group, a thiophenyl group, a furanyl group, a pyrrolyl group, an imidazolyl group, a pyrazolyl group, an isothiazolyl group, an isoxazolyl group, a thiazolyl group, an oxazolyl group, an oxadiazolyl group, a thiadiazolyl group, a triazolyl group, a phenyl group, a pyridinyl group, a pyrazinyl group, a pyrimidinyl group, a pyridazinyl group, a triazinyl group, a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), where $Q_{11a}$ and $Q_{12a}$ are each independently a hydrogen atom, a $C_1$-$C_{10}$ alkyl group, a $C_6$-$C_{20}$ aryl group, and a $C_2$-$C_{20}$ heteroaryl group, wherein at least one of $R_1$ to $R_3$ if n is 0, or at least one of $R_1$ to $R_6$, if n is 1, are each independently selected from:

a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzouranyl group, a dibenzothiophenyl group, a phenothiazinyl group, a phenoxazinyl group, a dihydrophenazinyl group, a phenoxatinyl group, and a phenanthridinyl group; and a pentalenyl group, an indenyl group, a naphthyl group, an azulenyl group, a heptalenyl group, a biphenylenyl group, an indacenyl group, acenaphthylenyl group, a fluorenyl group, a spiro-fluorenyl group, a carbazolyl group, an anthracenyl group, a phenalenyl group, a phenanthrenyl group, a perylenyl group, a fluoranthenyl group, a naphthacenyl group, a picenyl group, a pentaphenyl group, a hexacenyl group, a dibenzofuranyl group, a dibenzothiophenyl group, a phenothiazinyl group, a phenoxazinyl group, a dihydrophenazinyl group, a phenoxatinyl group, and a phenanthridinyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group.

4. The organic light-emitting diode as claimed in claim 1, wherein $R_1$ to $R_6$ in Formula 1 are each independently selected from:
   a methyl group, an ethyl group, a n-propyl group, an i-propyl group, a n-butyl group, an i-butyl group, a t-butyl group, a pentyl group, a hexyl group, a heptyl group, an octyl group, a nonyl group, and a decyl group;
   a methyl group, an ethyl group, a n-propyl group, a i-propyl group, a n-butyl group, a i-butyl group, a t-butyl group, a pentyl group, a hexyl group, a heptyl group, an octyl group, a nonyl group, and a decyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11a}$)($Q_{12a}$), where $Q_{11a}$ and $Q_{12a}$ are each independently a hydrogen atom, a $C_1$-$C_{10}$ alkyl group, a $C_6$-$C_{20}$ aryl group, or a $C_2$-$C_{20}$ heteroaryl group;
   groups represented by Formulae 2A to 2T below; and
   group represented by Formulae 3A to 3R below,
   wherein at least one of $R_1$ to $R_3$, if n is 0, or at least one of $R_1$ to $R_6$, if n is 1, are each independently selected from the groups represented by Formulae 3A to 3R below:

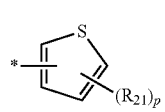

Formula 2A

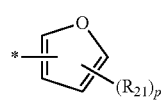

Formula 2B

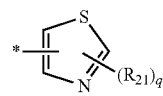

Formula 2C

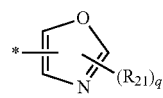

Formula 2D

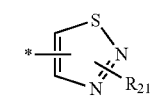

Formula 2E

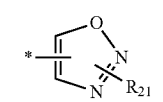

Formula 2F

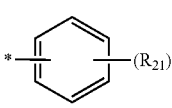

Formula 2G

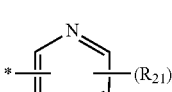

Formula 2H

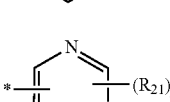

Formula 2I

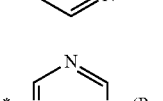

Formula 2J

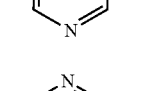

Formula 2K

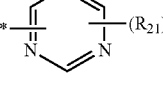

Formula 2L

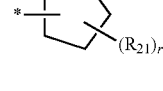

Formula 2M

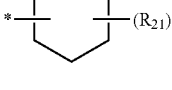

Formula 2N

Formula 2O

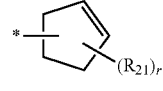

Formula 2P

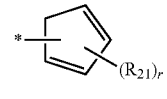

143
-continued

Formula 2Q

Formula 2R

Formula 2S

Formula 2T

Formula 3A

Formula 3B

Formula 3C

Formula 3D

Formula 3E

Formula 3F

Formula 3G

144
-continued

Formula 3H

Formula 3I

Formula 3J

Formula 3K

Formula 3L

Formula 3M

Formula 3N

-continued

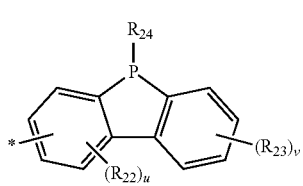
Formula 3O

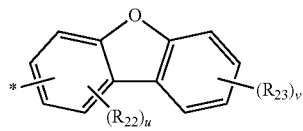
Formula 3P

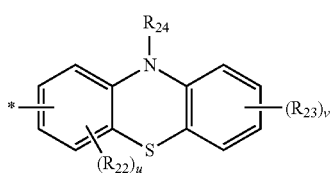
Formula 3Q

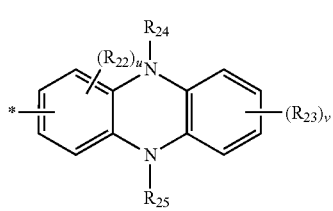
Formula 3R wherein, in Formulae 2A to 2T and Formulae 3A to 3R:
$R_{21}$ to $R_{27}$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —N($Q_{11a}$)($Q_{12a}$), where $Q_{11a}$ and $Q_{12a}$ are each independently a hydrogen atom, a $C_1$-$C_{10}$ alkyl group, a $C_6$-$C_{20}$ aryl group, and a $C_2$-$C_{20}$ heteroaryl group;
p and u are each independently an integer from 1 to 3;
q is 1 or 2;
r and x are each independently an integer from 1 to 5;
s and v are each independently an integer from 1 to 4;
t is an integer from 1 to 7;
w is an integer from 1 to 9; and
y is an integer from 1 to 6.

5. The organic light-emitting diode as claimed in claim 1, wherein $R_1$ to $R_6$ in Formula 1 are each independently one of:
a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group;
a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group, each substituted with at least one of a deuterium atom, a halogen atom, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a phenyl group, a naphthyl group, or an anthracenyl group;
a group represented by Formula 2G; or
groups represented by Formulae 4A to 4J,
wherein at least one of $R_1$ to $R_3$, if n is 0, or at least one of $R_1$ to $R_6$, if n is 1, are each independently selected from the groups represented by Formulae 4A to 4J, below:

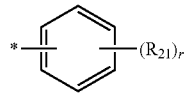
Formula 2G

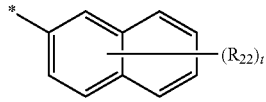
Formula 4A

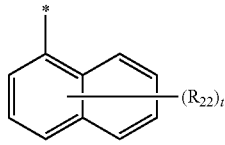
Formula 4B

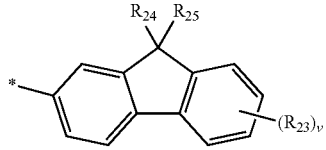
Formula 4C

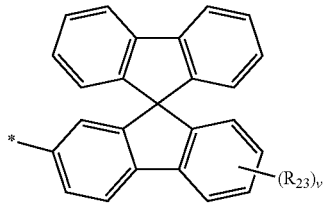
Formula 4D

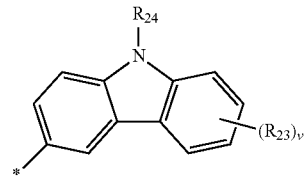
Formula 4E

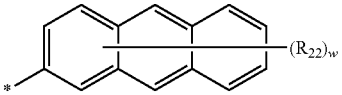
Formula 4F

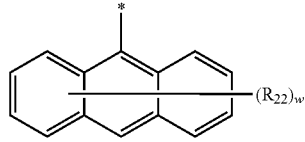
Formula 4G

-continued

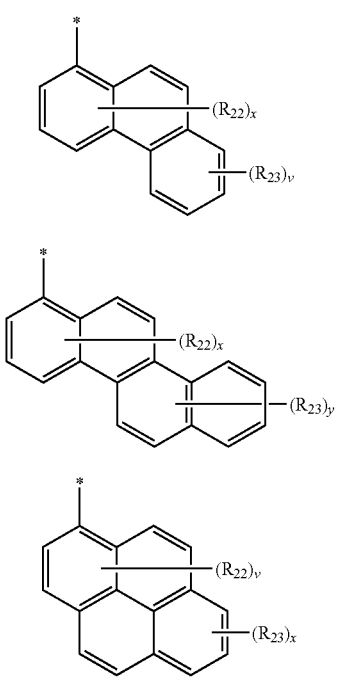

Formula 4H

Formula 4I

Formula 4J wherein, in Formula 2G, and Formulae 4A to 4J:

$R_{21}$ to $R_{25}$ are each independently selected from a hydrogen atom, a deuterium atom, a halogen atom, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a dimethyl-fluorenyl group, a phenyl-carbazolyl group, a pyrenyl group, a crysenyl group, a benzothiazolyl group, a benzoxazolyl group, a phenyl-benzoimidazolyl group, or —N($Q_{11a}$) ($Q_{12a}$), wherein $Q_{11a}$ and $Q_{12a}$ are each independently a hydrogen atom, a $C_1$-$C_{10}$ alkyl group, a phenyl group, a naphthyl group, and an anthracenyl group;

r and x are each independently an integer from 1 to 5;

v is an integer from 1 to 4;

t is an integer from 1 to 7;

w is an integer from 1 to 9; and y is an integer from 1 to 6.

6. The organic light-emitting diode as claimed in claim 1, wherein $L_1$, $L_2$, $Ar_1$, and $Ar_2$ in Formulae 1 and 20 are each independently selected from:

a cyclopropylene group, a cyclobutylene group, a cyclopentylene group, a cyclohexylene group, a cycloheptylene group, a cyclooctylene group, a cyclopentenylene group, a cyclopentadienylen group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxatinylene group, and a phenanthridinylene group; and a cyclopropylene group, a cyclobutylene group, a cyclopentylene group, a cyclohexylene group, a cycloheptylene group, a cyclooctylene group, a cyclopentenylene group, a cyclopentadienylene group, a cyclohexenylene group, a cyclohexadienylene group, a cycloheptadienylene group, a thiophenylene group, a furanylene group, a pyrrolylene group, an imidazolylene group, a pyrazolylene group, an isothiazolylene group, an isoxazolylene group, a thiazolylene group, an oxazolylene group, an oxadiazolylene group, a thiadiazolylene group, a triazolylene group, a phenylene group, a pyridinylene group, a pyrazinylene group, a pyrimidinylene group, a pyridazinylene group, a triazinylene group, a pentalenylene group, an indenylene group, a naphthylene group, an azulenylene group, a biphenylenylene group, an indacenylene group, an acenaphthylenylene group, a fluorenylene group, a spiro-fluorenylene group, a carbazolylene group, an anthracenylene group, a phenalenylene group, a phenanthrenylene group, a perylenylene group, a fluoranthenylene group, a naphthacenylene group, a picenylene group, a pentaphenylene group, a hexacenylene group, a dibenzofuranylene group, a dibenzothiophenylene group, a phenothiazinylene group, a phenoxazinylene group, a dihydrophenazinylene group, a phenoxatinylene group, and a phenanthridinylene group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and —N($Q_{11b}$)($Q_{12b}$), where $Q_{11b}$ and $Q_{12b}$ are each independently a hydrogen atom, a $C_1$-$C_{10}$ alkyl group, a $C_6$-$C_{20}$ aryl group, or a $C_2$-$C_{20}$ heteroaryl group.

7. The organic light-emitting diode as claimed in claim 1, wherein $L_1$, $L_2$, $Ar_1$, and $Ar_2$ in Formulae 1 and 20 are each independently selected from groups represented by Formulae 5A to 5J:

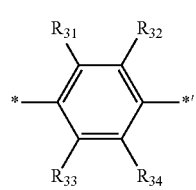

Formula 5A

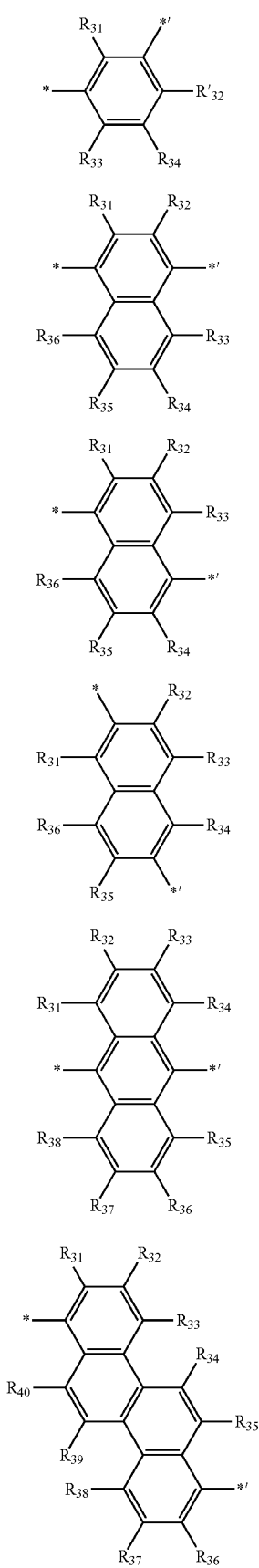

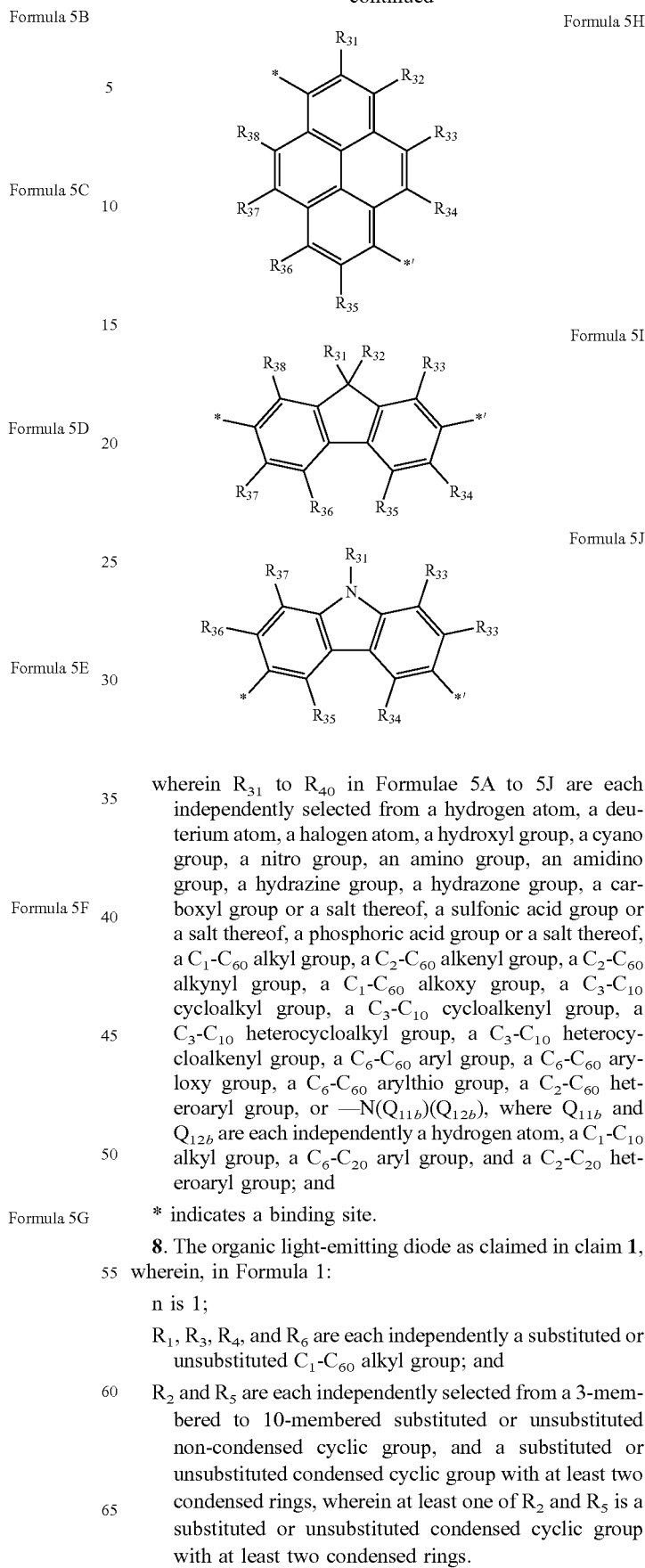

wherein $R_{31}$ to $R_{40}$ in Formulae 5A to 5J are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, or —$N(Q_{11b})(Q_{12b})$, where $Q_{11b}$ and $Q_{12b}$ are each independently a hydrogen atom, a $C_1$-$C_{10}$ alkyl group, a $C_6$-$C_{20}$ aryl group, and a $C_2$-$C_{20}$ heteroaryl group; and

* indicates a binding site.

8. The organic light-emitting diode as claimed in claim 1, wherein, in Formula 1:

n is 1;

$R_1$, $R_3$, $R_4$, and $R_6$ are each independently a substituted or unsubstituted $C_1$-$C_{60}$ alkyl group; and $R_2$ and $R_5$ are each independently selected from a 3-membered to 10-membered substituted or unsubstituted non-condensed cyclic group, and a substituted or unsubstituted condensed cyclic group with at least two condensed rings, wherein at least one of $R_2$ and $R_5$ is a substituted or unsubstituted condensed cyclic group with at least two condensed rings.

9. The organic light-emitting diode as claimed in claim 1, wherein, in Formula 1:
n is 0;
R$_1$ and R$_3$ are each independently a substituted or unsubstituted C$_1$-C$_{60}$ alkyl group; and
R$_2$ is a substituted or unsubstituted condensed cyclic group with at least two condensed rings.

10. The organic light-emitting diode as claimed in claim 1, wherein the anthracene-based compound is one of Compounds 1 to 24 below:

1

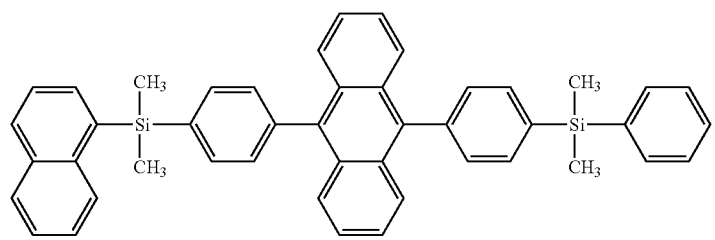

2

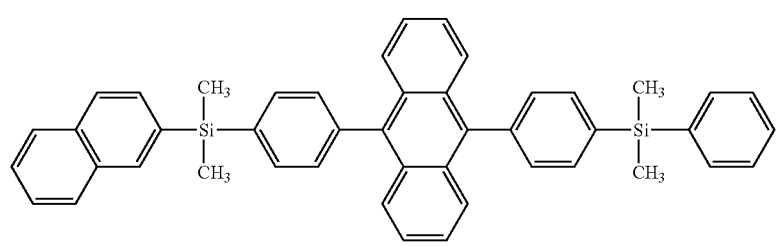

3

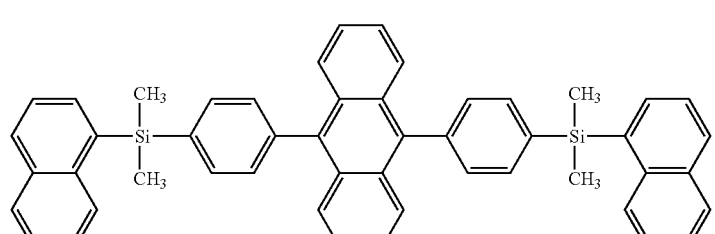

4

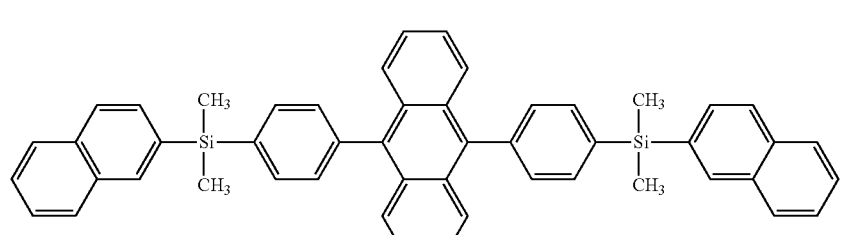

5

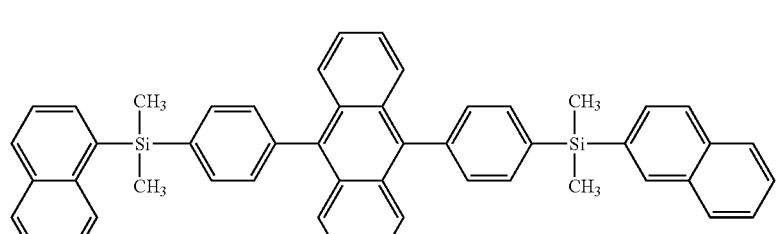

6

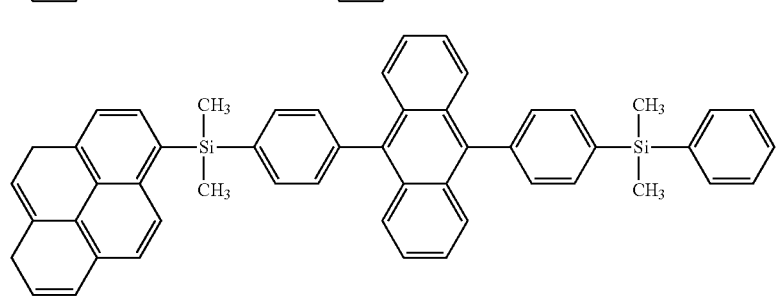

7
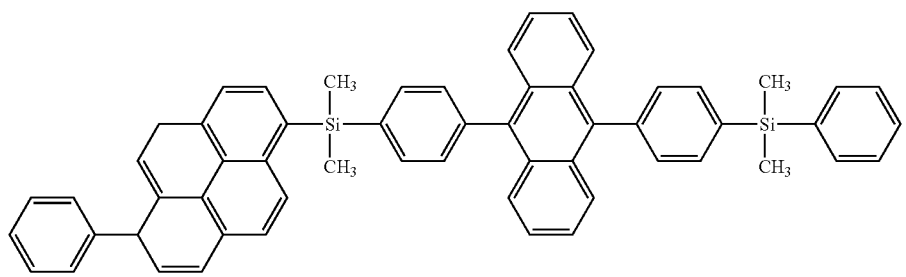
8
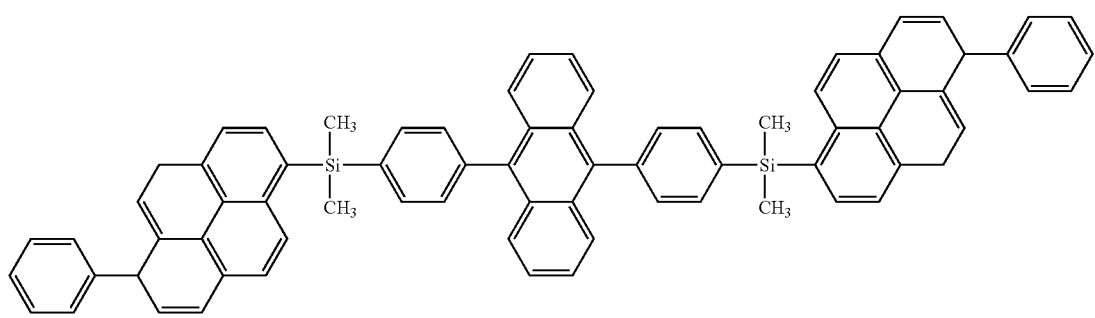
9
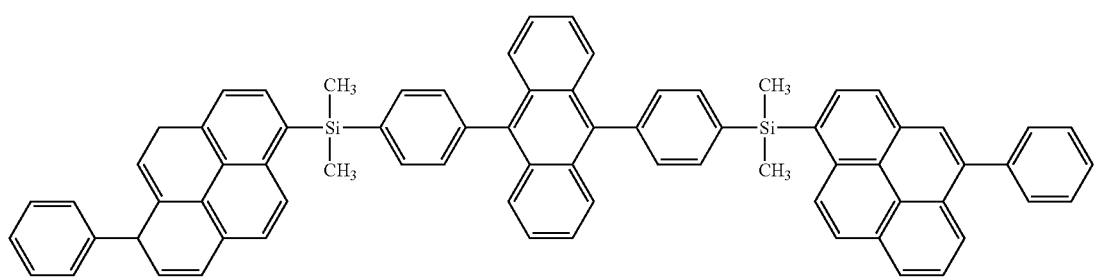
10
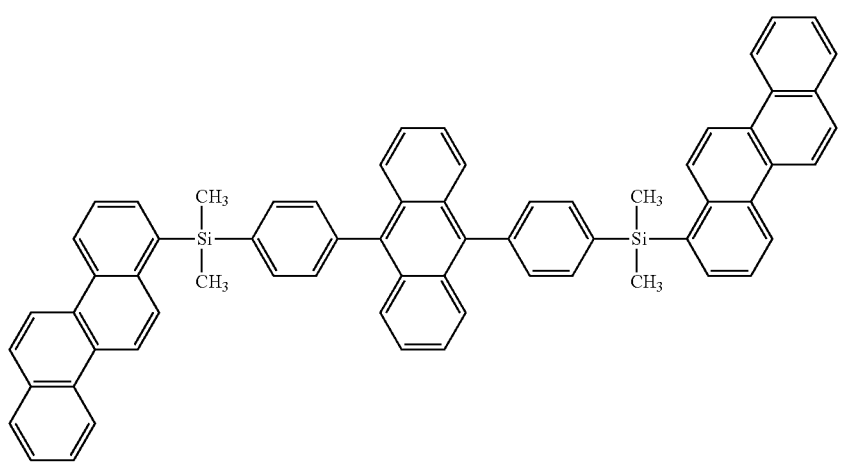

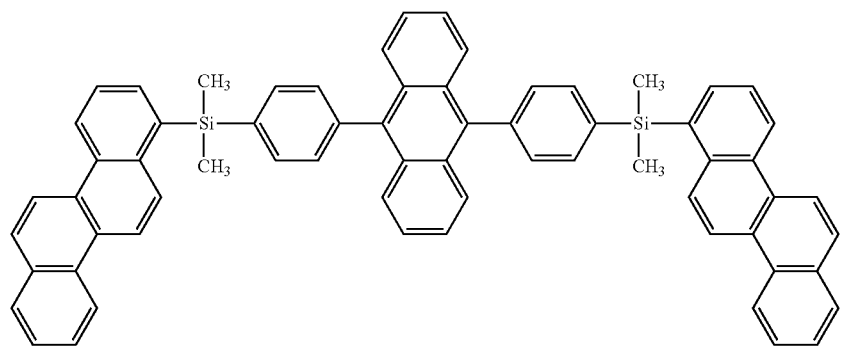
11
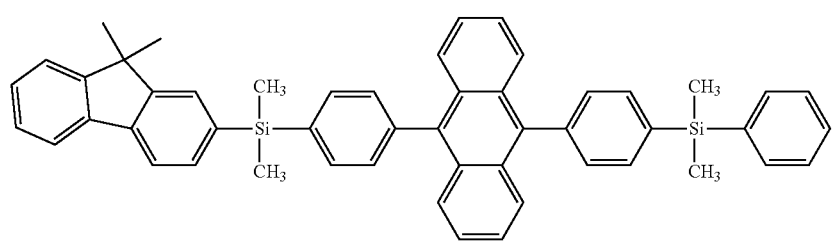
12
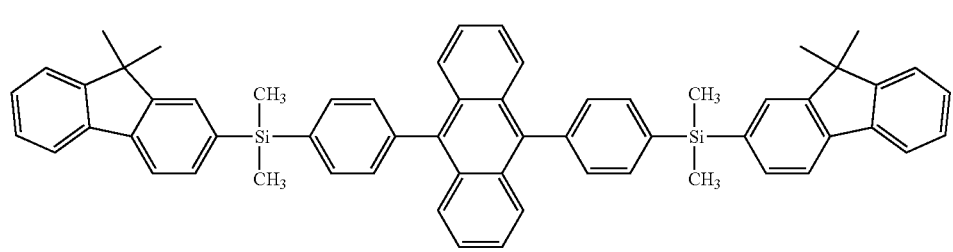
13
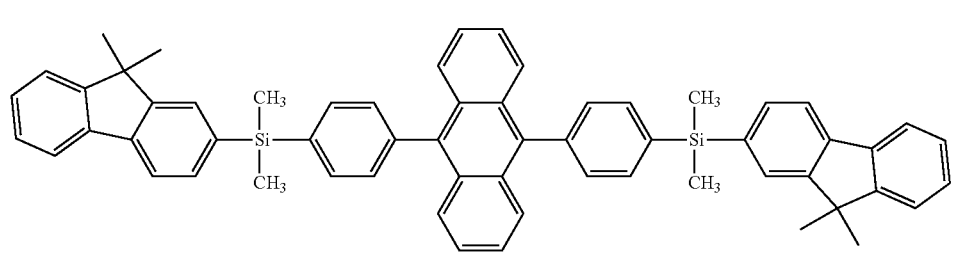
14
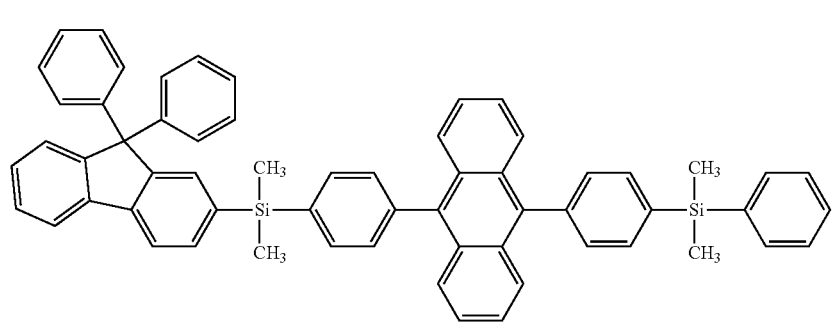
15

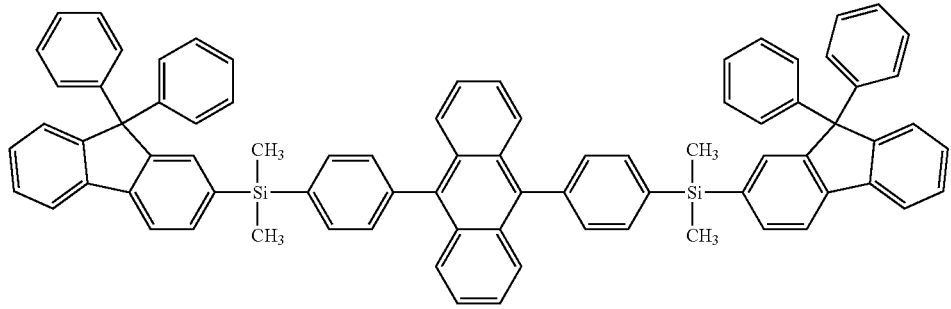
16
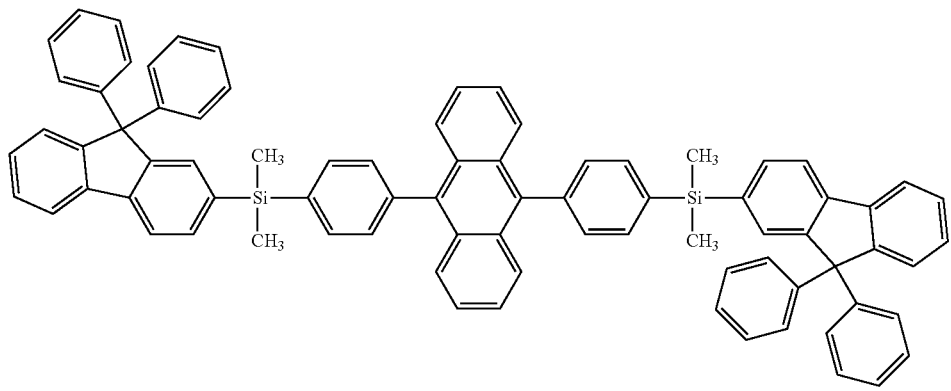
17
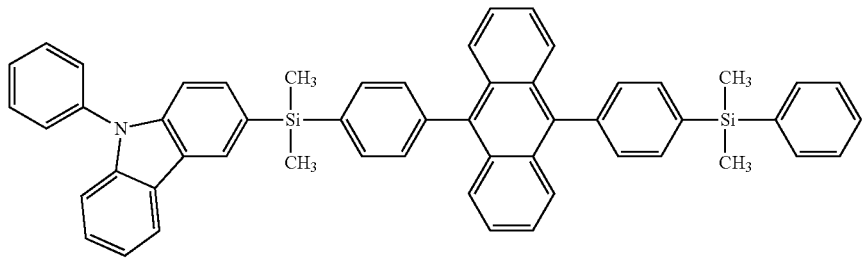
18
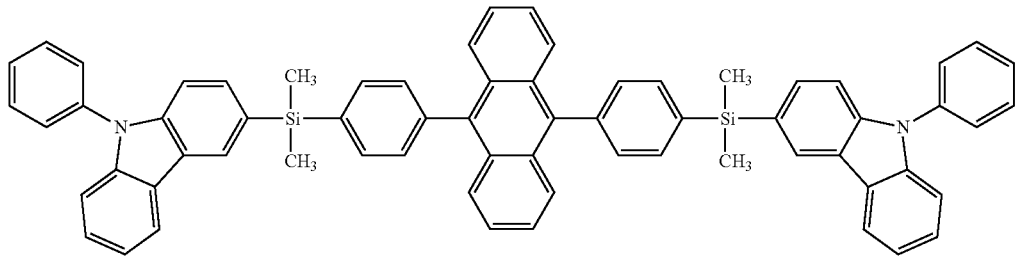
19
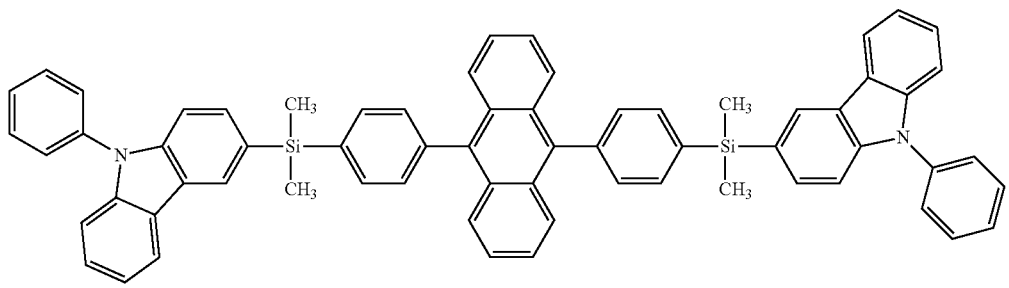
20

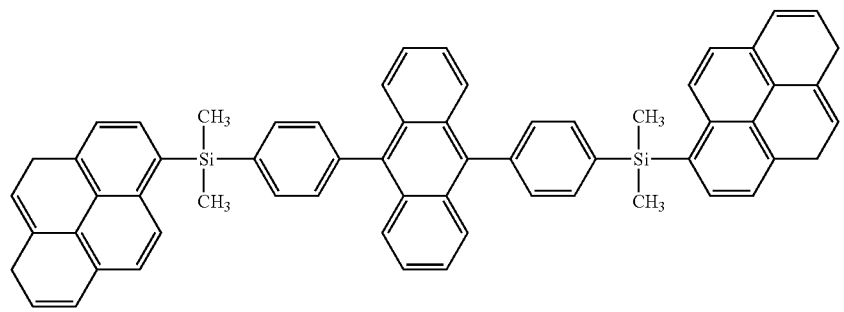

21

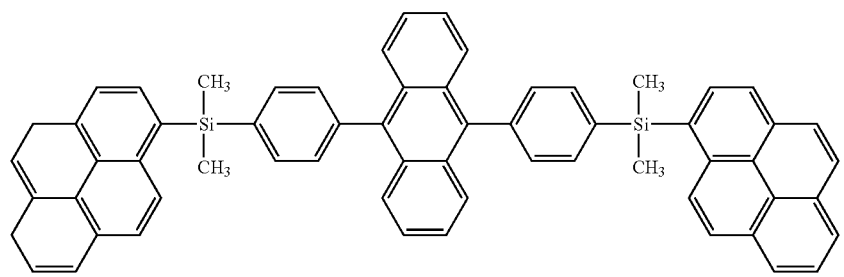

22

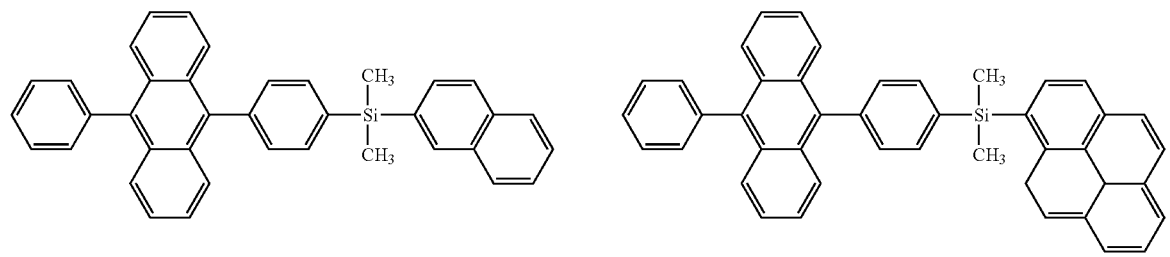

23                              24

11. The organic light-emitting diode as claimed in claim 1, wherein the condensed cyclic compound is a blue fluorescent dopant emitting blue light based on fluorescence mechanism.

12. The organic light-emitting diode as claimed in claim 1, wherein $R_{43}$ and $R_{44}$ in Formula 20 are each independently selected from:
- a $C_1$-$C_{20}$ alkyl group, a $C_1$-$C_{20}$ alkoxy group, a phenyl group, a naphthyl group, an anthracenyl group, a pyrenyl group, or a chrysenyl group; or
- a $C_1$-$C_{20}$ alkyl group, a $C_1$-$C_{20}$ alkoxy group, a phenyl group, a naphthyl group, an anthracenyl group, a pyrenyl group, or a chrysenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, or a chrysenyl group.

13. The organic light-emitting diode as claimed in claim 1, wherein, in Formula 20, i=0, and j=0.

14. The organic light-emitting diode as claimed in claim 1, wherein $Z_{31}$ to $Z_{44}$ in Formulae 7D 7E, and 7F are each independently selected from:
- a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;
- a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;
- a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group;

a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenylene group, a benzothiophenyl group, a thiazolyl group, an isothiazolyl group, a benzothiazolyl group an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, and a $C_2$-$C_{60}$ heteroaryl group; and —Si($Q_{53}$)($Q_{54}$)($Q_{55}$), where $Q_{53}$ to $Q_{55}$ are each independently selected from a hydrogen atom, a $C_1$-$C_{10}$ alkyl group, a $C_6$-$C_{20}$ aryl group, and a $C_2$-$C_{20}$ heteroaryl group.

15. The organic light-emitting diode as claimed in claim 1, wherein $Z_{31}$ to $Z_{44}$ in Formulae 7D, 7E, and 7F are each independently selected from:

a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group;

a phenyl group, a naphthyl group, a fluorenyl group, a spiro-fluorenyl group, a phenalenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a furanyl group, a benzofuranyl group, a thiophenyl group, and a benzothiophenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a carbazolyl group, a pyridinyl group, a pyrimidinyl group, a pyrazinyl group, and a triazinyl group; and —Si($Q_{53}$)($Q_{54}$)($Q_{55}$), where $Q_{53}$ to $Q_{55}$ are each independently selected from a hydrogen atom, a $C_1$-$C_{10}$ alkyl group, a phenyl group, a naphthyl group, an anthracenyl group, and a pyrenyl group.

16. The organic light-emitting diode as claimed in claim 1, wherein $Ar_3$ and $Ar_4$ in Formula 20 are the same.

17. The organic light-emitting diode as claimed in claim 1, wherein the condensed cyclic compound represented by Formula 20 is a compound represented by one of Formula 20A, 20B, or 20C, below:

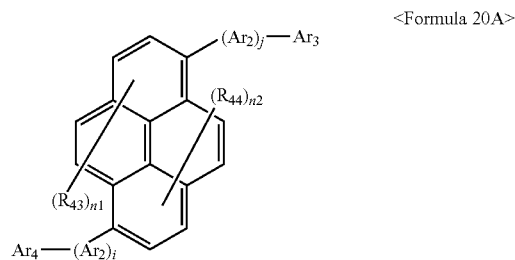

<Formula 20A>

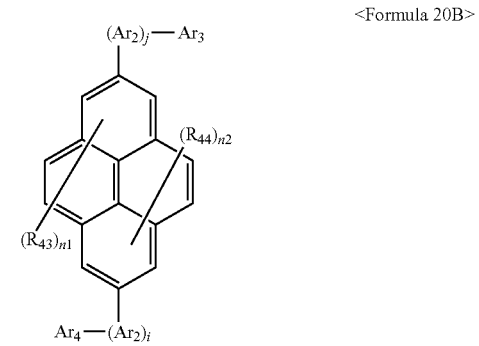

<Formula 20B>

<Formula 20C>

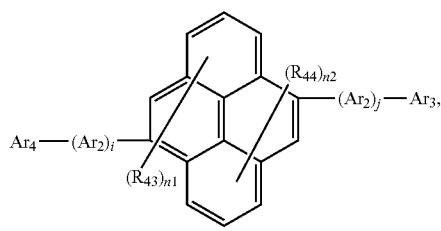

wherein, in Formulae 20A, 20B, and 20C, $R_{43}$, $R_{44}$, $Ar_1$ to $Ar_4$, n1, n2, i and j are defined the same as those of Formula 20.

18. The organic light-emitting diode as claimed in claim 1, wherein the condensed cyclic compound represented by Formula 20 is a compound represented by Formula 20A(1), below:

<Formula 20A(1)>

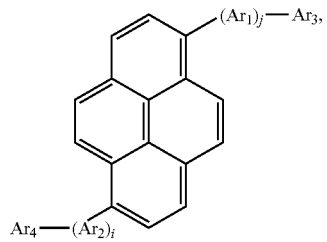

wherein, in Formula 20A(1), $Ar_1$ to $Ar_4$, i and j are defined the same as those of Formula 20.

19. The organic light-emitting diode as claimed in claim 1, wherein the condensed cyclic compound is one of Compounds 51 to 68, below:

51

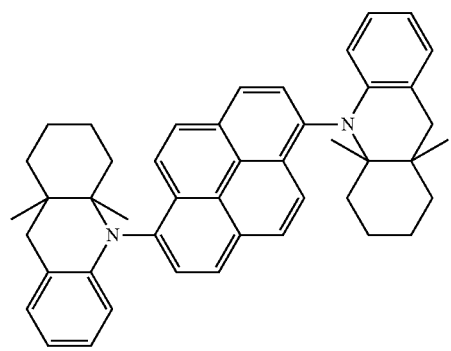

52

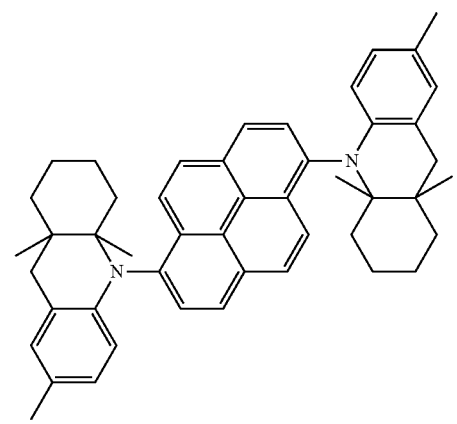

53

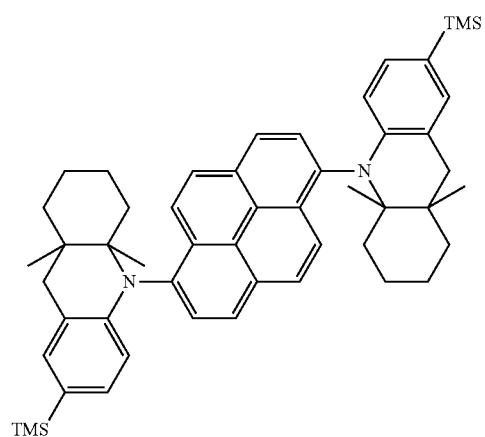

54

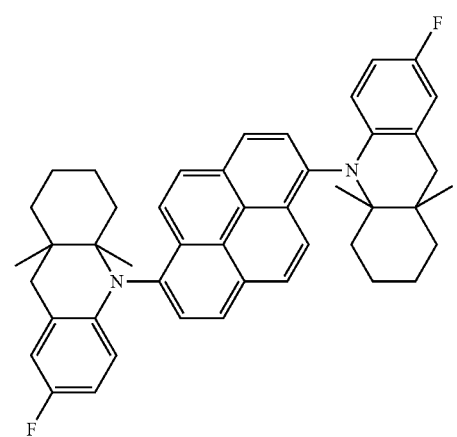

-continued
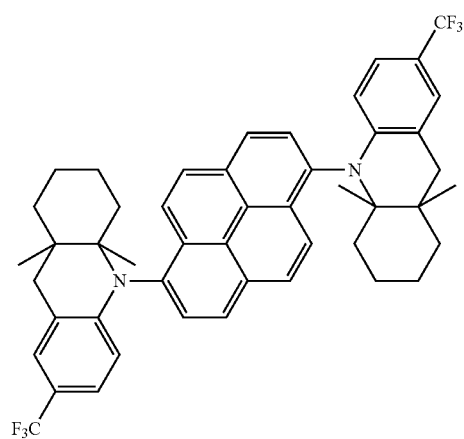
55
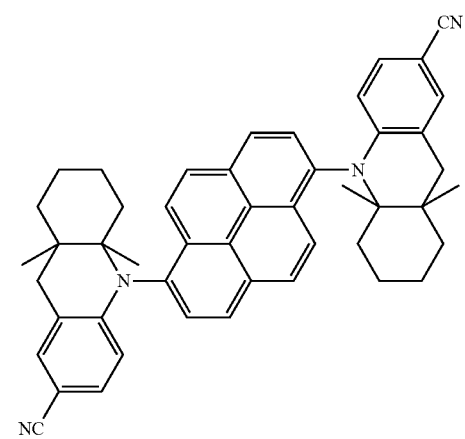
56
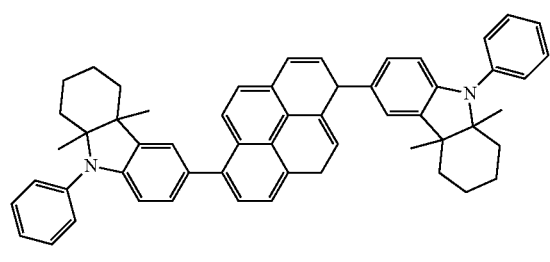
57
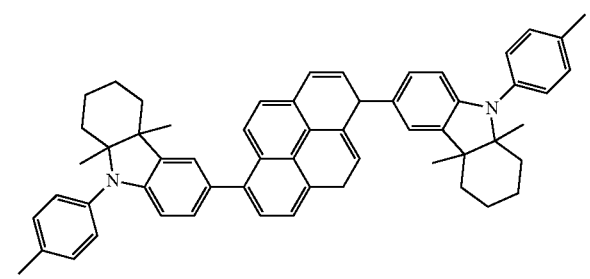
58
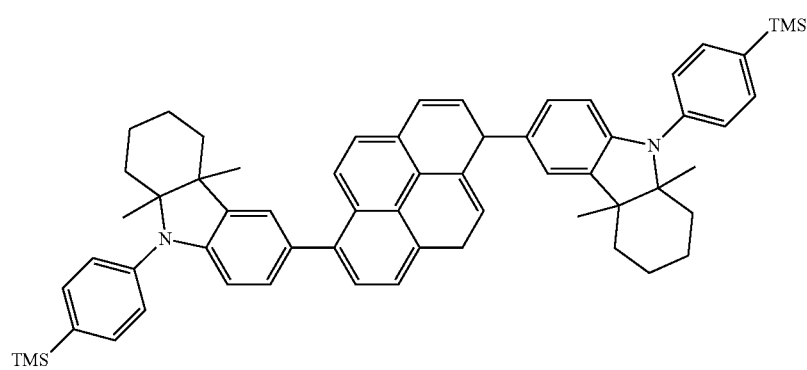
59
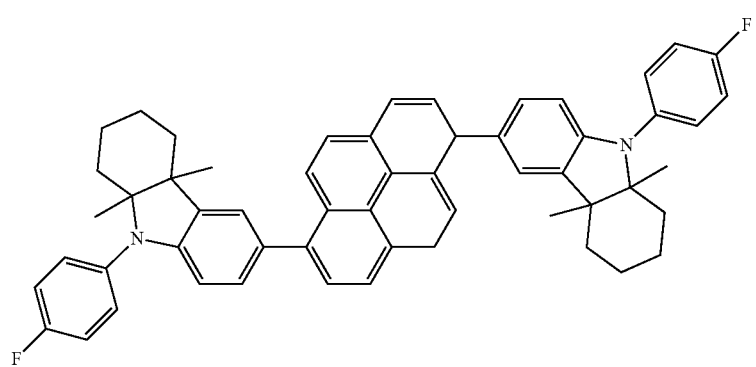
60

-continued
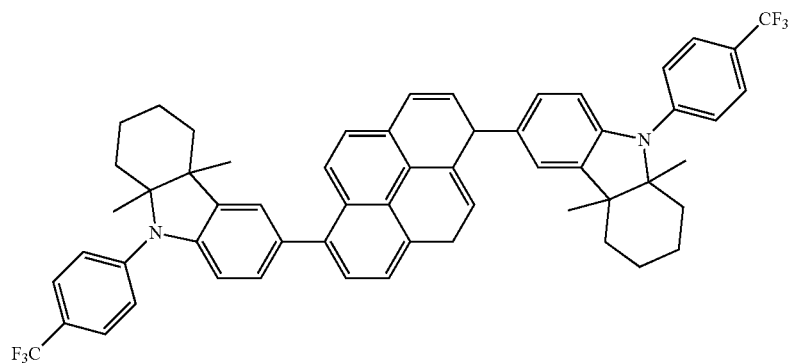
61
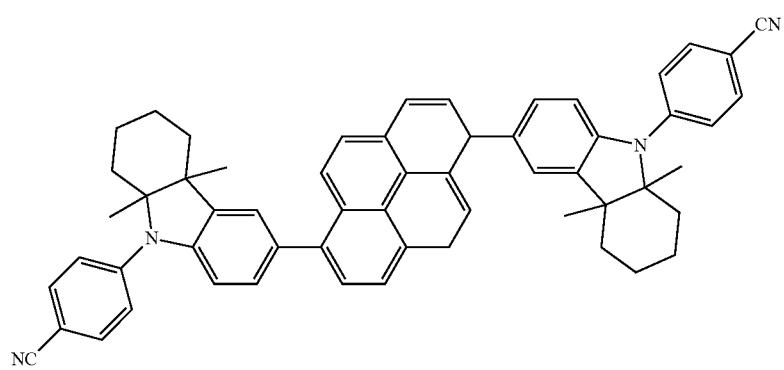
62
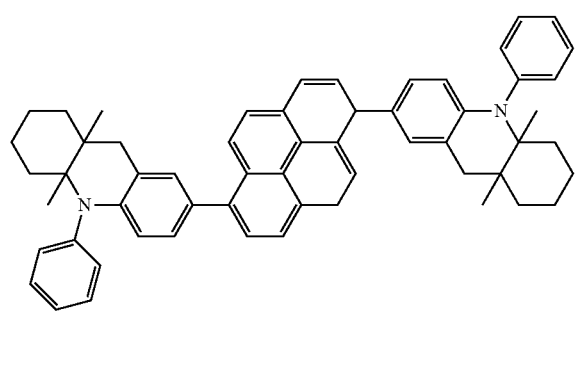
63
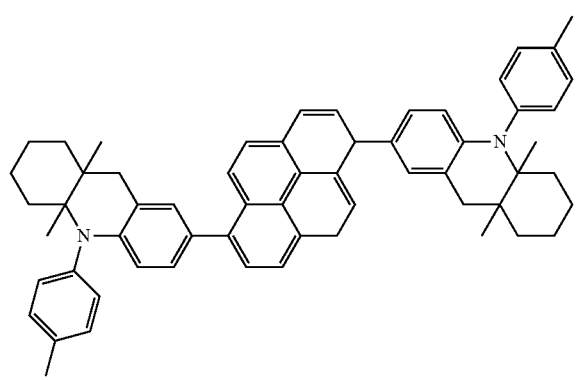
64
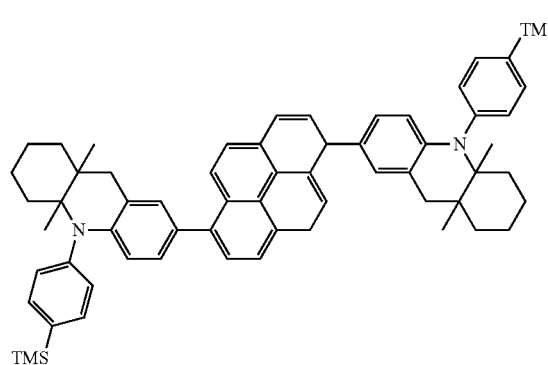
65
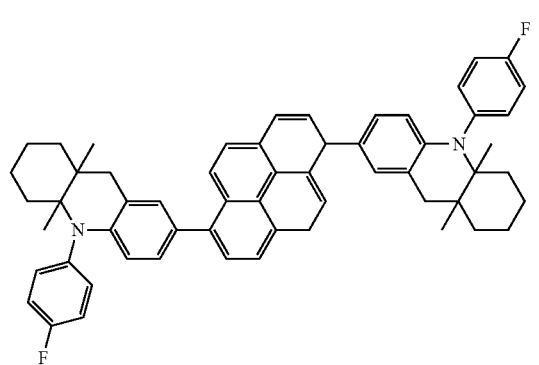
66

67

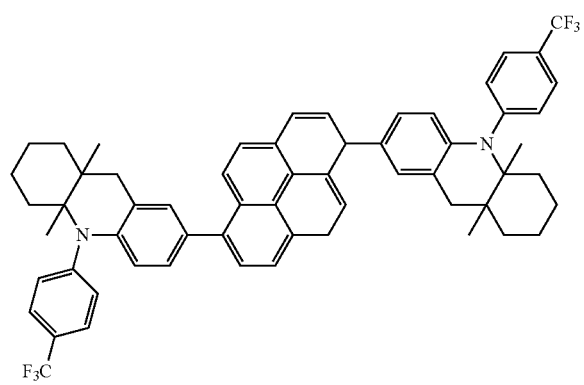

68

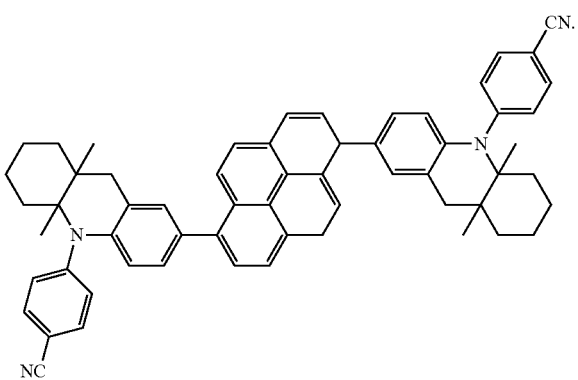

20. An organic light-emitting diode, comprising:
a substrate;
a first electrode on the substrate;
a second electrode disposed opposite to the first electrode; and
an emission layer between the first electrode and the second electrode, the emission layer including an anthracene-based compound represented by one of Compounds 1 to 24, below, and a condensed cyclic compound represented by one of compounds 51 to 68, below:

1

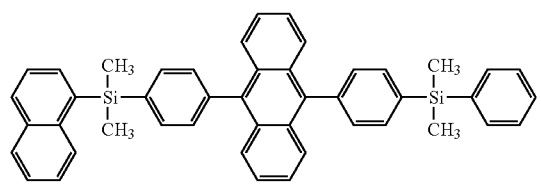

2

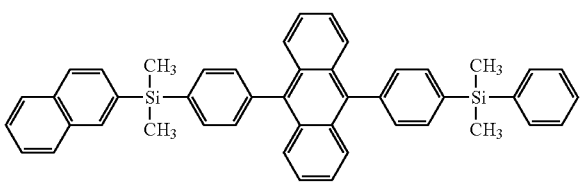

3

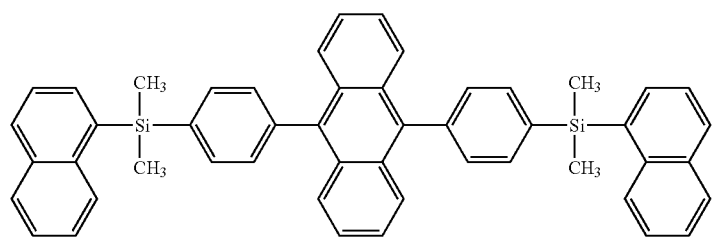

4

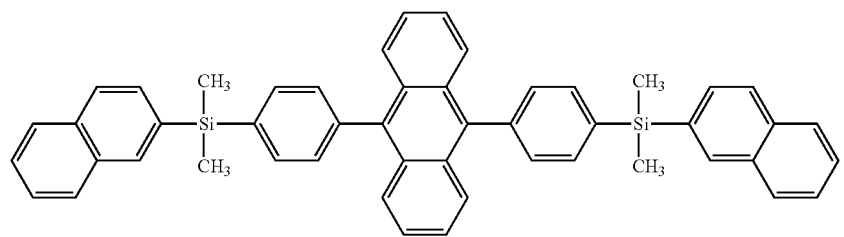

5

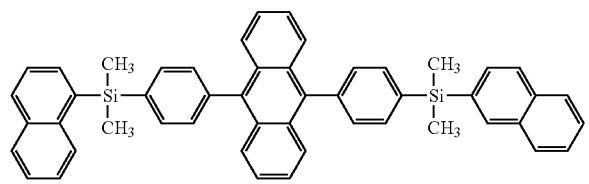

6

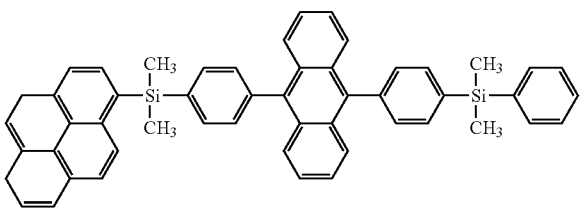

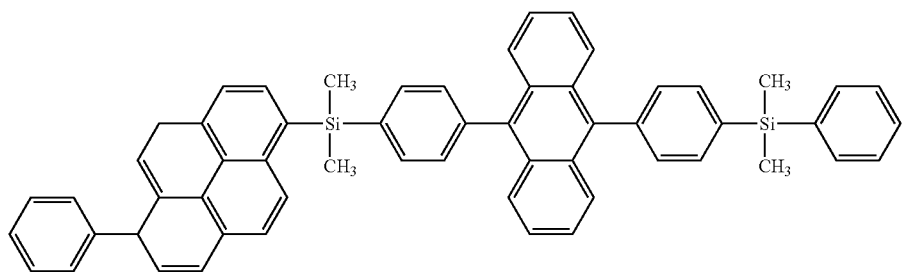
7
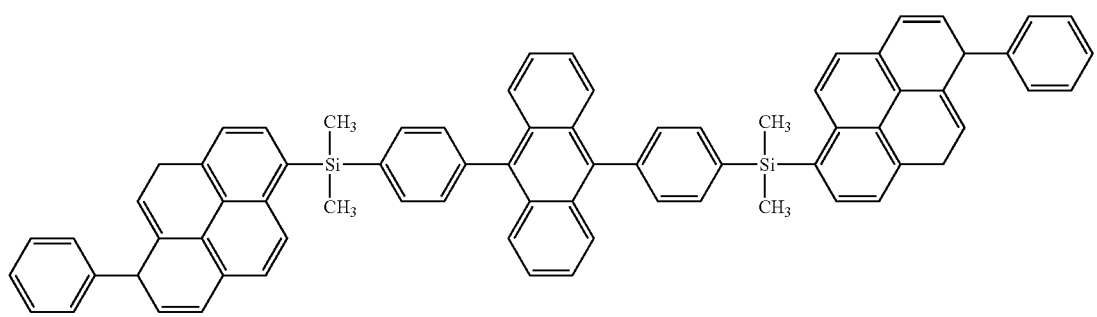
8
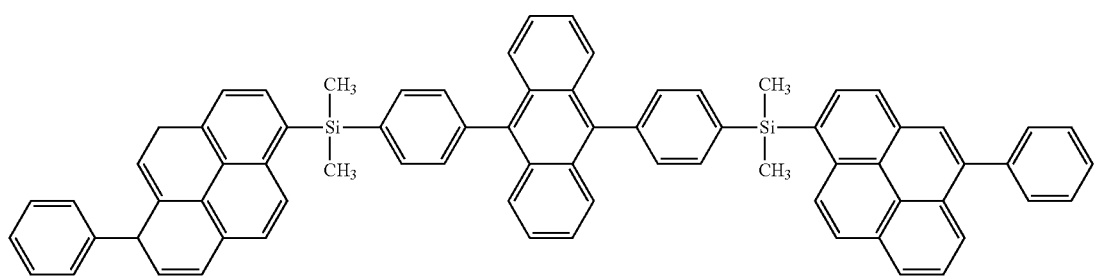
9
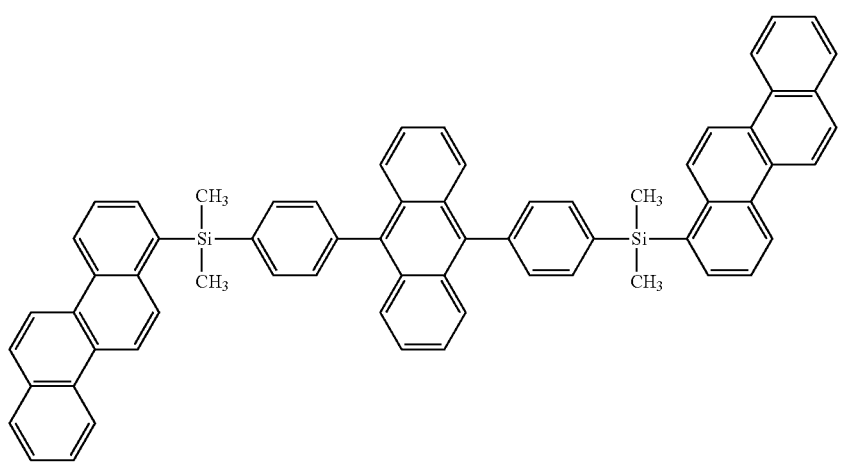
10

-continued
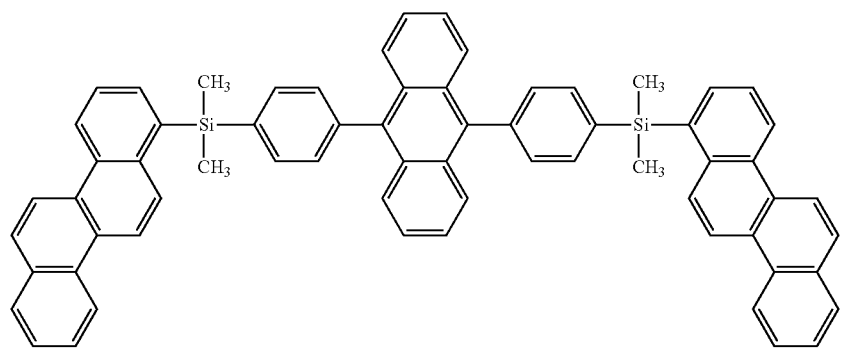
11
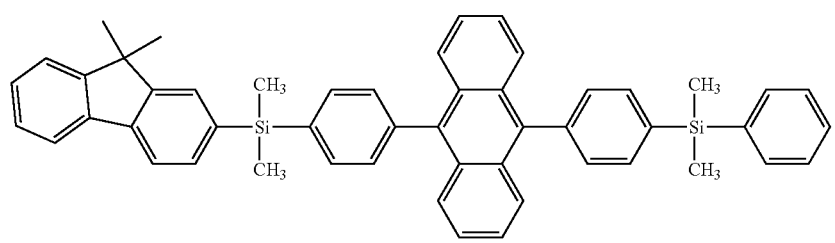
12
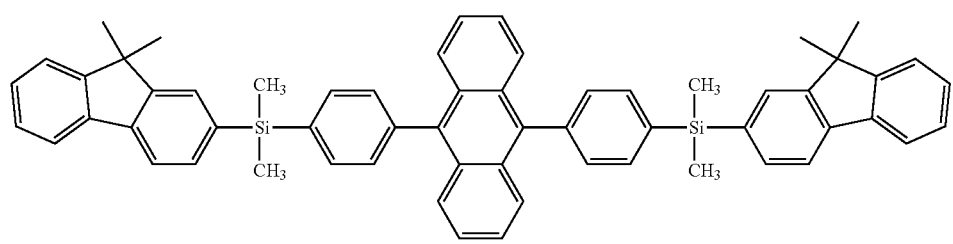
13
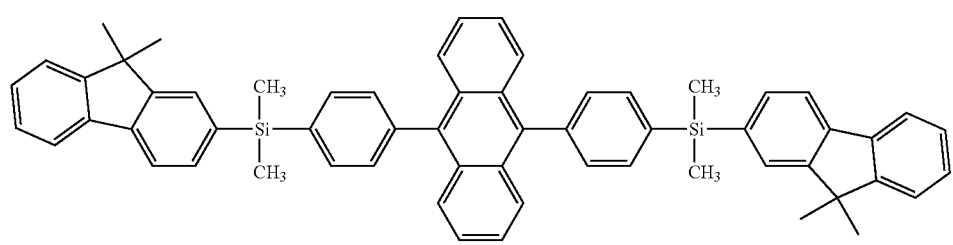
14
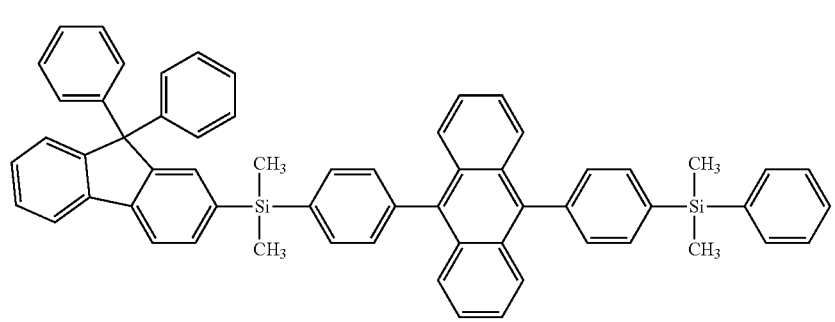
15

-continued
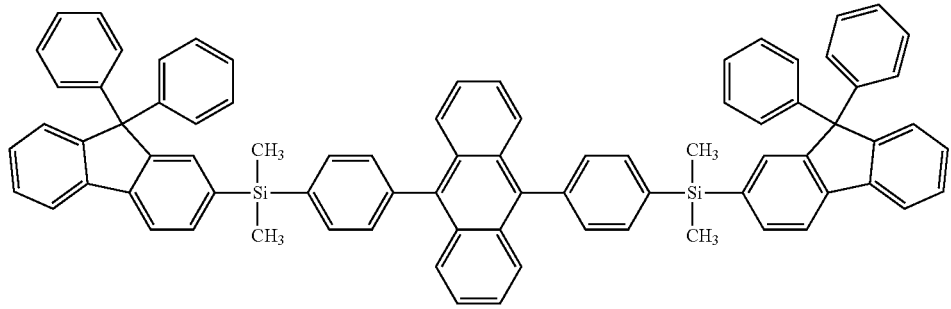
16
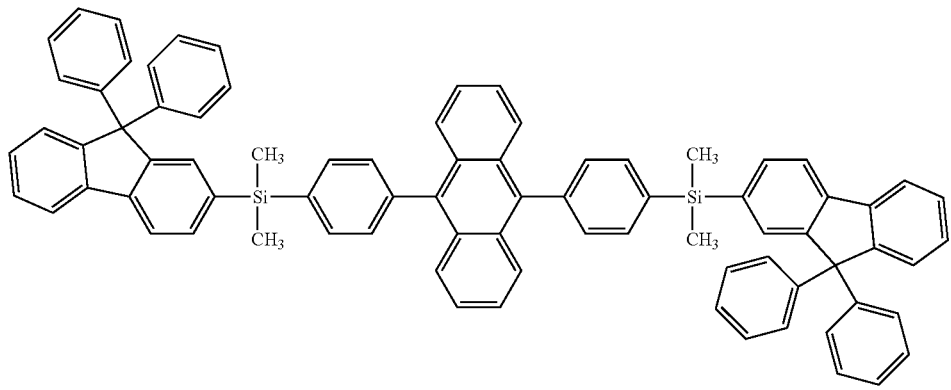
17
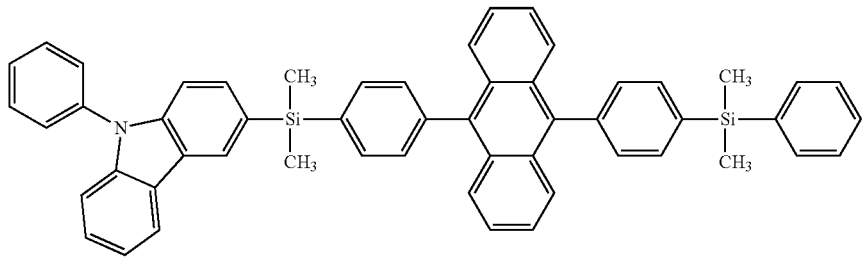
18
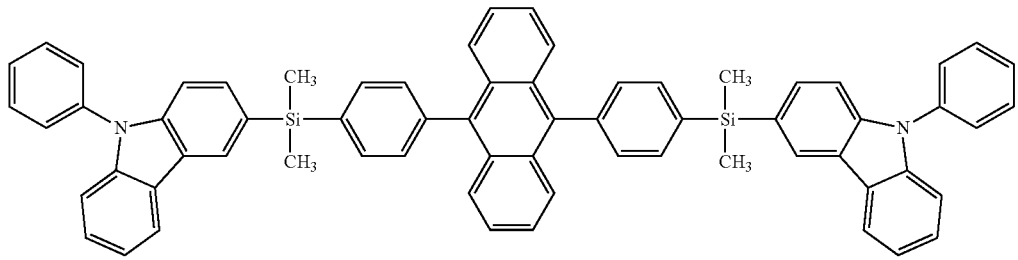
19
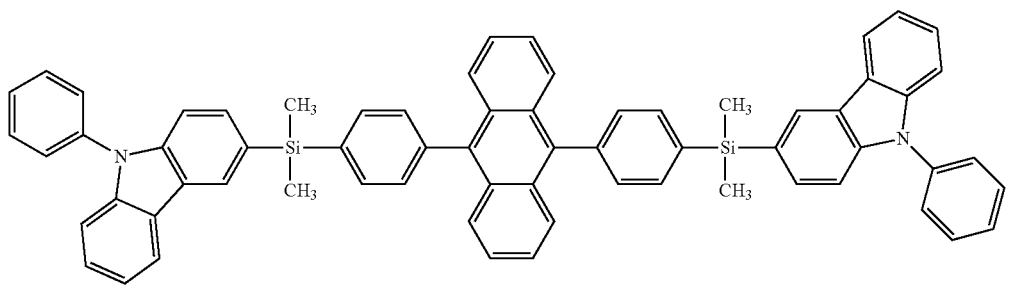
20

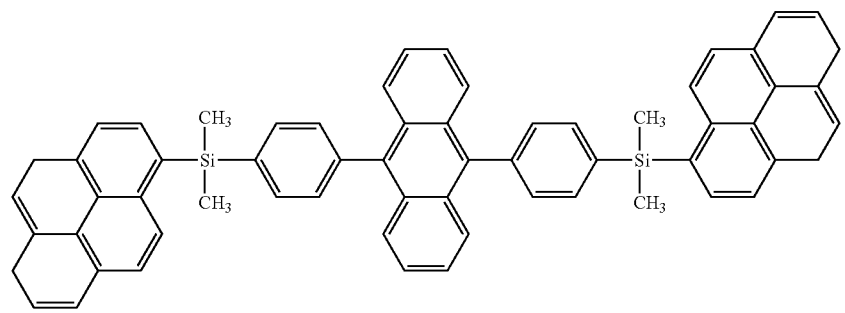
21
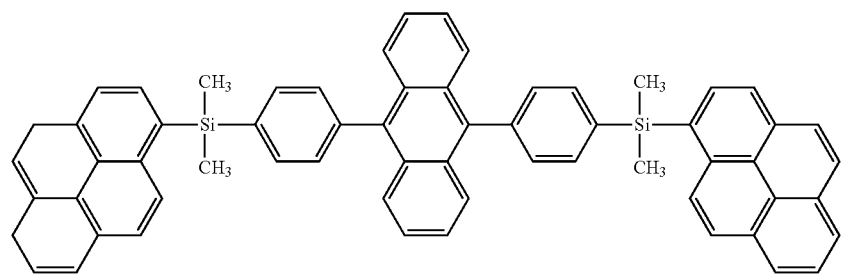
22
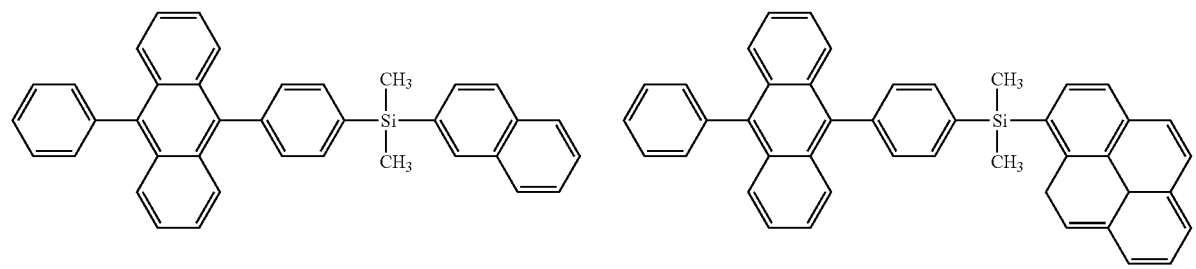
23 24
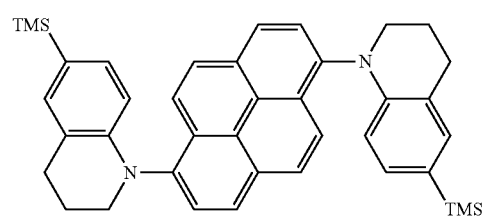
37
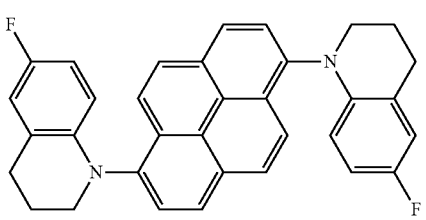
38
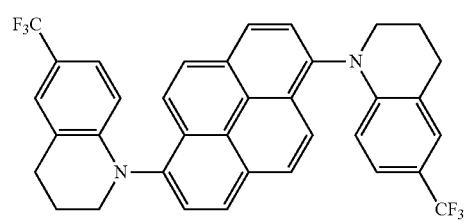
39
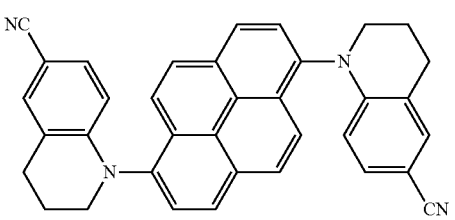
40

-continued
41
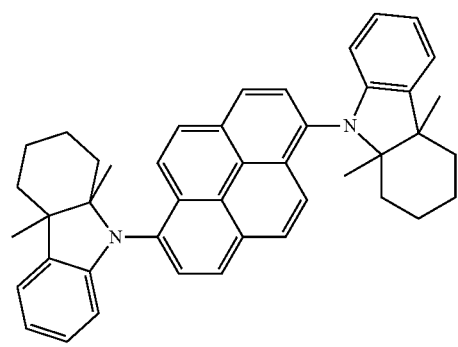
42
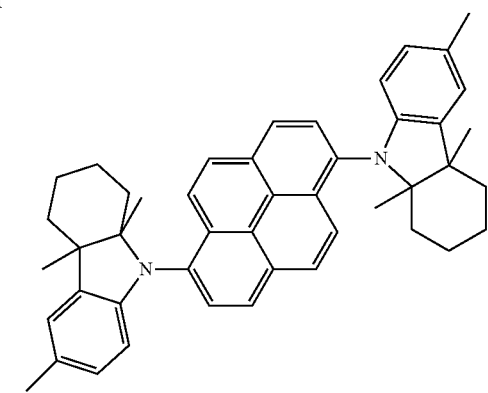
43
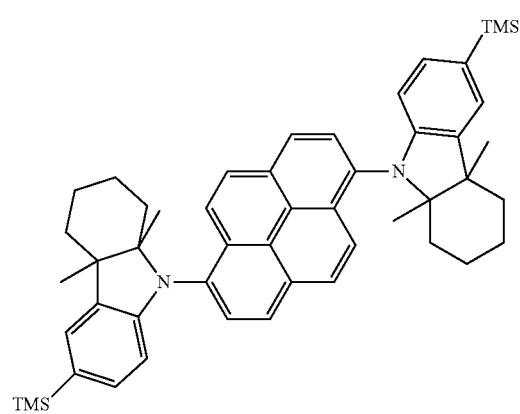
44
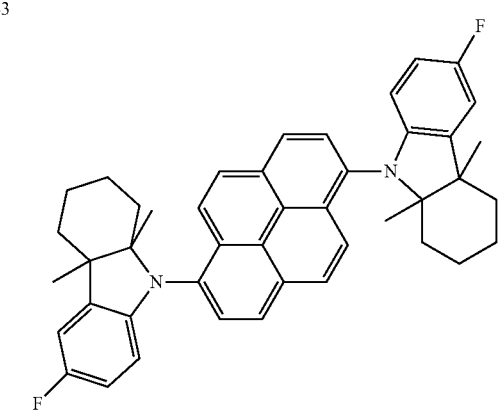
45
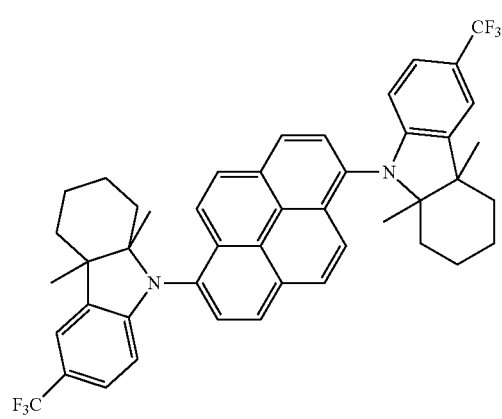
46
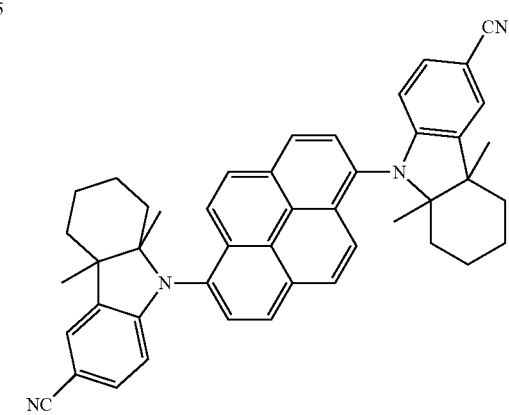
51
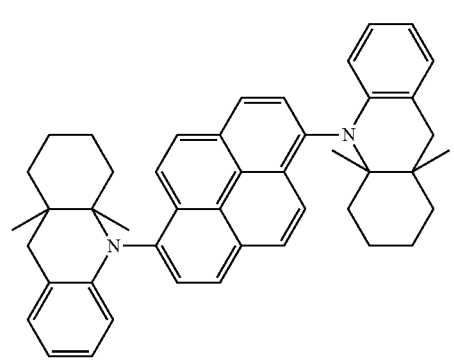
52
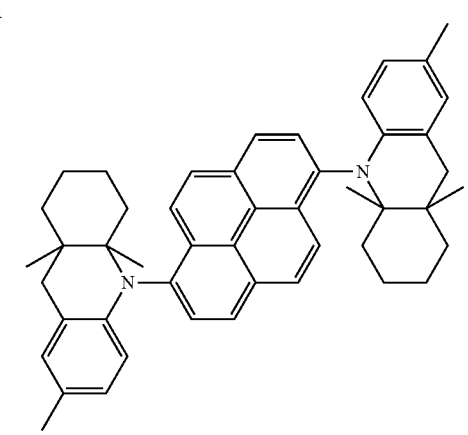

-continued
53
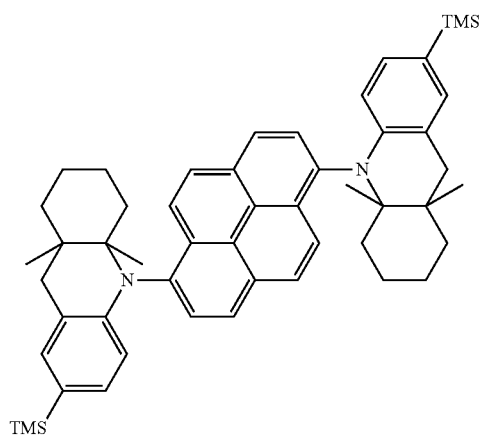
54
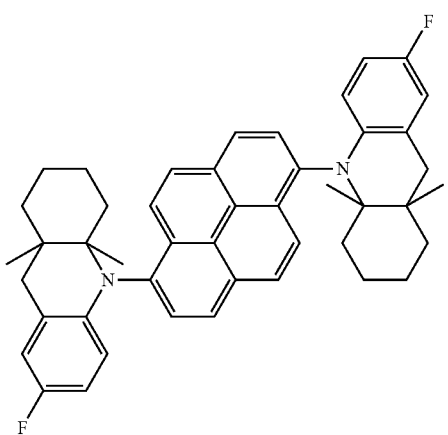
55
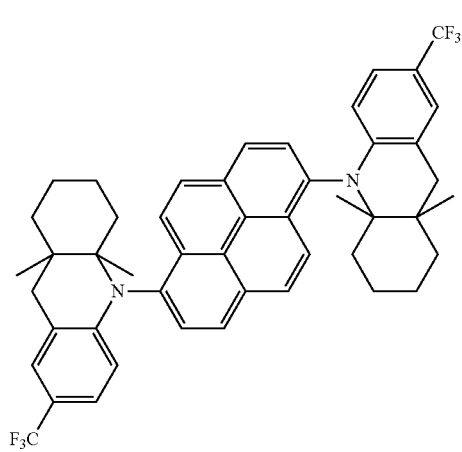
56
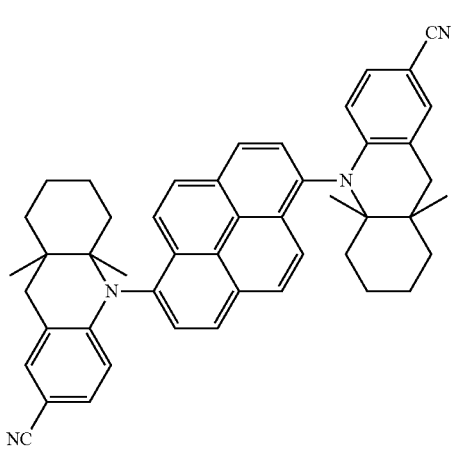
57
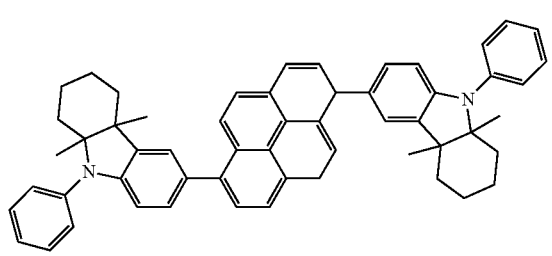
58
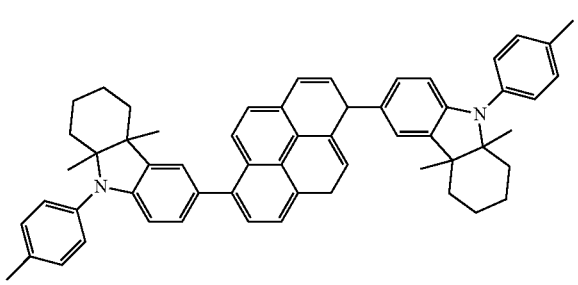
59
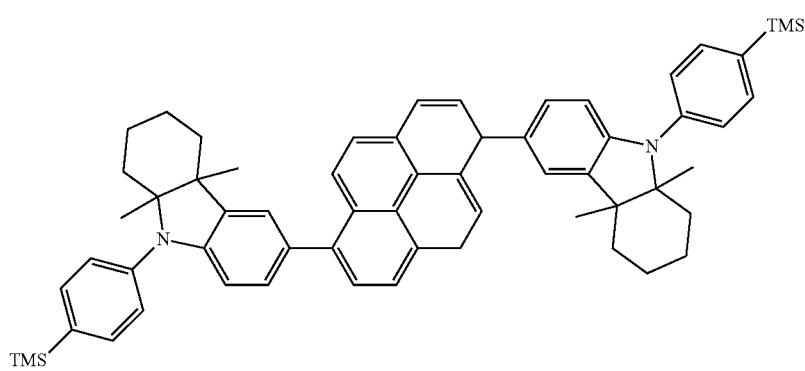

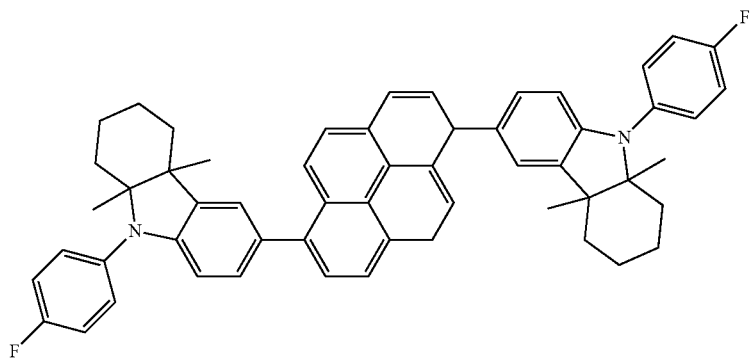
60
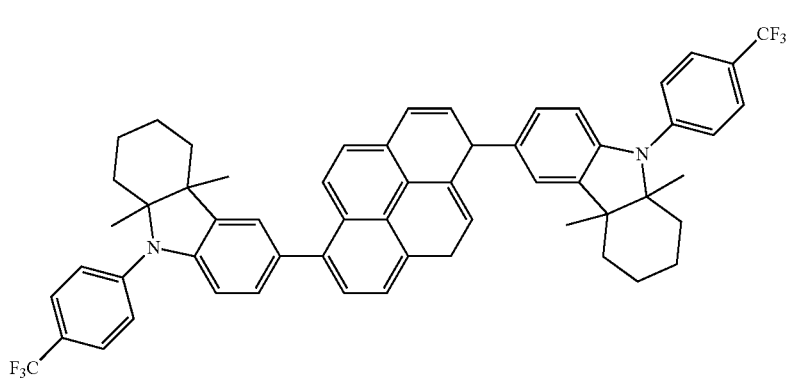
61
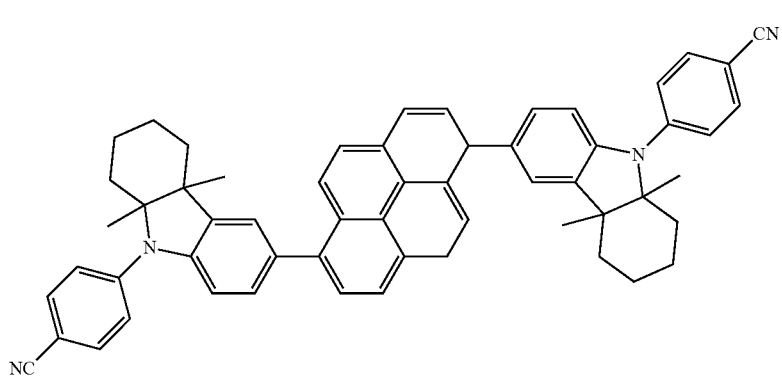
62
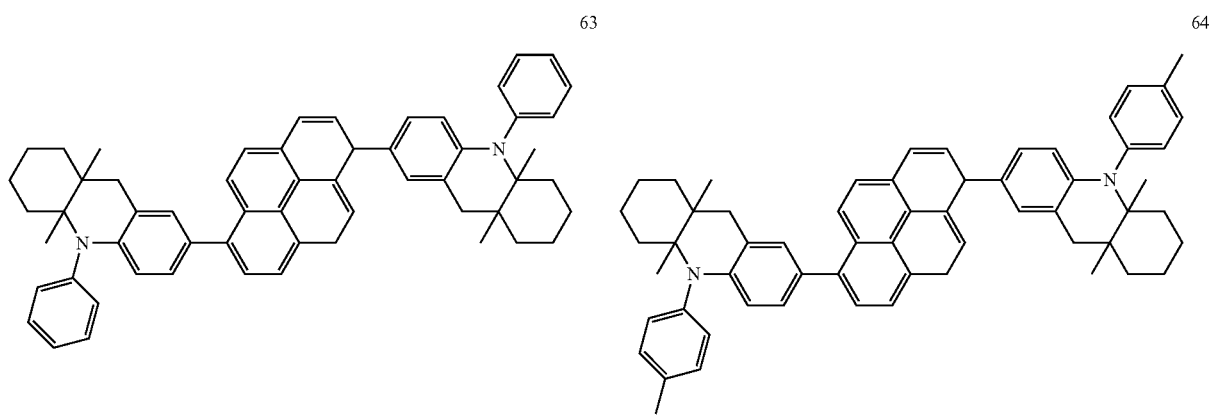
63 64

-continued
65
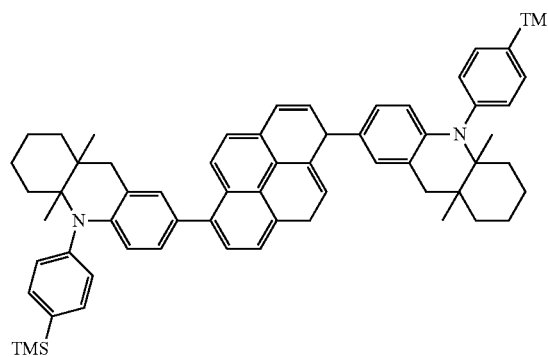
66
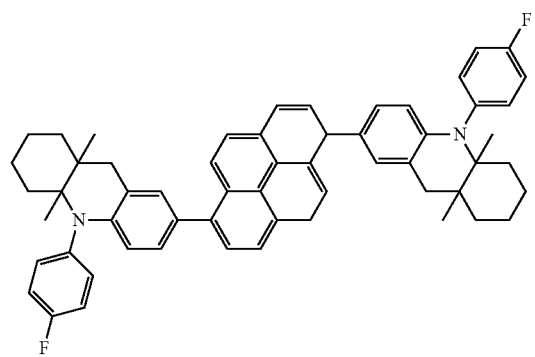
67
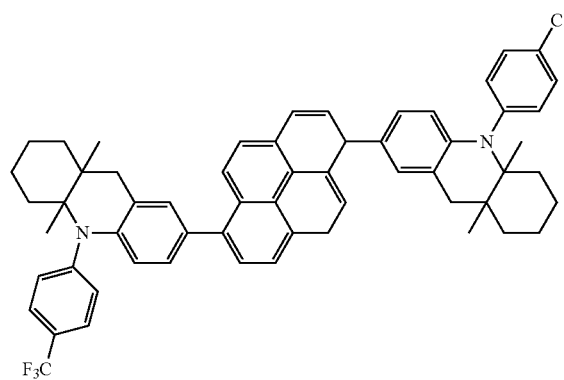
68
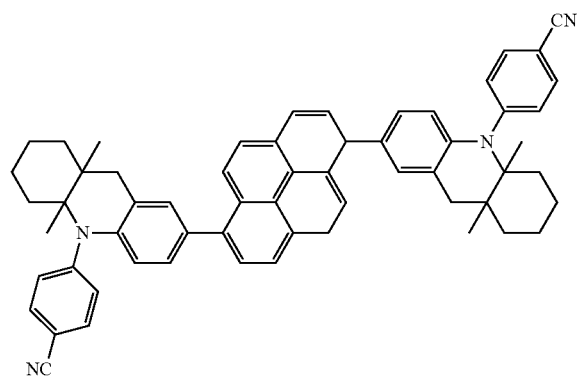
* * * * *